US010647578B2

(12) United States Patent
Sanchez et al.

(10) Patent No.: US 10,647,578 B2
(45) Date of Patent: May 12, 2020

(54) N—H FREE AND SI-RICH PER-HYDRIDOPOLYSILZANE COMPOSITIONS, THEIR SYNTHESIS, AND APPLICATIONS

(71) Applicants: L'Air Liquide, Société Anonyme pour l'Etude et l'Exploitation des Procédés Georges Claude, Paris (FR); American Air Liquide, Inc., Fremont, CA (US)

(72) Inventors: Antonio Sanchez, Tsukuba (JP); Gennadiy Itov, Flemington, NJ (US); Manish Khandelwal, Somerset, NJ (US); Cole Ritter, Easton, PA (US); Peng Zhang, Montvale, NJ (US); Jean-Marc Girard, Versailles (FR); Zhiwen Wan, Plano, TX (US); Glenn Kuchenbeiser, Newark, DE (US); David Orban, Hampton, NJ (US); Sean Kerrigan, Princeton, NJ (US); Reno Pesaresi, Easton, PA (US); Matthew Damien Stephens, Easton, PA (US); Yang Wang, Glen Mills, PA (US); Guillaume Husson, Wilmington, DE (US)

(73) Assignees: L'Air Liquide, Société Anonyme pour l'Etude et l'Exploitation des Procédés Georges Claude, Paris (FR); American Air Liquide, Inc., Fremont, CA (US)

( * ) Notice: Subject to any disclaimer, the term of this patent is extended or adjusted under 35 U.S.C. 154(b) by 182 days.

(21) Appl. No.: 15/661,412

(22) Filed: Jul. 27, 2017

(65) Prior Publication Data
US 2018/0072571 A1 Mar. 15, 2018

Related U.S. Application Data

(60) Provisional application No. 62/432,592, filed on Dec. 11, 2016.

(51) Int. Cl.
| | | |
|---|---|---|
| *C01B 21/087* | (2006.01) |
| *C04B 35/589* | (2006.01) |
| *C04B 35/597* | (2006.01) |
| *C04B 35/14* | (2006.01) |
| *C09D 1/00* | (2006.01) |
| *C01B 21/082* | (2006.01) |
| *B05D 1/02* | (2006.01) |
| *B05D 1/00* | (2006.01) |
| *B05D 1/18* | (2006.01) |
| *C23C 16/24* | (2006.01) |
| *C08G 77/62* | (2006.01) |
| *H01L 21/02* | (2006.01) |
| *C04B 35/571* | (2006.01) |
| *C04B 35/56* | (2006.01) |
| *C09D 183/16* | (2006.01) |

(Continued)

(52) U.S. Cl.
CPC ............ *C01B 21/087* (2013.01); *B05D 1/005* (2013.01); *B05D 1/02* (2013.01); *B05D 1/18* (2013.01); *C01B 21/0823* (2013.01); *C04B 35/14* (2013.01); *C04B 35/5603* (2013.01); *C04B 35/571* (2013.01); *C04B 35/589* (2013.01); *C04B 35/597* (2013.01); *C08G 77/62* (2013.01); *C09D 1/00* (2013.01); *C09D 183/16* (2013.01); *C23C 16/24* (2013.01); *C23C 16/45553* (2013.01); *C23C 18/122* (2013.01); *C23C 18/1275* (2013.01); *C23C 18/1291* (2013.01); *C23C 18/1295* (2013.01); *C04B 2235/483* (2013.01); *H01L 21/0214* (2013.01); *H01L 21/02222* (2013.01)

(58) Field of Classification Search
CPC .............. C01B 21/087; C01B 21/0823; C23C 18/1295; C23C 18/1291; C23C 18/1275; C23C 18/122; C23C 16/45553; C23C 16/24; C08G 77/62; B05D 1/18; B05D 1/005; B05D 1/02; C09D 1/00; C09D 183/16; C04B 2235/483; C04B 35/571; C04B 35/5603; C04B 35/14; C04B 35/597; C04B 35/589; H01L 21/0214; H01L 21/02222
See application file for complete search history.

(56) References Cited

U.S. PATENT DOCUMENTS

| 3,137,599 A | 6/1964 | Alsgaard et al. |
| 4,200,666 A | 4/1980 | Reinberg |

(Continued)

FOREIGN PATENT DOCUMENTS

| DE | 2 231 008 | 1/1974 |
| EP | 0 304 239 | 2/1989 |

(Continued)

OTHER PUBLICATIONS

Blum, Y et al., "Catalytic methods for the synthesis of oligosilanzanes," Organometallics 1986, 5, 2081-2086.
Günthner, M. et al., "Conversion behavior and resulting mechanical properties of polysilazane-based coatings," Journal of the European Ceramic Society, 32 (2012) 1883-1892.
Isoda, T. et al., "Perhydropolysilazane precursors to silicon nitride ceramics," Journal fo Inorganic and Organometallic Polymers, vol. 2, No. 1, 1992, 151-160.

(Continued)

*Primary Examiner* — Anthony J Zimmer
(74) *Attorney, Agent, or Firm* — Allen E. White; Patricia E. McQueeney

(57) ABSTRACT

Solid or liquid N—H free, C-free, and Si-rich perhydropolysilazane compositions comprising units having the following formula $[-N(SiH_3)_x(SiH_2-)_y]$, wherein x=0, 1, or 2 and y=0, 1, or 2 when x+y=2; and x=0, 1 or 2 and y=1, 2, or 3 when x+y=3 are disclosed. Also disclosed are synthesis methods and applications for the same.

3 Claims, 21 Drawing Sheets

(51) Int. Cl.
  *C23C 18/12* (2006.01)
  *C23C 16/455* (2006.01)

(56) References Cited

U.S. PATENT DOCUMENTS

| | | | |
|---|---|---|---|
| 4,395,460 | A | 7/1983 | Gaul |
| 4,412,874 | A | 11/1983 | Huskins et al. |
| 4,482,669 | A | 11/1984 | Seyferth et al. |
| 5,145,812 | A | 9/1992 | Arai et al. |
| 5,905,130 | A | 5/1999 | Nakahara et al. |
| 6,329,487 | B1 | 12/2001 | Abel et al. |
| 6,479,405 | B2 | 11/2002 | Lee et al. |
| 6,706,646 | B1 | 3/2004 | Lee et al. |
| 6,767,641 | B1 | 7/2004 | Shimizu et al. |
| 7,015,114 | B2 | 3/2006 | Seo |
| 7,053,005 | B2 | 5/2006 | Lee et al. |
| 7,270,886 | B2 | 9/2007 | Lee et al. |
| 7,429,637 | B2 | 9/2008 | Hong et al. |
| 7,994,019 | B1 | 8/2011 | Kweskin et al. |
| 8,232,176 | B2 | 7/2012 | Lubomirsky et al. |
| 8,969,172 | B2 | 3/2015 | Nakamoto et al. |
| 9,082,612 | B2 | 7/2015 | Yun et al. |
| 9,096,726 | B2 | 8/2015 | Lim et al. |
| 9,165,818 | B2 | 10/2015 | Takano et al. |
| 2013/0017662 | A1 | 1/2013 | Park et al. |
| 2014/0341794 | A1 | 11/2014 | Hoppe et al. |
| 2015/0004421 | A1 | 1/2015 | Fujiwara et al. |
| 2015/0298980 | A1 | 10/2015 | Hayashi et al. |
| 2015/0307354 | A1* | 10/2015 | Hoppe .................. B01D 3/143 423/324 |
| 2016/0176718 | A1 | 6/2016 | Jang et al. |
| 2016/0379817 | A1 | 12/2016 | Okamura et al. |
| 2017/0044401 | A1 | 2/2017 | Yamakawa et al. |

FOREIGN PATENT DOCUMENTS

| | | |
|---|---|---|
| KR | 2012 0066389 | 3/2013 |
| KR | 2014 0087903 | 7/2014 |
| KR | 2014 0087908 | 1/2016 |
| WO | WO 2009 087609 | 7/2009 |
| WO | WO 2015 047914 | 4/2015 |
| WO | WO 2016 065239 | 4/2016 |

OTHER PUBLICATIONS

Longjuan, T. et al., "Dependence of wet etch rate on deposition, annealing conditions and etchants for PECVD silicon nitride film," Journal of Semiconductors, vol. 30, No. 9, Sep. 2009, 096005-1 to 096005-4.
Scantlin, W.M. et al., "The borane-catalyzed condensation of trisilazane and n-methyldisilazane," Inorganic Chemistry, vol. 11, No. 12, 1972, 3082-3084.
Scantlin, W.M. et al., "Pentaborane(9)-catalysed condensation of silylamines," Chemical Communications, 1971, 1246.
University of Louisville Micro/Nano Technology Center, "Spin coating theory," Oct. 2013, 4 pages.
Wells, R.L. et al., "Studies of silicon-nitrogen compounds. The base-catalyzed elimination of silane from trisilylamine," Journal of the American Chemical Society, 88:1, Jan. 5, 1966, 37-42.
International Search Report and Written Opinion for corresponding PCT/US2017/065581, dated Mar. 6, 2018.
Aylett, B.J. et al., "N-silyl derivatives of cyclic secondary amines," J. Chem. Soc. (A), 1967, 1918-1921.
Aylett, B.J. et al., "The preparation and properties of dimethylamino- and diethylamino-silane," J. Chem. Soc. (A), 1967, 652-655.
Aylett, B.J. et al., "The preparation and some properties of disilylamine," Inorg. Chem., 5(1), 1966, 167.
Aylett, B.J. et al., "Silicon-nitrogen compounds. Part VI. The preparation and properties of disilazane," J. Chem. Soc. (A), 1969, 639-642.
Burg, A.B. et al., "Silyl-amino boron compounds," J. Am. Chem. Soc., 1950, 72(7), 3103-3107.
Furuya, T. et al., "Catalysis for fluorination and trifluoromethylation," Nature, May 26, 2011, 473(7348), 470-477.
Glidewell, C., "Reactions of silylphosphine with amines and imines," Inorg. Nucl. Chem. Letters, vol. 10, 1974, 39-41.
MacDiarmid, A.G., "Silanes and their derivatives,"Advan. Inorg. Chem. Radiochem., 1961, 3, 207-256.
Neumann, C.N. et al., "C—H fluorination: U can fluorinate unactivated bonds," Nature Chemistry, 2016, 8, 822-823.
Norman, A.D. et al., "Reaction of silylphosphine with ammonia," Inorganic Chemistry, vol. 18, No. 6, 1979, 1594-1597.
Thompson, M.L., "Silyl group exchange between chlorosilane and n-methyldisilazane," Inorganic Chemistry, vol. 18, No. 10, 1979, 2939-2940.

* cited by examiner

N—H FREE AND SI-RICH PER-HYDRIDOPOLYSILZANE COMPOSITIONS, THEIR SYNTHESIS, AND APPLICATIONS

CROSS REFERENCE TO RELATED APPLICATIONS

The present application claims the benefit of U.S. Provisional Application No. 62/432,592 filed Dec. 11, 2016, herein incorporated by reference in its entirety for all purposes.

TECHNICAL FIELD

Solid or liquid N—H free, C-free, and Si-rich perhydropolysilazane compositions comprising units having the following formula [—N(SiH$_3$)$_x$(SiH$_2$-)$_y$], wherein x=0, 1, or 2 and y=0, 1, or 2 when x+y=2; and x=0, 1 or 2 and y=1, 2, or 3 when x+y=3 are disclosed. Also disclosed are synthesis methods and applications for the same.

BACKGROUND

Perhydropolysilazane s (PHPS) are molecules, oligomers or polymers containing only Si, H and N characterized by repeating —SiH$_x$—NH— units (x=0 to 2) and the fact that the silicon atom is only bonded to a N or H atoms. Several methods have been used and described to make PHPS. See, e.g., U.S. Pat. No. 4,395,460 to Gaul; U.S. Pat. No. 4,482,669 to Seyferth et al.; U.S. Pat. No. 5,905,130 to Nakahara et al.; U.S. Pat. No. 6,329,487 to Abel et al.; and Isoda et al., J. of Inorganic and Organometallic Polymers (1992) Vol. 2, Issue 1, pp. 151-160.

U.S. Pat. No. 4,200,666 to Reinberg discloses a method of preparing silicon nitride films by glow discharge from the decomposition of liquid trisilylamine, which is a volatile monomer.

Scantlin et al. disclose pentaborane(9)-catalyzed condensation of silylamines. Chemical Communications, 1971, p. 1246.

Blum et al. disclose a catalytic method for synthesis of oligosilazanes. Organometallics 1986, 5, 2081-2086. More particularly, HSiMe$_2$NHMe$_2$SiH is reacted with NH$_3$ using Ru$_3$(CO)$_{12}$ as a catalyst.

US Pat. App. Pub. No. 2013/0017662 to Park et al. discloses a filler for filling a gap including a compound having the formula Si$_a$N$_b$O$_c$H$_d$, wherein 1.96<a<2.68, 1.78<b<3.21, 0≤c<0.19, and 4<d<10. Abstract. The filler is synthesized by reacting a hydrogenated polysilazane or hydrogenated polysiloxane with trisilylamine in pyridine. Id. at paras 0064-0065. The application targets a compound having a N:Si mole ratio between about 0.7 to about 0.95 to reduce film shrinkage. Id. at para 0051.

Typical synthesis of PHPS involves ammonolysis of silanes to form chains containing the H$_3$Si—N(-)—SiH$_3$ units. The ammonolysis method involves the reaction of NH$_3$ with a halosilane, preferably a dihalosilane, as follows:

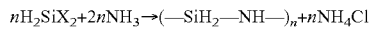

The linear (—SiH$_2$—NH—)$_n$ perhydridopolysilazane formed can be branched by addition of a tri-functional silane like trichlorosilane. See, e.g., US2014/341794 to Hoppe et al. The linear polysilazane can also undergo cross-linking and cyclization by Si—H/N—H elimination to create new Si—N bonds and partially reduce the H content of the perhydridopolysilazane. See, e.g., U.S. Pat. No. 6,329,487 to Abel et al.

US Pat. App. Pub. No. 2014/341794 to Hoppe et al. discloses a process for preparing trisilylamine (TSA) and polysilazanes in the liquid phase, in which ammonia dissolved in an inert solvent is initially introduced in a substoichiometric amount relative to monochlorosilane which is likewise present in an inert solvent.

KR Pat. App. Pub. No. 2014/0087903 to Song et al. discloses a method for manufacturing chlorine free polysilazane polymers by reacting a nucleophilic compound, such as a tertiary amine or ammonia, with an aminosilane having the formula NR$_3$, wherein each R is independently H, SiR'$_3$, alkyl, aryl, alkoxy, aryloxy, alkyl or aryl oxycarbonyl, acyl, or acyloxy groups and each R' is independently H, alkyl, aryl, alkoxy, or aryloxy groups. Exemplary aminosilanes include (H$_3$Si)NH$_2$, (H$_3$Si)$_2$NH, (H$_3$Si)NMe$_2$, (H$_3$Si)$_2$NMe, (H$_3$Si)$_3$N, (H$_2$MeSi)NH$_2$, (H$_2$MeSi)(H$_3$Si)NH, (H$_2$MeSi)(H$_3$Si)$_2$N, (H$_2$MeSi)$_2$NH, (H$_2$MeSi)$_3$N, (H$_2$PhSi)$_3$N, (H$_2$PhSi)NH$_2$, (H$_2$PhSi)$_2$NH, (H$_2$MeO)Si)$_3$N, (H$_2$(MeO)Si)$_2$NH, (H(MeO)$_2$Si)$_2$NH, (H(MeO)$_2$Si)$_3$N, (H$_2$(MeO)Si)NH$_2$, (H(MeO)$_2$Si)NH$_2$, (H$_3$Si)$_2$NMe, (H$_3$Si)$_2$NPh, derivatives thereof, or combinations thereof.

U.S. Pat. App. Pub. No. 2015/004421 to Fujiwara et al. discloses an inorganic polysilazane resin having a Si:N ratio of 1.30:1 or more synthesized by (a) ammonolysis of dichlorosilane in an organic solvent to form an oligomer containing both chlorosilane and a NH group, (b) heating the system to polymerize the oligomer obtained in step (a), and (c) terminal treatment of Si—Cl remaining in the resin with ammonia, if necessary.

PHPS made from ammonolysis of (di)halosilanes contain NH and form solids (NH$_4$Cl), which tends to contaminate the PHPS with residual traces of Cl. See, e.g., Example 1 of US2015/004421 to Fujiwara et al. In addition, the Si:N ratio is typically below 1.4:1. Id. at para 0028. When these PHPS formulation are used for coatings, the film is usually converted to silicon oxide by exposure at elevated temperature (>400° C., and usually 550-700° C.) to an oxidizing atmosphere (O$_2$, O$_3$, H$_2$O, H$_2$O$_2$). Upon such conversion, the film tends to shrink, which causes issues for usage in silicon oxide gap fill applications. See, e.g., the EMD Performance Materials website demonstrating a 16-18% shrinkage in the PHPS film at curing temperatures ranging from 400° C. to 1000° C. (http://www.emd-performance-materials.com/en/electronic materials/glossary/phps/phps.html). It has been shown that having a higher Si:N ratio in the PHPS reduces the tendency to such shrinkage. See, e.g., US2015/004421 at Tables 1 and 2.

The PHPS made from ammonolysis may also be converted to silicon nitride by heating them to an elevated temperature, typically >700° C., in an inert or nitriding atmosphere. The resulting silicon nitride becomes an oxidation resistant solid, film, fiber, or powdery material. However, thermal curing of PHPS to enable cross linking into a silicon nitride ceramic involves a significant mass loss associated with the elimination of silicon containing groups, such as N(SiH$_3$)$_3$. Gunthner et al., Journal of the European Ceramic Society, 32 (2012) 1883-1892. As a result, film shrinkage is observed when converting N—H containing PHPS into a solid material. The thermogravimetric data of FIG. 2 show that mass loss starts at a temperature below 200° C., and mass loss which is the cause of the material shrinkage. Id.

Thus a need remains for PHPS having a high Si:N ratio for formation of SiO2 coatings exhibiting minimal shrinkage upon oxidation. A need also remains for PHPS that may be converted to solid silicon nitride at a temperature ranging between room temperature (RT) and 600° C., and preferably between RT and 200° C.

SUMMARY

Methods of synthesizing N—H free, C-free, and Si-rich perhydropolysilazane compositions are disclosed. The method comprises mixing the trisilylamine and a catalyst to produce the N—H free and Si-rich perhydropolysilazane composition.

Alternatively, the method consists essentially of mixing the trisilylamine and a catalyst to produce the N—H free and Si-rich perhydropolysilazane composition. Either of these methods may include one or more of the following embodiments:
  mixing trisilylamine and the catalyst in a solvent;
  the solvent being pentane;
  the solvent being toluene;
  mixing trisilylamine and the catalyst neat;
  the catalyst being $B(C_6F_5)_3$;
  the catalyst being $B(C_6FH_4)_3$;
  the catalyst being $BPh_3$;
  the catalyst being $PdCl_2$;
  the catalyst being $Co_2(CO)$;
  the catalyst being $Ru_3(CO)_{12}$;
  the catalyst being Zeolite Y (H) Si:Al;
  the catalyst being approximately 0.1% w/w to approximately 10% w/w M on C (M/C), with M being Pt, Ru, Pd, Rh, or Ni;
  mixing trisilylamine and the catalyst at room temperature and atmospheric pressure;
  mixing 1 ppm mole % to 50 mole % of the catalyst;
  mixing 5 ppm mole % to 5 mole % of the catalyst;
  mixing 10 ppm mole % to 0.1 mole % of the catalyst;
  not using a $NH_3$ reactant;
  the N—H free and Si-rich perhydropolysilazane composition having a Si:N ratio ranging from approximately 1.5:1 to approximately 2.5:1;
  adding a quenching agent when the N—H free and Si-rich perhydropolysilazane composition obtains the desired molecular weight;
  the quenching agent being $NEt_3$;
  adding a quenching agent when the catalyst is $B(C_6F_5)_3$ and the N—H free and Si-rich perhydropolysilazane composition obtains the desired molecular weight as monitored by NMR or IR spectroscopy;
  isolating the N—H free and Si-rich perhydropolysilazane composition by filtration;
  producing the N—H free and Si-rich perhydropolysilazane composition without treating the composition to remove any N—H bonds;
  wherein the N—H free and Si-rich perhydropolysilazane composition is N—H free without requiring heating to remove any N—H bonds;
  mixing the trisilylamine with the catalyst on a substrate;
  depositing the catalyst on a substrate;
  maintaining the temperature and pressure of a reaction chamber and substrate so that the trisilylamine vapor is condensed onto the substrate containing the catalyst;
  maintaining the temperature and pressure of a reaction chamber and substrate so that the vapor of both the trisilylamine and the catalyst are condensed onto the substrate;
  simultaneously injecting into a reactor the vapor phase of both the trisilylamine and the catalyst; or
  sequentially injecting into a reactor the vapor phase of both the trisilylamine and the catalyst.

In another alternative, the method consists of mixing the trisilylamine and a catalyst to produce the N—H free and Si-rich perhydropolysilazane composition. The disclosed method may include one or more of the following embodiments:
  the catalyst being $B(C_6F_5)_3$;
  the catalyst being $B(C_6FH_4)_3$;
  the catalyst being $BPh_3$;
  the catalyst being $PdCl_2$;
  the catalyst being $Co_2(CO)_8$;
  the catalyst being $Ru_3(CO)_{12}$;
  the catalyst being Zeolite Y (H) Si:Al;
  the catalyst being approximately 0.1% w/w to approximately 10% w/w M on C (M/C), with M being Pt, Ru, Pd, Rh, or Ni;
  mixing trisilylamine and the catalyst at room temperature and atmospheric pressure;
  mixing 1 ppm mole % to 50 mole % of the catalyst;
  mixing 5 ppm mole % to 5 mole % of the catalyst;
  mixing 10 ppm mole % to 0.1 mole % of the catalyst;
  the N—H free and Si-rich perhydropolysilazane composition having a Si:N ratio ranging from approximately 1.5:1 to approximately 2.5:1;
  mixing the trisilylamine with the catalyst on a substrate;
  depositing the catalyst on a substrate;
  maintaining the temperature and pressure of a reaction chamber and substrate so that the trisilylamine vapor is condensed onto the substrate containing the catalyst;
  maintaining the temperature and pressure of a reaction chamber and substrate so that the vapor of both the trisilylamine and the catalyst are condensed onto the substrate;
  simultaneously injecting into a reactor the vapor phase of both the trisilylamine and the catalyst; or
  sequentially injecting into a reactor the vapor phase of both the trisilylamine and the catalyst.

In yet another alternative, the method consists of (a) mixing the trisilylamine and a catalyst in a solvent to produce the N—H free and Si-rich perhydropolysilazane composition and (b) adding a quenching agent when the N—H free and Si-rich perhydropolysilazane composition obtains the desired molecular weight. In yet another alternative, the method consists of (a) mixing the trisilylamine and a catalyst in a solvent to produce the N—H free and Si-rich perhydropolysilazane composition, (b) adding a quenching agent when the N—H free and Si-Rich perhydropolysilazane composition obtains the desired molecular weight; and (c) isolating the N—H free and Si-rich perhydropolysilazane composition. Either of the disclosed methods may include one or more of the following embodiments:
  the solvent being pentane;
  the solvent being toluene;
  the catalyst being $B(C_6F_5)_3$;
  the catalyst being $B(C_6FH_4)_3$;
  the catalyst being $BPh_3$;
  the catalyst being $PdCl_2$;
  the catalyst being $Co_2(CO)_8$;
  the catalyst being $Ru_3(CO)_{12}$;
  the catalyst being Zeolite Y (H) Si:Al;
  the catalyst being approximately 0.1% w/w to approximately 10% w/w M on C (M/C), with M being Pt, Ru, Pd, Rh, or Ni;
  the quenching agent being $NEt_3$;
  mixing trisilylamine and the catalyst at room temperature and atmospheric pressure;

mixing 1 ppm mole % to 50 mole % of the catalyst;
mixing 5 ppm mole % to 5 mole % of the catalyst;
mixing 10 ppm mole % to 0.1 mole % of the catalyst;
the N—H free and Si-rich perhydropolysilazane composition having a Si:N ratio ranging from approximately 1.5:1 to approximately 2.5:1;
isolating the N—H free and Si-rich perhydropolysilazane composition by filtration;
producing the N—H free and Si-rich perhydropolysilazane composition without treating the composition to remove any N—H bonds; or
wherein the N—H free and Si-rich perhydropolysilazane composition is N—H free without requiring heating to remove any N—H bonds.

N—H free and Si-rich perhydropolysilazane compositions having a molecular weight ranging from approximately 332 dalton to approximately 100,000 dalton and produced by any of the methods above are also disclosed. The N—H free and Si-rich perhydropolysilazane compositions may have one or more of the following embodiments:

the N—H free and Si-rich perhydropolysilazane composition comprising N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the N—H free and Si-rich perhydropolysilazane composition consisting essentially of N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the N—H free and Si-rich perhydropolysilazane composition consisting of N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the N—H free and Si-rich perhydropolysilazane composition having a Si:N ratio ranging from approximately 1.5:1 to approximately 2.5:1;
the N—H free and Si-rich perhydropolysilazane composition comprising between approximately 0 wt % and approximately 1 wt % of any N—H containing unit;
the N—H free and Si-rich perhydropolysilazane composition comprising between approximately 99 wt % to approximately 100 wt % of N—H free repeating unit sharing the N atoms bonded to 3 silicon atoms; or
The N—H free and Si-rich perhydropolysilazane composition being a liquid at standard temperature and pressure.

Si-containing film forming compositions comprising the N—H free and Si-rich perhydropolysilazane compositions produced by any of the methods above are also disclosed. The Si-containing film forming compositions may have one or more of the following embodiments:

the Si-containing film forming composition being a spin-on film forming composition;
the Si-containing film forming composition being a vapor deposition film forming composition;
the Si-containing film forming composition consisting essentially of the N—H free and Si-rich perhydropolysilazane;
the Si-containing film forming composition consisting of the N—H free and Si-rich perhydropolysilazane;
the N—H free and Si-rich perhydropolysilazane composition comprising N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the N—H free and Si-rich perhydropolysilazane composition consisting essentially of N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the N—H free and Si-rich perhydropolysilazane composition consisting of N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the N—H free and Si-rich perhydropolysilazane composition having a Si:N ratio ranging from approximately 1.5:1 to approximately 2.5:1;
the N—H free and Si-rich perhydropolysilazane composition comprising between approximately 0 wt % and approximately 1 wt % of any N—H containing unit;
the N—H free and Si-rich perhydropolysilazane composition comprising between approximately 99 wt % to approximately 100 wt % of N—H free repeating unit sharing the N atoms bonded to 3 silicon atoms.
further comprising a solvent;
the solvent being hydrocarbons, ketones, ethers, amines, esters, or combinations thereof;
the solvent being benzene, toluene, xylene, n-hexane, or combinations thereof;
the solvent being methylethylketone, cyclohexanone, 2-heptanone, or combinations thereof;
the solvent being ethyl ether, tetrahydrofuran, or combinations thereof;
the solvent being pyridine, xylene, methyl pyridine, or combinations thereof;
the solvent being 2-hydroxy ethyl propionate, hydroxyl ethyl acetate, or combinations thereof;
the solvent being the N—H free and Si-rich perhydropolysilazane composition comprising N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the solvent being the N—H free and Si-rich perhydropolysilazane composition consisting essentially of the N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the solvent being the N—H free and Si-rich perhydropolysilazane composition consisting of the N—H free repeating units having the following formula $[-N(SiH_3)_x(SiH_2-)_y]$, wherein $x=0$, 1, or 2 and $y=0$, 1, or 2 with $x+y=2$; and $x=0$, 1 or 2 and $y=1$, 2, or 3 with $x+y=3$;
the Si-containing film forming composition comprising a solid N—H free and Si-rich perhydropolysilazane composition dissolved or dispersed in a liquid N—H free and Si-rich perhydropolysilazane composition;
the Si-containing film forming composition consisting essentially of a solid N—H free and Si-rich perhydropolysilazane composition dissolved or dispersed in a liquid N—H free and Si-rich perhydropolysilazane composition; or
the Si-containing film forming composition consisting of a solid N—H free and Si-rich perhydropolysilazane composition dissolved or dispersed in a liquid N—H free and Si-rich perhydropolysilazane composition.

Also disclosed are processes for the deposition of silicon-containing films on substrates. The N—H free and Si-rich perhydropolysilazane compositions disclosed above are introduced into a reactor having a substrate disposed therein. At least part of the N—H free and Si-rich perhydropolysilazane composition is deposited onto the substrate to form the silicon-containing film. The disclosed processes may further include one or more of the following aspects:
- introducing a reactant into the reactor;
- the reactant being plasma-treated;
- the reactant being remote plasma-treated;
- the reactant not being plasma-treated;
- the reactant being selected from the group consisting of $H_2$, $H_2O$, $N_2H_4$, $NH_3$, $SiH_4$, $Si_2H_6$, $Si_3H_8$, $SiH_2Me_2$, $SiH_2Et_2$, $N(SiH_3)_3$, hydrogen radicals thereof, and mixtures thereof;
- the reactant being $H_2$;
- the reactant being $NH_3$;
- the reactant being selected from the group consisting of $O_2$, $O_3$, $H_2O$, $H_2O_2$, NO, $N_2$, $NO_2$, oxygen radicals thereof, and mixtures thereof;
- the reactant being $O_3$, $^1\Delta_g$ singlet oxygen, $^1\Sigma_g^+$ singlet oxygen, $^3\Sigma_g^-$ triplet oxygen, or combinations thereof;
- the reactant being $H_2O$;
- the reactant being plasma treated $O_2$;
- the reactant being $O_3$;
- the N—H free and Si-rich perhydropolysilazane composition and the reactant being introduced into the reactor simultaneously;
- the reactor being configured for chemical vapor deposition;
- the reactor being configured for plasma enhanced chemical vapor deposition;
- the N—H free and Si-rich perhydropolysilazane composition and the reactant being introduced into the chamber sequentially;
- the reactor being configured for atomic layer deposition;
- the reactor being configured for plasma enhanced atomic layer deposition;
- the reactor being configured for spatial atomic layer deposition;
- the silicon-containing film being a silicon oxide ($Si_mO_n$, wherein each of m and n is an integer which inclusively range from 1 to 6);
- the silicon oxide being $SiO_2$;
- the silicon oxide film having a thickness between approximately 10 nm and approximately 50 nm;
- the silicon oxide film having a thickness between approximately 15 nm and approximately 30 nm;
- the silicon-containing film being a silicon nitride ($Si_uN_v$, wherein each of u and v is an integer which inclusively range from 1 to 6); or
- the silicon nitride being $Si_3N_4$.

Also disclosed are coating methods of forming Si-containing films on substrates. The N—H free and Si-rich perhydropolysilazane compositions disclosed above are contacted with the substrate and the Si-containing film formed via a spin coating, spray coating, dip coating, or slit coating technique. The disclosed methods may include the following aspects:
- the Si-containing film forming composition comprising ethanol;
- the Si-containing film forming composition comprising isopropanol;
- forming the Si-containing film via a spin coating technique;
- forming the Si-containing film via a spray coating technique;
- forming the Si-containing film via a dip coating technique;
- forming the Si-containing film via a slit coating technique;
- annealing the Si-containing film; or
- laser treating the Si-containing film.

Notation and Nomenclature

Certain abbreviations, symbols, and terms are used throughout the following description and claims, and include:

As used herein, the indefinite article "a" or "an" means one or more.

As used herein, the terms "approximately" or "about" mean±10% of the value stated.

As used herein, the term "comprising" is inclusive or open-ended and does not exclude additional, unrecited materials or method steps; the term "consisting essentially of" limits the scope of a claim to the specified materials or steps and additional materials or steps that do not materially affect the basic and novel characteristics of the claimed invention; and the term "consisting of" excludes any additional materials or method steps not specified in the claim.

As used herein, "N—H free" means that less than typically 1% of all of the N atoms in the substance have an N—H bond, and that approximately 99% to approximately 100% of the N atoms are bonded to 3 silicon atoms. One of ordinary skill in the art will recognize that FTIR and/or $^{1H}$NMR may be used to quantitatively determine the molar percentage of N—H bonds present in a sample by measuring peak/height areas for known concentrations and developing a calibration curve therefrom.

As used herein, "C-free" means that the N—H free repeating units have no Si—C bonds. One of ordinary skill in the art will recognize that FTIR and/or $^{29S}$NMR may be used to quantitatively determine the molar percentage of Si—C bonds present in a sample by measuring peak/height areas for known concentrations and developing a calibration curve therefrom.

As used herein, "Si-rich" PHPS means a PHPS having a Si:N ratio ranging from between 2.5:1 and 1.5:1. The Si:N ratio may normally be estimated by measuring the refractive index of the PHPS product and is calculated using the formula $[N]/[Si]=[4(n_{a-Si:H}-n)]/[3(n+n_{a-siH}-2n_{a-siN4})]=4(3.3-n)/3(n-0.5)$, wherein $n_{a-Si:H}=3.3$ and $n_{a-SiN4}=1.9$ are the refractive indices of a-Si:H and nearly stoichiometric a-$Si_3N_4$. See, e.g., Section 3.1 of Longjuan et al., Journal of Semiconductors, Vol. 30, No. 9 (September 2009).

As used herein, the abbreviation "MW" stands for molecular weight and the abbreviation "RT" means room temperature or a temperature ranging from approximately 18° C. to approximately 25° C.

As used herein, the abbreviation $M_n$ stands for the number averaged molecular weight or the total weight of all of the polymer molecules in a sample divided by the total number of polymer molecules in the sample (i.e., $M_n=\Sigma N_iM_i/\Sigma N_i$, wherein $N_i$ is the number of molecules of weight $M_i$); the abbreviation $M_w$ stands for weight averaged molecular weight or the sum of the weight fraction of each type of molecule multiplied by the total mass of each type of molecule (i.e., $M_w=\Sigma[(N_iM_i/\Sigma N_iM_i)*N_iM_i]$; the term "Poly Dispersity Index" or PDI means the ratio of $M_w:M_n$; the term "volatile PHPS" means a molecular complex having a $M_n$ ranging from 107 to 450; the term "oligomer" means a liquid molecular complex having a $M_n$ typically ranging from 450 to 20,000; the term "polymer" means a solid molecular complex having a $M_n$ typically ranging from 10,000 to 2,000,000.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x (NR^2R^3)_{(4-x)}$, where x is 2 or 3, the two or three $R_1$ groups may, but need not be identical to each other, or to each $R^2$ or to each $R^3$. Further, it should be understood that unless specifically stated otherwise, values of R groups are independent of each other when used in different formulas.

As used herein, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, n-propyl groups, n-butyl groups, etc. Examples of branched alkyls groups include without limitation, isopropyl or t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the term "amyl" refers to an amyl or pentyl group (i.e., a C5 alkyl group); the term "tAmyl" refers to a tert-amyl group, also known as 1,1-dimethylpropyl; the abbreviation "Ph" refers to a phenyl group; the term "halide" refers to the halogen anions $F^-$, $Cl^-$, $Br^-$, and $I^-$; and the term "silyl" refers to a $R_3Si$— ligand, wherein each R is independently H or a C1-C4 alkyl group.

The standard abbreviations of the elements from the periodic table of elements are used herein. It should be understood that elements may be referred to by these abbreviations (e.g., Mn refers to manganese, Si refers to silicon, C refers to carbon, etc.). Additionally, Group 3 refers to Group 3 of the Periodic Table (i.e., Sc, Y, La, or Ac). Similarly, Group 4 refers to Group 4 of the Periodic Table (i.e., Ti, Zr, or Hf) and Group 5 refers to Group 5 of the Periodic Table (i.e., V, Nb, or Ta).

Any and all ranges recited herein include their endpoints (i.e., x=1 to 4 or x ranges from 1 to 4 includes x=1, x=4, and x=any number in between), irrespective of whether the term "inclusively" is used.

Please note that silicon oxide, silicon oxynitride, or silicon nitride films may be referenced throughout the specification and claims without reference to their proper stoichiometry. The layers may include nitride ($Si_kN_l$) layers, oxide ($Si_nO_m$) layers, or combination thereof such as silicon oxynitride ($Si_kO_mN_l$), wherein k, l, m, n, o, and p inclusively range from 1 to 6. For instance, silicon oxide is $Si_nO_m$, wherein n ranges from 0.5 to 1.5 and m ranges from 1.5 to 3.5. More preferably, the silicon oxide layer is $SiO_2$. Silicon nitride is $Si_kN_l$, wherein k ranges from 2 to 6 and l ranges from 3 to 6. More preferably, the silicon nitride layer is $Si_3N_4$. Silicon oxynitride is $Si_kO_mN_l$, wherein k ranges from 0.5 to 1.5, m ranges from 0.5 to 1.5, and l ranges from 0.5 to 1.5. More preferably, the silicon oxynitride layer is SiON. These films may also contain Hydrogen, typically from 0 at % to 15 at %. However, since not routinely measured, any film compositions given ignore their H content, unless explicitly stated otherwise.

BRIEF DESCRIPTION OF THE FIGURES

For a further understanding of the nature and objects of the present invention, reference should be made to the following detailed description, taken in conjunction with the accompanying figures wherein.

DESCRIPTION OF PREFERRED EMBODIMENTS

Figure 1:
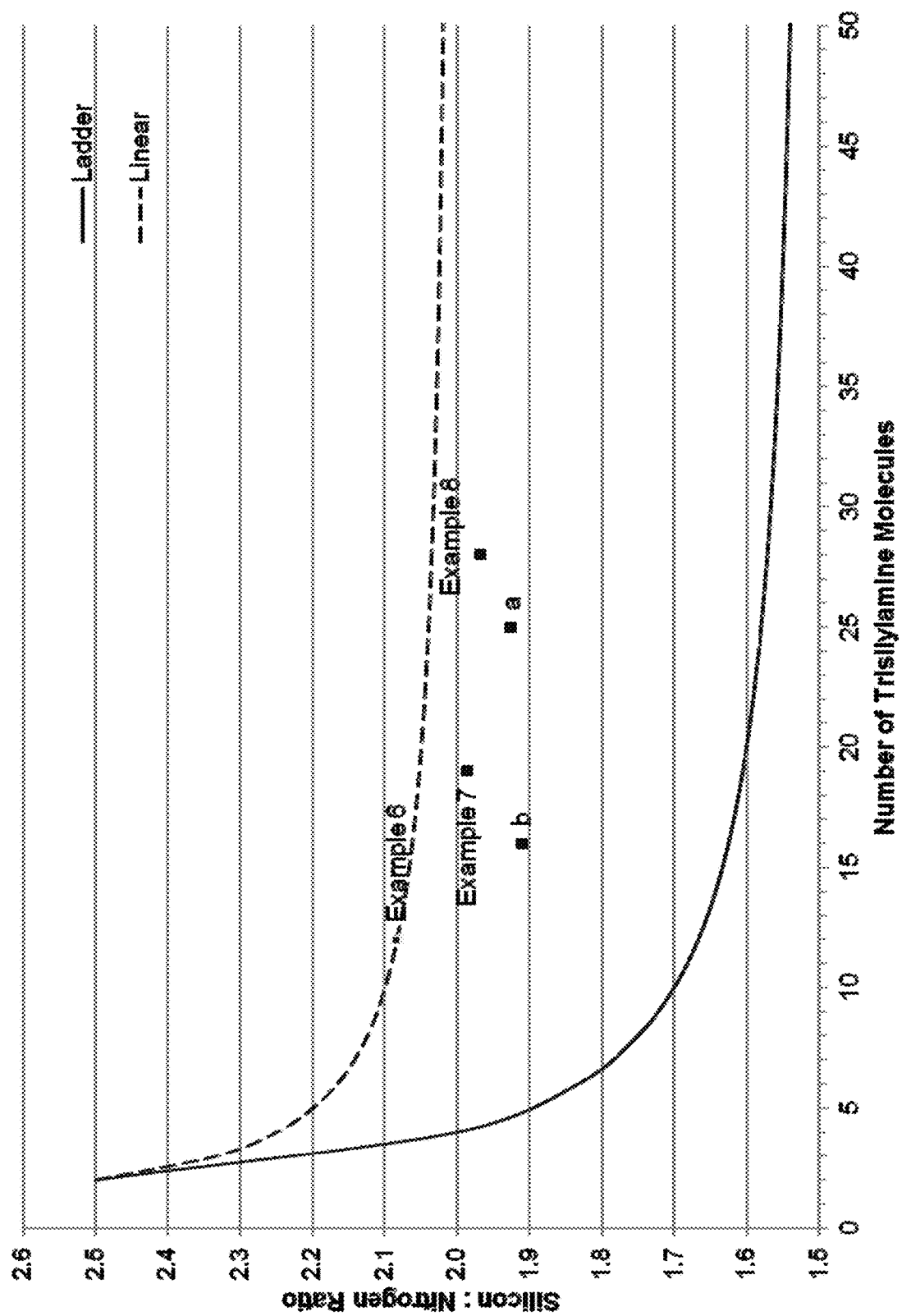
FIG. 1 is a graph of the Si:N ratio versus the number of trisilylamine reactants added to the PHPS composition.

N—H free, C-free, and Si-rich perhydropolysilazane (PHPS) compositions are disclosed. The PHPS compositions comprise N—H free repeating units having the following formula [—N(SiH$_3$)$_x$(SiH$_2$-)$_y$], wherein x=0, 1, or 2 and y=0, 1, or 2 with x+y=2; and x=0, 1 or 2 and y=1, 2, or 3 with x+y=3. These PHPS compositions contain little to no N—H bonds because all of the Ns are bonded directly to Si.

Synthesis

The disclosed N—H free, C-free, and Si-rich PHPS compositions are synthesized by catalyzed desilylative coupling of trisilylamine [N(SiH$_3$)$_3$ or "TSA" ] or from similar inorganic (SiH$_3$)$_2$N— terminated N—H free, low MW silazanes (MW<450 amu)(referred to herein as "volatile PHPS"), such as bis(disilylamino)silane (H$_3$Si)$_2$—N—SiH$_2$—N—(SiH$_3$)$_2$. Alternatively, the TSA or volatile PHPS may include partially substituted by NR$^1$R$^2$ groups, wherein R$^1$ and R$^2$ are independently selected from a linear or branched C$_1$ to C$_4$ alkyl, provided that the volatile PHPS contains at least two —SiH$_3$ silyl groups.

For instance, the volatile PHPS may include the compounds disclosed in PCT Pub. No. WO2015/047914 to Sanchez et al., including (R$^4$—SiH$_2$—)(R$^3$—SiH$_2$—)—N—SiHR$^5$—NR$^1$R$^2$, wherein R$^1$ and R$^2$ are independently selected from the group of linear or branched C1 to C6 alkyl, linear or branched C1 to C8 alkenyl, linear or branched C1 to C8 alkynyl, C6 to C10 aryl, linear or branched C1 to C6 alkyl ether, silyl, trimethyl silyl, or linear or branched C1 to C6 alkyl-substituted silyl; and R$^3$, R$^4$, and R$^5$ are independently selected from H, linear or branched C1 to C6 alkyl, linear or branched C1 to C8 alkenyl, linear or branched C1 to C8 alkynyl, C6 to C10 aryl, linear or branched C1 to C6 alkyl ether, silyl, trimethyl silyl, or linear or branched C1 to C6 alkyl-substituted silyl. More particularly, the volatile PHPS may include (H$_3$Si—)$_2$—N—SiH$_2$—NR$^1$R$^2$, wherein R$^1$ and R$^2$ are independently a linear or branched C1 to C4 alkyl.

TSA is commercially available. The volatile PHPS reactants may be synthesized using the methods disclosed herein or disclosed in PCT Pub. No. WO2015/047914 to Sanchez et al.

The reactants are halide free, thereby limiting any halogen contamination in the resulting N—H free PHPS compositions, as well as preventing formation of any corrosive byproducts.

The starting reactant, preferably trisilylamine, is mixed with a catalyst under an atmosphere that is inert to the reactant, for example Ar, N$_2$, H$_2$ or He. The amount of catalyst will vary depending upon both the starting reactant and the catalyst selected. The amount of catalyst required for the reaction may range from 1 ppm mole % to 50 mole %, preferably from 5 ppm mole % to 5 mole %, and more preferably from 10 ppm mole % to 0.1 mole %.

Exemplary catalysts include commercially available Lewis acids or Lewis bases. The Lewis acids include transition metals and compounds thereof such as metal carbonyls, boranes, boron halides, and organoboranes, aluminum halides, alkaline and alkaline earth metals and its compounds, etc. The Lewis acid may be in its homogeneous or heterogeneous phase and may be affixed to a support (like carbon, Al$_2$O$_3$, polymer, resin, etc). Specific Lewis acids include triarylboranes having the formula BR$_3$, wherein R is an aryl or substituted aryl group having 6 to 12 carbon atoms, including but not limited to B(C$_6$F$_5$)$_3$, B(C$_6$FH$_4$)$_3$ or BPh$_3$. The Lewis bases include amines, phosphines, ethers, thioethers, halides, alkynes, arenes, etc. Specific Lewis bases include Ph$_2$PCl 1,4-diazabicyclo[2.2.2]octane (DABCO), ethyldimethylamine (EtMe$_2$N), triethylamine (Et$_3$N), diethylamine (Et$_2$NH), di-isopropyl amine (iPr$_2$NH), isopropyl amine (iPrNH$_2$), heterogeneous catalysts such as palladium on carbon (Pd/C), platinum on carbon (Pt/C), platinum on aluminum (Pt/Al), or homogeneous catalysts such as Co$_2$(CO)$_8$, Ru$_3$(CO)$_{12}$, and other Co or Ru carbonyls containing compounds, 1,4-bis(diphenylphosphino)butane ruthenium (II) chloride, (2-aminomethyl) pyridine [RuCl$_2$((AMPY(DPPB))], Rh(PPh$_3$)$_3$, chloro[(R,R)-1,2-diphenyl-N1-(3-phenylpropyl)-N2-(p-toluenesulfonyl)-1,2-ethanediamine] ruthenium [(R,R)-tethTsDpenRuCl], PdCl$_2$, methyl iodide (MeI), tetrabutylphosphonium chloride (TBPC), or combinations thereof.

Preferably, the catalyst is chloride free to prevent chloride contamination in the resulting N—H free PHPS compositions. Exemplary chloride free catalysts include B(C$_6$F$_5$)$_3$, B(C$_6$FH$_4$)$_3$, BPh$_3$, 1,4-diazabicyclo[2.2.2]octane (DABCO), palladium on carbon (Pd/C), platinum on carbon (Pt/C), platinum on aluminum (Pt/Al), Co2(CO)$_8$, Ru$_2$(CO)$_8$, (2-aminomethyl)pyridine.

The catalysts selected will depend upon the starting reactant and the desired use of the N—H free PHPS composition. For example, as shown in the Examples that follow, TSA and 0.2 mol % B(C$_6$F$_5$)$_3$ neat produce a solid PHPS (MW>>1000) in 5 minutes at room temperature. Addition of a pentane solvent slows the reaction time to 17 hours at the same temperature. Changing the starting reactant from TSA to (H$_3$Si)$_2$—N—SiH$_2$—N—(SiH$_3$)$_2$ results in a PHPS oil after 1 week. The PHPS oil produced in 1 week from the (H$_3$Si)$_2$—N—SiH$_2$—N—(SiH$_3$)$_2$ starting material has a lower molecular weight than the solid PHPS produced from TSA in pentane. In all three reactions, 100% of the starting reactant was consumed as determined by gas chromatography. However, changing from 0.2 mol % of the B(C$_6$F$_5$)$_3$ Lewis acid catalyst to 2-5 mol % of a BPh$_3$ Lewis acid catalyst only produces (H$_3$Si)$_2$—N—SiH$_2$—N—(SiH$_3$)$_2$, and less than approximately 1% of the TSA starting reactant is converted after 1 week at room temperature. Lewis bases such as P(Tolyl)$_3$, P(Ph)$_3$, supported P(Ph)$_3$, and Et$_3$N were less successful and would require a longer reaction time or higher temperature to proceed.

Applicants have also found that the activity of a catalyst may be enhanced by the addition of a Lewis base, such as a tertiary amine. The Lewis base is selected so as not to be reactive with the starting material (TSA or other volatile PHPS) and/or by the presence of a solvent that at least partially solubilises the catalyst. The Lewis base may simultaneously serve as the solvent and enhance the catalyst activity.

The reactant and catalysts may be mixed neat or in a solvent. Exemplary solvents include hydrocarbons, such as pentane, hexanes, heptanes, benzene, toluene, other alkanes, or alkane mixes. Other solvents include halohydrocarbons such as dichloromethane or chloroform; ethers such as tetrahydrofuran (THF), or terbutylether, and more generally aprotic solvents, such as acetonitrile, benzene, dimethylformamide, hexamethylphosphoramide, dimethyl sufloxide, or combinations thereof. As shown in the examples that follow, the solvent may be used to slow the reaction process. Alternatively, the catalyst and/or starting reactant may be soluble in the solvent. When the catalyst is soluble in the solvent, the catalyst becomes more efficient and the reaction may proceed more quickly. The solvent also may help to produce the powder form of solid PHPS reaction products. The solvent may also affect the rate of intramolecular vs. intermolecular de-silylative coupling, and hence affect the $SiH_2:SiH_3$ and Si:N ratio of the product. For example, the PHPS reaction product has limited solubility in some alkanes, such as pentane. As a result, reactions in pentane produce lower molecular weight PHPS reaction products. In contrast, the PHPS is more soluble in aromatic hydrocarbons, such as toluene. Therefore, reactions in toluene produce higher molecular weight PHPS reaction products. One of ordinary skill in the art would be able to choose the appropriate solvent to arrive at the desired PHPS reaction product.

The catalyst may be added to a vessel containing the reactant. Alternatively, the reactant may be added to a vessel containing the catalyst (inverse addition). In another alternative, the reactant and catalyst may be added to the vessel simultaneously. In yet another alternative, the catalyst may be added to a vessel containing a portion of the reactant with the remaining portion of the reactant added to the catalyst/reactant mixture in the vessel. In all four embodiments, the rate of addition will depend upon the desired PHPS reaction product.

Synthesis of the disclosed N—H free PHPS compositions may take place at any suitable temperature, provided that the temperature remains below the temperature at which the PHPS reaction product decomposes or results in thermal breakage of any Si—N or Si—H bonds. For practical reasons, it is advisable to run the reaction at a temperature lower than the boiling point of TSA (52° C.) or $(SiH_3)_2$—N—$SiH_2$—N—$(SiH_3)_2$ (hereinafter "BDSASi") (103° C.). For example, for the solid PHPS composition produced from TSA and 0.2 mol % $B(C_6F_5)_3$ neat in 5 minutes at room temperature, it may be desirable to slow the reaction by using a temperature cooler than room temperature, for example, ranging from approximately −78° C. to approximately 0° C. In contrast, heat may be required to speed up some of the slower reactions. For example, the temperature may range from approximately 28° C. to approximately 50° C. for some of the synthesis reactions. For other reactions, room temperature (i.e., approximately 18° C. to approximately 24° C.) may be suitable. In another alternative, the reaction may be run at a temperature ranging from approximately −10° C. to approximately 27° C. One of ordinary skill in the art will recognize that higher reaction temperatures may increase the reaction rate of the PHPS synthesis. Higher reaction temperatures may also produce larger molecular weight products by inducing cross-linking by intermolecular desilylation (between oligomers), yielding more cross linked, higher $SiH_2:SiH_3$ ratio oligomers, or branched products.

As shown in the examples that follow, the initial desilylative polymerization reaction of TSA to BDSASI occurs rapidly. In comparison, subsequent desilylative polymerization of BDSASI to larger PHPS compositions occurs more slowly. Applicants believe that the polymers may be formed by sequential reaction at the terminal $SiH_3$ units:

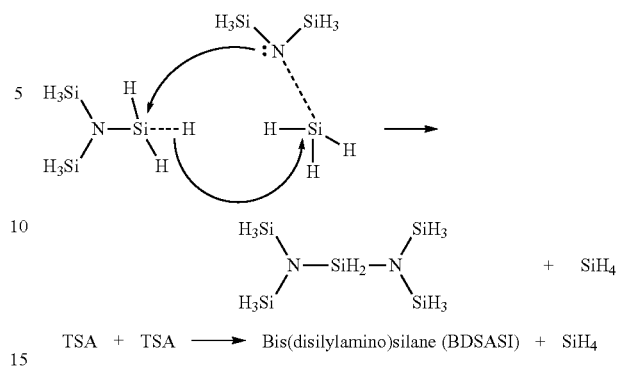

As the reaction continues, the chain length of the PHPS composition increases:

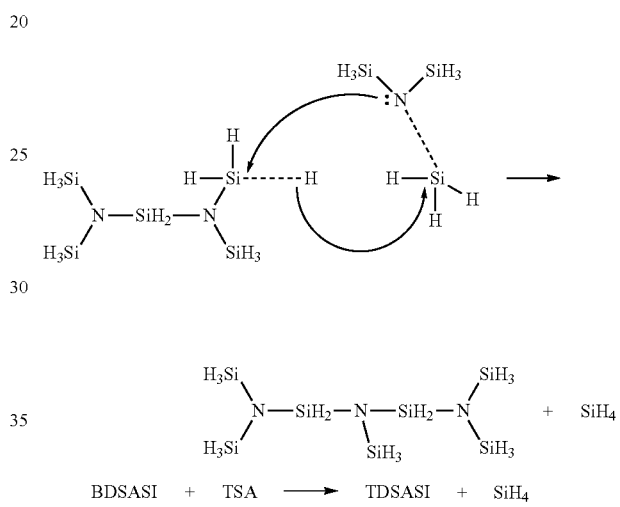

The reaction may proceed linearly:

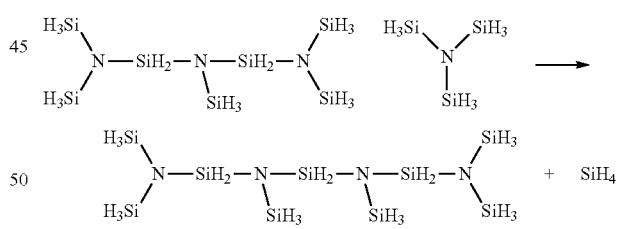

or in a branched manner

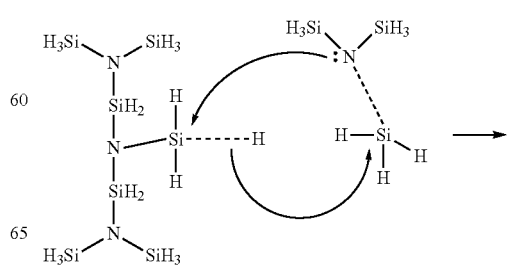

-continued

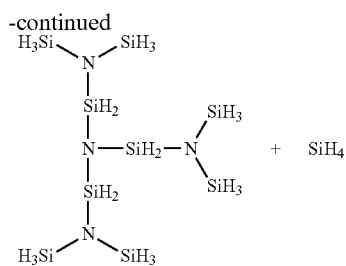

Intermolecular reactions:

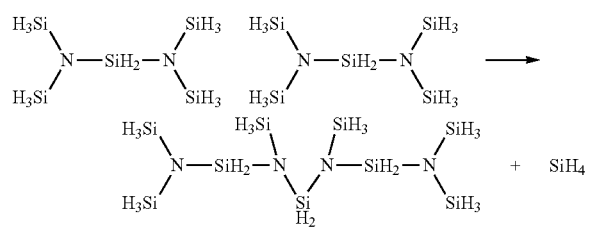

or intramolecular reactions may also occur:

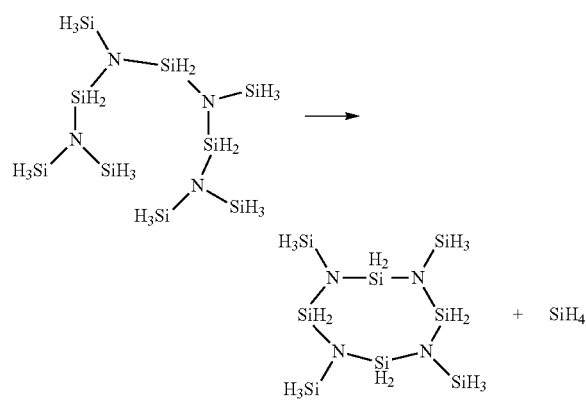

As can be seen, these reactions generate a SiH$_4$ byproduct, which may be cryotrapped and further used as needed, or vented from the reactor and discarded.

As can also be seen, these reactions lead to reaction products that have only —SiH$_2$— and —SiH$_3$ groups (no —SiH— groups).

If desired, the reaction may optionally be quenched (terminated) prior to 100% consumption of the starting reactant or to stop intra or intermolecular desilylative coupling reactions between —SiH$_3$ moieties. For example, when the appropriate molecular weight (MW) or MW distribution is achieved, the catalyst activity may be quenched by the addition of a coordinant compound such as XNR$_4$ (X=F, Cl, Br, I; R=alkyl), R—CN, R$_2$S, PR$_3$, etc. A NMR or IR spectrometer may be used to monitor the progress of the reaction in situ to determine when the quenching agent is needed. Alternatively, the quenching agent may stop the reaction based upon the time determined in previous experiments. In another alternative, the quantity and type of starting materials may be selected so that permitting the reaction to go to completion produces the desired product. As demonstrated in the examples that follow, the earlier the quenching agent is added to the reaction, the lower the MW distribution of the PHPS product.

Depending upon the intended use of the product, the PHPS compositions may comprise a combination of the [—N(SiH$_3$)$_x$(SiH$_2$-)$_y$] units, the starting reactant, the catalyst, the solvent, the quenching agent, and/or any other components required for the intended use.

Alternatively, the PHPS compositions may consist essentially of the [—N(SiH$_3$)$_x$(SiH$_2$-)$_y$] units. In this context, the term "consist essentially of" means that the PHPS composition contains approximately 90% w/w to approximately 98% w/w of the [—N(SiH$_3$)$_x$(SiH$_2$-)$_y$] units, with only a total of approximately 2% w/w to approximately 5% w/w of any remaining components of the reaction mixture.

In another alternative, the PHPS compositions may consist of only the [—N(SiH$_3$)$_x$(SiH$_2$-)$_y$] units, or between approximately 98% w/w and 100% w/w of [—N(SiH$_3$)$_x$(SiH$_2$-)$_y$] units alone.

When the [—N(SiH$_3$)$_x$(SiH$_2$-)$_y$] units form a liquid, the liquid may be isolated from the reaction mixture by stripping the volatile components (solvent, low MW compounds) and/or by filtration of the catalyst (for heterogeneous catalysts) or any non soluble quenched catalyst. Further treatment may further help reduce the catalyst content. For example, the liquid composition may be passed over an adsorbent, such as amorphous carbon, or an ion exchange resin, such as the product sold by Rohm&Haas under the trademark Amberlyst™. When the [—N(SiH$_3$)$_x$(SiH$_2$-)$_y$] units form a solid, the solid may be isolated from the reaction mixture by filtration. In such instances, the usage of liquid catalysts is preferred for the synthesis of solid PHPS as it may be removed by filtration (simultaneously with the solvent, if a solvent is also used).

The synthesis methods may be performed using equipment components known in the art. Some level of customization of the components may be required based upon the desired temperature range, pressure range, local regulations, etc. Exemplary equipment suppliers include Buchi Glass Uster AG, Shandong ChemSta Machinery Manufacturing Co. Ltd., Jiangsu Shajabang Chemical Equipment Co. Ltd, etc.

While this disclosure and examples that follow focus on N—H-free volatile PHPS and PHPS oligomers and polymers, similar reactions and formation of N—H free reaction products are expected from the catalysed polymerization of any organic trisilylamine derivatives having a structure N(SiR$^1_3$)(SiHR$^2_2$)(SiH$_3$), yielding a polymer having the linear repeating unit [—N(SiR$^1_3$)(SiR$^2_2$—)], wherein each R$^1$ and R$^2$ is independently selected from H, a C1-C6 hydrocarbyl such as methyl, ethyl, vinyl, allyl, phenyl, and a dialkylamino group. The formation of a non linear polymer implies that all R$^2$ are H. Applicants believe that R$^2$ needs to be small groups (preferably a C1-C3 hydrocarbyl) to avoid the steric hindrance that would prevent the access to this silyl group to undergo disilylative coupling.

In Situ Synthesis

The formation of PHPS oligomers or polymers (MW>450, preferably up to solid films) may also be carried on a substrate by condensing the vapours of the TSA or volatile PHPS (MW<450) reactants onto a substrate in the presence of a catalyst. The catalyst may either be non volatile and already present on the substrate, or co-injected and co-condensed on the substrate with the TSA and/or the volatile NH-free PHPS reactant. In situ synthesis may be useful in the manufacture of semiconductor, photovoltaic, LCD-TFT, or flat panel type devices.

The substrate may be, but is not limited to, a silicon wafer, a glass sheet, or a plastic sheet. Since the reaction of the condensed TSA and/or the NH-free volatile PHPS reactant may happen in the presence of the catalyst at low temperature (room temperature to 100° C.), this process may be performed on any substrate that withstands this reaction temperature. The substrate may be a silicon wafer having additional layers on its surface that are typical of semiconductor device manufacturing, such as but not limited to, silicon, silicon-germanium, germanium, SiC, SiOC, $SiO_2$, SiN, organic films, metallic films (Cu, Al, W, Co, Ru, Ta, Ti, etc.) and their nitrides and silicides. The substrate may have features and 3D topography, such as trenches and holes having openings in the range of 10 μm to 5 nm, more typically in the range of 500 nm to 10 nm, and these trenches are meant to be filled with the non-volatile PHPS forming on the substrate.

As shown in some of the examples that follow, the disclosed reactions may occur using a small amount of catalyst, for example, in the range of 5 ppm mole % to 5 mole %, and more preferably from 10 ppm mole % to 0.1 mole %. The catalyst may be pre-deposited on the substrate (via gas phase deposition, spin coating of a solution containing the catalyst, etc.) or sequentially or co-injected in the gas phase when the catalyst is volatile enough. The reaction proceeds by thermal condensation. Thermal condensation occurs by setting the reactor at a temperature that maintains the reactant in its vapour phase and setting the substrate at a temperature that is close to or below the dew point of the vapour at the vapour partial pressure.

In another alternative, the PHPS oligomer or polymer (MW>450) may be formed in selective areas by exposing TSA vapors, volatile PHPS, or a liquid PHPS oligomer to a substrate on which the catalyst has been selectively deposited on certain areas, for instance by masking, inkjet printing or selective deposition.

In another alternative, the liquid PHPS oligomer may be mixed with a low activity catalyst and subject to a treatment that activates the catalyst and converts the liquid PHPS oligomer to a solid PHPS. Such treatment may include thermal treatment or irradiation to photons or electrons.

PHPS may also be formed in-situ on silicon substrates during deposition processes called "flowable CVD", in which trisilylamine or volatile PHPS vapors are injected in a chamber along with plasma activated $NH_3$. The reaction product is a PHPS liquid film that actually flows into the features on the wafer surface, yielding a similar result to the spinning on of a PHPS formulation. The CVD-deposited PHPS film can then be converted to silicon oxide in an anneal process, or by a plasma activated process. See, e.g., US Pat App Pub No 2012/0142198 to Wang et al.

In one non-limiting in situ deposition process, the vapor phase of the TSA reactant and the vapor phase of the catalyst, Ph2PCl, are introduced into the reaction chamber and react to form the disclosed PHPS compositions on the substrate. The film will then undergo post treatment for conversion to silicon nitride or silicon oxide. This process sequence (deposition/curing) may provide the desired film thickness or may be repeated until a film having the necessary thickness has been obtained.

In another non-limiting in situ deposition process, the vapor phase of the TSA reactant is introduced into a reaction chamber containing a substrate having the catalyst deposited on the substrate. The TSA reacts with the catalyst to form the N—H free and C-free PHPS reaction product. If the desired film is a silicon nitride film, this process may provide the desired film thickness or may be repeated until a film having the necessary thickness has been obtained.

Exemplary PHPS Reaction Products

The disclosed methods produce a NH-free PHPS reaction product consisting solely of Si, N, and H.

Depending on the choice of starting reactant, catalyst, optional solvent, and optional quenching agent, as well as the reaction duration and temperature, the reaction yields N—H free and C-free PHPS compositions having variable molecular weight (MW) distribution. The PHPS composition may have a MW ranging from approximately 182 dalton [$(SiH_3)_3N$—$SiH_2$—$N(SiH_3)_2$, bis-disilylaminosilane, "BDSASi"] to approximately 100,000 (solids), preferably from approximately 257 dalton [$(SiH_3)_3N$—$SiH_2$—N$(SiH_3)$—$SiH_2$—$N(SiH_3)_2$, "TDSASi"] to approximately 100,000 dalton (solids), and more preferably from approximately 332 dalton [$(SiH_3)_3N$—$SiH_2$—N$(SiH_3)$—$SiH_2$—N$(SiH_3)$—$SiH_2$—$N(SiH_3)_2$, "QDSASi"] to approximately 100,000 dalton (solids). These parameters may be chosen so as to yield low molecular mass volatile compounds, such as BDSASi for use in vapor deposition or condensation processes. In such a case, the target MW distribution may be centered at 182 dalton, and be as narrow as possible. Alternatively, liquid oligomers may be obtained, which may be used in spin on deposition, fiber spinning, injection molding, casting, etc. In such a case, the target MW is typically between 350 dalton and 20,000 dalton, preferably between 1,000 and 10,000 dalton, and more preferably from 3,000 to 5,000 dalton. In another alternative, the reaction may be allowed to proceed until formation of a gel or solid N—H free PHPS polymer. The solid polymer may be formed in different shapes and textures, ranging from monolithic glassy solids to powdery solids, depending on the presence of a solvent, dilution ratio in the solvent, and agitation in the reactor. When powdery, the solid may be filtered out of the reaction solution, optionally washed with solvent, optionally thermally treated, and used for further applications (sintering, usage as filler, etc.).

As discussed above, the reactant, preferably trisilylamine, catalyst and optional solvent may be selected to provide a N—H free PHPS composition having the desired properties. The resulting PHPS compositions comprise N—H free repeating units having the formula [—$N(SiH_3)_x(SiH_2-)_y$], wherein x=0, 1, or 2 and y=0, 1, or 2 with x+y=2; x=0, 1 or 2 and y=1, 2, or 3 with x+y=3. Exemplary units include: When x=2, y=0, x+y=2, and m=1, the resulting unit is:

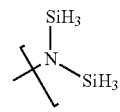

When x=0, y=3, x+y=3, and m=1, the resulting unit is:

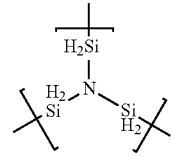

When x=1, y=2, x+y=3, and m=1, the resulting unit is:

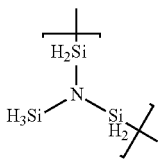

When x=2, y=1, x+y=3, and m=1, the resulting unit is:

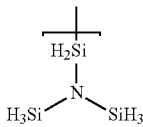

One of ordinary skill in the art will recognize that the disclosed PHPS compositions may include two or more different [—N(SiH$_3$)$_x$(SiH$_2$-)$_y$] units. Each unit comprises a portion of the larger PHPS reaction product.

For example, when one unit having x=2 and y=1 combines with one unit having x=2 and y=0, the resulting linear PHPS composition is (H$_3$Si)$_2$—N—SiH$_2$—N—(SiH$_3$)$_2$ or bis(disilylamino)silane [referred to herein as BDSASI]. The combination of one unit having x=2 and y=1, with two units having x=1 and y=1, and one unit having x=2 and y=0, forms a linear PHPS composition having the formula (H$_3$Si)$_2$—N—SiH$_2$—N(SiH$_3$)—SiH$_2$—N(SiH$_3$)—SiH$_2$—N(SiH$_3$)$_2$ (hereinafter "TDSASI"). Adding an additional x=1 and y=1 unit produces a linear PHPS composition having the formula (H$_3$Si)$_2$—N—SiH$_2$—N(SiH$_3$)—SiH$_2$—N(SiH$_3$)—SiH$_2$—N(SiH$_3$)—SiH$_2$—N(SiH$_3$)$_2$ (hereinafter "QDSASI"). Applicants believe that a PHPS composition having a M$_n$ up to approximately 400 with x=1 and y=1 may be synthesized before non-linear branching begins to occur (i.e., (H$_3$Si)$_2$—N—SiH$_2$—[N(SiH$_3$)—SiH$_2$—]$_m$—N—(SiH$_3$)$_2$, wherein m=1 to 5).

The units may be combined to form linear chains, such as:

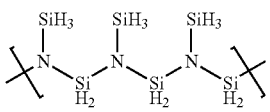

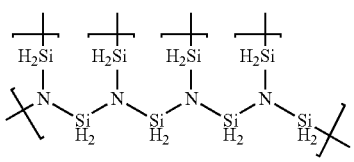

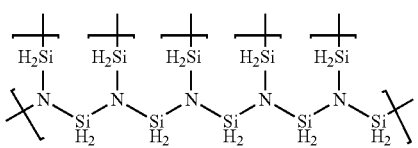

The units may also be combined to form cyclic chains, such as:

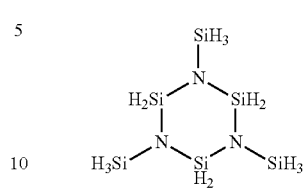

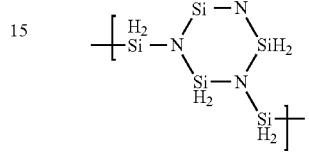

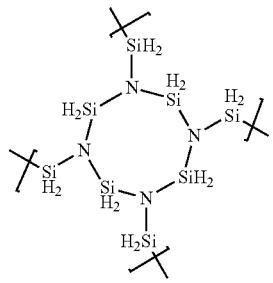

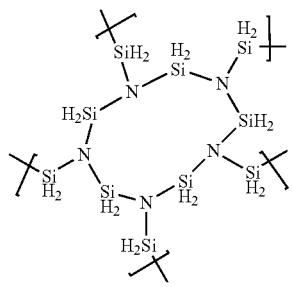

The PHPS reaction product may also comprise a mixture of both cyclic and linear units.

As depicted above for the various units, any terminal portion of the PHPS composition is —SiH$_3$.

One of ordinary skill in the art will recognize that the disclosed PHPS compositions are formed in three-dimensions, notwithstanding the two-dimensional depictions provided herein.

Depending upon the reactants, catalysts, and other synthesis parameters, the linear PHPS reaction products may be obtained at lower reaction temperatures (e.g., approximately −78° C. to approximately 20° C.). The lower reaction temperatures may facilitate reaction at the terminal —SiH$_3$ of the polymer chain. Slowly adding the reactant to the catalyst or the catalyst to the reactant may also result in linear PHPS reaction products.

In contrast, branched PHPS compositions may be formed at higher temperatures, faster reactant/catalyst addition times, and/or longer contact times with the catalyst. Exemplary branched PHPS compositions include one x=0 and y=3 unit terminated by three x=2 and y=0 units, to produce a PHPS composition having the formula:

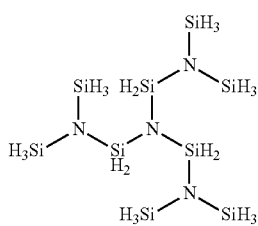

Further branched growth becomes more difficult to categorize. For example, the PHPS composition below may be described as a combination of one unit having x=0 and y=3; three units having x=0 and y=2, and six units having x=2 and y=0:

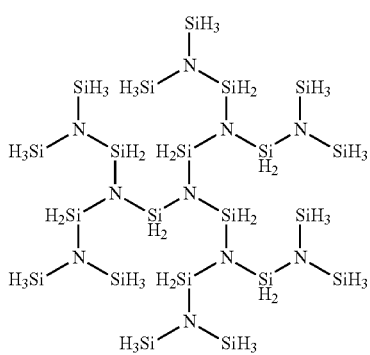

In another alternative, the PHPS composition may comprise a combination of linear and branched units terminated by —SiH$_3$ and/or [—N(SiH$_3$)$_2$].

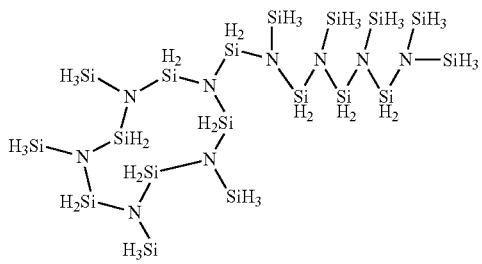

The resulting PHPS compositions may be characterized using standard techniques in the art, including but not limited to viscosity (for liquid products), thermogravimetric analysis (TGA), differential scanning calorimetry (DSC), gel permeation chromatography (GPC), Fourier-transform InfraRed spectroscopy (FTIR), nuclear magnetic resonance (NMR) spectroscopy, etc.

As shown in the Examples that follow, many of the N—H free PHPS compositions exhibit little to no mass loss with increasing temperature during thermogravimetric analysis (TGA). Any mass loss observed by TGA is evidence of the potential for shrinkage and stress in the material. While this may be manageable for some applications, the usage of PHPS for making silicon nitride films in semiconductor applications has been prevented both by the high temperature anneal required to convert the PHPS to SiN, and by the stress associated with the shrinkage of the material.

N—H Free

As demonstrated in the examples that follow and the accompanying IR spectra, the PHPS reaction products are free of any N—H bonds, owing to the fact that they are not formed by ammonolysis, and that the starting materials (TSA, BDSASi, or other volatile PHPS reactants) are also N—H-free. In other words, these reactions do not require or use an ammonia (NH$_3$) reactant. Applicants believe that the NH$_3$ reactant may serve as the origin of the N—H bond contained in the prior art PHPS compositions. The use of the TSA reactant and lack of NH$_3$ reactant in the disclosed synthesis processes eliminates the need to remove any halide by products and/or reduce the amount of H by further processes.

Applicants believe that the absence of N—H in the PHPS reaction product may make conversion of the PHPS to SiO$_2$ easier at lower temperatures than the prior art N—H containing PHPS compositions.

Si:N Ratio

Whether linear, branched, or a mixture of both, the Si:N ratio decreases from a maximum of 3:1 for the TSA reactant (i.e., 3 Si:1 N) to 2.5:1 for BDSASI (i.e., 5 Si:2 N) to a minimum of 1.5:1 (see structure below in which all Ns attach to 3 SiH$_2$ and all SiH$_2$ attach to 2 N, producing the minimum 3 Si: 2 N or 1.5 Si:N ratio) as the size of the PHPS increases.

When the PHPS reaction product is formed solely by successive desilylative coupling without any intramolecular coupling of 2 SiH$_3$ belonging to the same molecule, the Si:N ratio ranges between 2.5:1 (BDSASi) and 2:1 (i.e., for an infinite linear polymer having (—SiH$_2$—N(SiH$_3$)—)$_n$ structure or fully branched structure with SiH$_2$ only in the center and SiH$_3$ at the end of the chains).

A fully desilylated PHPS having undergone intramolecular desilylative coupling between all its —SiH$_3$ groups (idealized by the infinite ladder case below for instance) would have a Si:N ratio of 1.5:1, as each —SiH$_2$— is bonded to 2 N, and each N is bonded to 3 Si.

In another alternative, the polymer or oligomer may contain cyclic units formed from 3 or more (—N(SiH$_2$ or 3)SiH$_2$—) units. Such oligomers would have an Si:N ratio in between the ladder structure below (i.e., Si:N>1.5:1) but equal to or below the purely linear case for a polymer having the same number of N atoms (i.e., Si:N≤2:1).

This phenomenon is depicted in FIG. 1, which shows the Si:N ration on the y axis and the number of trisilylamine reactant additions on the x axis. As can be seen in FIG. 1, the curve becomes an asymptote approaching Si:N ratio of 2:1 for linear PHPS reaction products and 1.5:1 for cross-linked PHPS reaction products.

The PHPS composition has a Si:N ratio ranging from between 2.5:1 and 1.5:1, preferably between 2.5:1 and 1.75:1, but no less than 1.5:1.

As discussed infra, the PHPS compositions may be used to form silicon oxide films used for semiconductor applications. US Pat. App. Pub. No. 2015/004421 to Fujiwara et al. demonstrates that the usage of a Si-rich PHPS (i.e., having an Si:N ratio higher than the 1:1) is beneficial to achieve low shrinkage of the film obtained by spin-on and oxidative annealing. Fujiwara et al. obtain a higher than 1:1 Si:N ratio by forming the PHPS in a halosilane excess (so that the PHPS still contains Si—Cl bonds). Fujiwara et al. further process the partially chlorinated PHPS oligomers at temperatures ranging from 40-200° C., and preferably 100-200° C., to further react the Si—Cl with N—H moieties of the polymer, hence trying to create —(SiH$_2$)$_2$NSiH$_2$-structures in the polymer. Id. at paras 0036-0037 and 0043. Alternatively, Fujiwara et al. add a halosilane to the NH-containing PHPS to yield a similar result. Id. at para 0038. Still, Fujiwara's method suffers from the need to process a chlorinated silane (hence the formation of $NH_4Cl$ solid in Example 3), and limits the effective Si:N ratio to 1.4:1. Id. at Table 1. The PHPS also still contains N—H moieties, and hence subject to instability from Si—H/N—H elimination yielding further cross linking and evolution of the molecular weight distribution.

As discussed infra, the PHPS compositions may also be used to form silicon nitride films. The wet etch rate of silicon nitride films used in the semiconductor industry by a HF-based solution depends upon the Si:N ratio and on the H concentration of the silicon nitride film (Longjuan et al., Journal of Semiconductors, Vol. 30, No. 9, September 2009). Longjuan et al. decreased the silicon nitride etch rate by (a) increasing the Si:N ratio of the film through optimization of the deposition parameters (i.e., increasing the $SiH_4$ gas flow rate and/or decreasing the $NH_3$ and $N_2$ gas flow rate) and (b) releasing H after film formation using high temperature rapid thermal annealing (RTA). Id. However, Hirao et al. disclose that annealing silicon nitride films reduces H concentration via loss of H from N—N and Si—H bonds, not from N—H bonds. Japanese Journal of Applied Physics, Vol. 27, Part 1, Number 1. The disclosed N—H free and Si-rich PHPS compositions may be used to produce silicon nitride films having few to no N—H bonds, permitting the subsequent removal of any remaining H in the film via annealing. Applicants believe that the lack of N—H bonds in the silicon nitride may permit lower temperature annealing and/or faster UV curing than required for films containing N—H bonds. More particularly, the disclosed PHPS composition produce silicon nitride films having a wet etch rate equal or below half the etch rate of thermally grown silicon oxide using a dilute HF solution (0.5 to 1% HF), preferably below 1/10th.

As such, the disclosed halide-free process produces a PHPS composition having a high Si:N ratio and free of N—H moieties in order to yield silicon oxide or silicon nitride with low shrinkage, and low stress silicon oxide.

$SiH_2:SiH_3$ Ratio

The PHPS compositions have a $SiH_2:SiH_3$ ratio ranging from 1:4 (BDSASi) to 1:0, preferably ranging from 1:2.5 to 1:0 (TDSASI), and more preferably ranging from 1:2 to 1:0. The minimum $SiH_2:SiH_3$ ratio in the PHPS polymer is 1:4 for BDSASI. As successive desilylative coupling with the TSA reactant occurs, the ratio converges towards 1:1 (—$SiH_2$—$N(SiH_3)$—) repeating units. Eventually, intermolecular or intramolecular desilylative coupling between —$SiH_3$ groups within an oligomeric molecule or between 2 oligomeric molecules further reduces the $SiH_2:SiH_3$ ratio to below 1:1, potentially down to 1:0 in the case of an infinite polymer in which all N are bonded to 3—$SiH_2$—, yielding a polymer having an average composition of $N(SiH_2—)_3$. An example of such an oligomer structure is provided below:

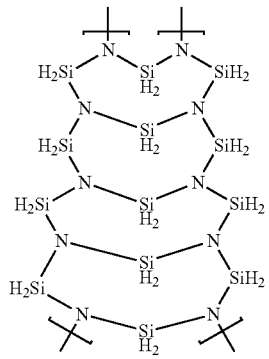

When the PHPS composition has this ladder structure, the $SiH_2:SiH_3$ ratio approaches 1:0 (limited only by any terminal $SiH_3$ groups) as the length of the oligomer or polymer increases. At the same time, the Si:N ratio tends to converge towards 1.5:1, but never below 1.5:1. As a result, the $SiH_2:SiH_3$ ratio helps determine the amount of cross-linking exhibited by the PHPS reaction product.

Additionally, the PHPS polymer does not contain any silicon atoms attached to a single H atom so long as not heated to a temperature that will induce Si—H cleavage. In other words, all Si atoms in the PHPS polymer are bonded to a minimum of 2H atoms (i.e., $SiH_x(N—)_{4-x}$, wherein x is 2-3).

One of ordinary skill in the art will recognize that $^1H$ and/or $^{29}Si$ NMR spectroscopic integration may be used to determine the quantity of —Si(-)(H)—, —$SiH_2$—, and —$SiH_3$ in the PHPS compositions.

Vapor Phase Applications

The disclosed N—H free and Si-rich PHPS compositions obtained from these synthesis methods may be used in a variety of applications. Preferably, the volatile PHPS compositions are used in the vapor phase applications. These volatile PHPS compositions may be used to form silicon nitride or silicon oxide films used in the electronics industry via vapor deposition techniques, such as atomic layer deposition or chemical vapor deposition (thermal or plasma activated).

The vapor deposition methods include: introducing the vapor of the disclosed PHPS composition into a reactor having a substrate disposed therein: and depositing at least part of the disclosed PHPS composition onto the substrate via a deposition process to form a Si-containing layer.

The disclosed methods also provide for forming a bi-element-containing layer on a substrate and, more particularly, for deposition of $SiMO_x$ or $SiMN_x$ films, wherein x may be 0-4 and M is Ta, Nb, V, Hf, Zr, Ti, Al, B, C, P, As, Ge, lanthanides (such as Er), or combinations thereof.

The volatile PHPS may be used neat in these processes. Alternatively, the volatile PHPS composition may further comprise a solvent suitable for use in deposition. Exemplary solvents include, among others, $C_1$-$C_{16}$ saturated or unsaturated hydrocarbons. The volatile PHPS may be present in varying concentrations in the solvent. For example, the resulting concentration may range from approximately 0.05M to approximately 2M.

The disclosed methods of forming silicon-containing layers on substrates may be useful in the manufacture of semiconductor, photovoltaic, LCD-TFT, or flat panel type devices. The Si-containing films may be deposited using any vapor deposition methods known in the art. Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), flowable CVD (f-CVD), metal organic chemical vapor deposition (MOCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, spatial ALD, or PE-ALD in order to provide suitable step coverage and film thickness control.

The vapor of the volatile PHPS composition is introduced into a reaction chamber containing a substrate. For vapor deposition processes, the temperature and the pressure within the reaction chamber and the temperature of the substrate are held at conditions suitable for vapor deposition of at least part of the PHPS composition onto the substrate. In other words, after introduction of the vaporized composition into the chamber, conditions within the chamber are such that at least part of the vaporized precursor is deposited onto the substrate to form the silicon-containing film. A reactant may also be used in vapor deposition processes to help in formation of the Si-containing layer.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 760 Torr. In addition, the temperature within the reaction chamber may range from about 20° C. to about 700° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 700° C. When a plasma deposition process is utilized, the deposition temperature may range from approximately 20° C. to approximately 550° C. Alternatively, when a thermal process is performed, the deposition temperature may range from approximately 300° C. to approximately 700° C.

Alternatively, the substrate may be heated to a sufficient temperature to obtain the desired silicon-containing film at a sufficient growth rate and with desired physical state and composition. A non-limiting exemplary temperature range to which the substrate may be heated includes from 150° C. to 700° C. Preferably, the temperature of the substrate remains less than or equal to 500° C. In some embodiment, the silicon-containing film may be formed at room temperature (i.e., approximately 20° C. to approximately 27° C.).

The type of substrate upon which the silicon-containing film will be deposited will vary depending on the final use intended. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, crystalline silicon, silica, glass, Ge, or GaAs wafers. The wafer may have one or more layers of differing materials deposited on it from a previous manufacturing step. The layers may be planar or patterned. In some embodiments, the substrate may be a patterned photoresist film made of hydrogenated carbon, for example $CH_x$, wherein x is greater than zero (e.g., x≤4). The disclosed processes may deposit the silicon-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The actual substrate utilized may also depend upon the specific precursor embodiment utilized.

The substrate may be patterned to include vias or trenches having high aspect ratios. For example, a conformal Si-containing film, such as $SiO_2$, may be deposited using any ALD technique on a through silicon via (TSV) having an aspect ratio ranging from approximately 3:1 to approximately 100:1.

The volatile PHPS compositions are introduced into the reactor in vapor form by conventional means, such as tubing and/or flow meters. The vapor form may be produced by vaporizing the PHPS composition through a conventional vaporization step such as direct vaporization, distillation, by bubbling, or by using a sublimator such as the one disclosed in PCT Publication WO2009/087609 to Xu et al. The PHPS composition may be fed in liquid state to a vaporizer where it is vaporized before it is introduced into the reactor. Alternatively, the PHPS composition may be vaporized by passing a carrier gas into a container containing the composition or by bubbling the carrier gas into the composition. The carrier gas may include, but is not limited to, Ar, He, or $N_2$, and mixtures thereof. Bubbling with a carrier gas may also remove any dissolved oxygen present in the composition. The carrier gas and PHPS composition are then introduced into the reactor as a vapor.

If necessary, the container may be heated to a temperature that permits the PHPS composition to be in its liquid phase and to have a sufficient vapor pressure. The container may be maintained at temperatures in the range of, for example, 0-150° C. Those skilled in the art recognize that the temperature of the container may be adjusted in a known manner to control the amount of PHPS composition vaporized.

A reaction gas may also be introduced into the reactor. The reaction gas may be an oxygen-containing gas, such as $O_2^-$; $O_3^-$; $H_2O$; $H_2O_2$; oxygen containing radicals such as O. or OH.; NO; $NO_2$; carboxylic acids such as formic acid, acetic acid, propionic acid; radical species of NO, $NO_2$, or the carboxylic acids; para-formaldehyde; and mixtures thereof. Preferably, the oxygen-containing gas is selected from the group consisting of $O_2$, $O_3$, $H_2O$, $H_2O_2$, oxygen containing radicals thereof such as O. or OH., and mixtures thereof. Preferably, when an ALD process is performed, the reactant is plasma treated oxygen, ozone, or combinations thereof. When an oxygen-containing gas is used, the resulting silicon containing film will also contain oxygen.

Alternatively, the reaction gas may be a hydrogen-containing gas such as one of $H_2$, $NH_3$, $(SiH_3)_3N$, hydridosilanes (such as $SiH_4$, $Si_2H$, $Si_3H$, $Si_4H_{10}$, $Si_5H_{10}$, $Si_6H_{12}$), chlorosilanes and chloropolysilanes (such as $SiHCl_3$, $SiH_2Cl_2$, $SiH_3Cl$, $Si_2Cl_6$, $Si_2HCl_5$, $Si_3Cl_8$), alkysilanes (such as $Me_2SiH_2$, $Et_2SiH_2$, $MeSiH_3$, $EtSiH_3$), hydrazines (such as $N_2H_4$, $MeHNNH_2$, MeHNNHMe), organic amines (such as $NMeH_2$, $NEtH_2$, $NMe_2H$, $NEt_2H$, $NMe_3$, $NEt_3$, $(SiMe_3)_2$NH), diamines such as ethylene diamine, dimethylethylene diamine, tetramethylethylene diamine, pyrazoline, pyridine, B-containing molecules (such as $B_2H_6$, trimethylboron, triethylboron, borazine, substituted borazine, dialkylaminoboranes), alkyl metals (such as trimethylaluminum, triethylaluminum, dimethylzinc, diethylzinc), radical species thereof, or mixtures thereof. When the hydrogen-containing gas is used, the resulting silicon containing film may be pure Si.

In another alternatively, the reaction gas may be a saturated or unsaturated, linear, branched or cyclic hydrocarbon, such as but not limited to ethylene, acetylene, propylene, isoprene, cyclohexane, cyclohexene, cyclohexadiene, pentene, pentyne, cyclopentane, butadiene, cyclobutane, terpinene, octane, octane, or combinations thereof. One of ordinary skill in the art will recognize that some vapor deposition processes may use a combination of the oxidizing agent, reducing agent, and/or hydrocarbon.

The reaction gas may be treated by a plasma, in order to decompose the reaction gas into its radical form. $N_2$ may also be utilized as a reactant when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The PHPS composition and one or more reactants may be introduced into the reaction chamber simultaneously (chemical vapor deposition), sequentially (atomic layer deposition), or in other combinations. For example, the PHPS composition may be introduced in one pulse and two additional precursors may be introduced together in a separate pulse (modified atomic layer deposition). Alternatively, the reaction chamber may already contain the co-reactant prior to introduction of the PHPS composition. The reactant may be passed through a plasma system localized or remotely from the reaction chamber, and decomposed to radicals. Alternatively, the PHPS composition may be introduced to the reaction chamber continuously while other precursors or reactants are introduced by pulse (pulsed-chemical vapor deposition). In another alternative, the PHPS composition and one or more reactants may be simultaneously sprayed from a shower head under which a susceptor holding several wafers is spun (spatial ALD).

In one non-limiting exemplary atomic layer deposition process, the vapor phase of the PHPS composition, such as BDSASI, is introduced into the reaction chamber, where it is contacted with a suitable substrate. Excess composition may then be removed from the reaction chamber by purging and/or evacuating the reaction chamber. An oxygen source is introduced into the reaction chamber where it reacts with the absorbed PHPS composition in a self-limiting manner. Any excess oxygen source is removed from the reaction chamber by purging and/or evacuating the reaction chamber. If the desired film is a silicon oxide film, this two-step process may provide the desired film thickness or may be repeated until a film having the necessary thickness has been obtained.

Alternatively, if the desired film is a silicon metal/metalloid oxide film (i.e., $SiMO_x$, wherein x may be 0-4 and M is B, Zr, Hf, Ti, Nb, V, Ta, Al, Si, Ga, Ge, or combinations thereof), the two-step process above may be followed by introduction of a vapor of a metal- or metalloid-containing precursor into the reaction chamber. The metal- or metalloid-containing precursor will be selected based on the nature of the silicon metal/metalloid oxide film being deposited. After introduction into the reaction chamber, the metal- or metalloid-containing precursor is contacted with the substrate. Any excess metal- or metalloid-containing precursor is removed from the reaction chamber by purging and/or evacuating the reaction chamber. Once again, an oxygen source may be introduced into the reaction chamber to react with the metal- or metalloid-containing precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the PHPS composition, metal- or metalloid-containing precursor, and oxygen source, a film of desired composition and thickness can be deposited.

Additionally, by varying the number of pulses, films having a desired stoichiometric M:Si ratio may be obtained. For example, a $SiMO_2$ film may be obtained by having one pulse of the PHPS composition and one pulse of the metal- or metalloid-containing precursor, with each pulse being followed by a pulse of the oxygen source. One of ordinary skill in the art will recognize that the number of pulses required to obtain the desired film may not be identical to the stoichiometric ratio of the resulting film.

The desired silicon-containing film may also contains another element, such as, for example and without limitation, B, P, As, Zr, Hf, Ti, Nb, V, Ta, Al, Si, or Ge. The silicon-containing films resulting from the processes discussed above may include $SiO_2$; SiC; SiN; SiON; SiOC; SiONC; SiBN; SiBCN; SiCN; SiMCO, in which M is selected from Zr, Hf, Ti, Nb, V, Ta, Al, Ge, depending of course on the oxidation state of M. One of ordinary skill in the art will recognize that by judicial selection of the appropriate PHPS compositions and reactants, the desired film composition may be obtained.

Coating Applications

The PHPS compositions may also be used in coating deposition processes to form silicon nitride, silicon oxide, or silicon oxynitride films used in the electronics and optics industry. The silicon oxide films are obtained from thermal treatment of the deposited film under an oxidative atmosphere, containing at least one of $O_2$, $O_3$, $H_2O$, $H_2O_2$, and combinations thereof. The PHPS compositions may be used to form protective coatings or pre-ceramic materials for use in the aerospace, automotive, military, or steel industry or any other industry requiring strong materials capable of withstanding high temperatures. The disclosed PHPS compositions may also be used as a fuel for or burning rate catalyst in solid propellant compositions (see, e.g., German Pat. App. Pub. No. 2231008 and U.S. Pat. Nos. 3,137,599 and 4,412,874).

The PHPS composition may further comprise a solvent or solvent system having different boiling points in order to adjust the coating composition's properties, such as viscosity or layer thickness. Exemplary solvents include hydrocarbons such as benzene, toluene, xylene, or n-hexane; ketones, such as methylethylketone, cyclohexanone, or 2-heptanone; ethers, such as ethyl ether or tetrahydrofuran; and amines, such as pyridine, xylene, or methyl pyridine;

esters, such as 2-hydroxy ethyl propionate or hydroxyl ethyl acetate; and combinations thereof. An exemplary solvent system may contain one solvent that boils at lower temperatures, with a boiling point (BP) between 30° C. and 100° C., such as pentane, hexane, benzene, diethylether, methylethylether, cyclohexane, acetone etc. The solvent system may also comprise a second solvent may have a higher boiling point, with a BP between 70° C. and 200° C. such as toluene, THF, xylene, methyl isobutyl ketone, cyclohexanones, cyclopentanone, glycols, etc. To be suitable for coating methods, the PHPS composition should have a molecular weight ranging from approximately 500 to approximately 1,000,000, preferably from approximately 1,000 to approximately 100,000, and more preferably from approximately 3,000 to approximately 50,000. The PHPS composition may comprise between approximately 0.5% w/w to approximately 40% w/w of the coating composition, preferably from approximately 1% w/w to approximately 20% w/w, and more preferably from approximately 5% w/w to approximately 10% w/w.

Other additives suitable for the coating composition include polymerization initiators, surfactants, pigments, UV absorbers, pH adjusters, surface modifiers, plasticizers, dispersing agents, catalysts, and combinations thereof. The catalyst may be the same or different from the catalyst used to synthesize the PHPS composition. Exemplary catalysts may be selected to facilitate further densification of the PHPS in subsequent processing steps by catalyzing further desilylative coupling (DSC), cross-linking, or $H_2$ elimination. Such catalysts should be selected for their low activity at room temperature to keep the composition stable upon storage, and only induce reactions when heated to a temperature higher than room temperature, and ideally between 50° C. and 200° C. For instance, $P(Ph)_3$ or $P(Tolyl)_3$ may be suitable catalysts for high temperature activation. The composition may also contain photoactive materials that will induce further cross-linking upon exposure to photons, such as photo-acid generators and photoinitiators such as radical initiators, cationic initiators, anionic photoinitiators. like mono-aryl ketones, trimethylbenzoyldiphenyl phosphinates, and/or phospine oxides.

The catalyst may also promote the conversion of the PHPS to silica.

The Si-containing films may be deposited using any coating methods known in the art. Examples of suitable coating methods include spin coating, dip coating, spray coating, fiber spinning, extrusion, molding, casting, impregnation, roll coating, transfer coating, slit coating, etc. The liquid PHPS formulations may also contain a ceramic filler, such as BN, SiN, SiCN, SiC, $Al_2O_3$, $ZrO_2$, $Y_2O_3$, and/or $Li_2O$ powders. The coating method is preferably spin coating in order to provide suitable film thickness control.

The liquid form of the PHPS composition may be applied directly to the center of the substrate and then spread to the entire substrate by spinning or may be applied to the entire substrate by spraying. When applied directly to the center of the substrate, the substrate may be spun to utilize centrifugal forces to evenly distribute the composition over the substrate. One of ordinary skill in the art will recognize that the viscosity of the PHPS composition will contribute as to whether rotation of the substrate is necessary. Alternatively, the substrate may be dipped in the PHPS composition. The resulting films may be dried at room temperature for a period of time to vaporize the solvent or volatile components of the film or dried by force-drying or baking or by the use of one or a combination of any following suitable process including thermal curing and irradiations, such as, ion irradiation, electron irradiation, UV and/or visible light irradiation, etc.

The PHPS containing formulation may be used to form spin-on dielectric film formulations (tone inversion layers, for instance) or for anti-reflective films. The PHPS containing formulation may be used for lithographic applications for the formation of gapfill silicon oxide or silicon nitride insulating films on semiconductor devices (Silicon Trench Insulators (STI), pre-metal dielectrics (PMD), tone inversion layers in lithography, etc.), either for sacrificial or non-sacrificial (i.e., leave-behind) films. The spin-on PHPS composition may also be used for the formation of transparent silicon oxynitride films suitable for optics applications.

When used for spin coating, dip coating or spray coating, the PHPS composition may be used for the formation of silicon oxide or silicon nitride barrier layers that are useful as moisture or oxygen barriers, or as passivation layers in displays, light emitting devices and photovoltaic devices.

In semiconductor applications, the PHPS compositions may be used as spin on formulations, essentially for gap-fill applications, in which a trench or a hole needs to be filled with a dielectric material (e.g., shallow trench isolation, pre-metal dielectric, etc.). The trench or hole may have an aspect ratio ranging from approximately 3:1 to approximately 100:1. The PHPS containing formulation is typically spun on the substrate, pre-baked at 50° C.–200° C., and eventually converted to silicon oxide by annealing the substrate in an oxidizing atmosphere, typically containing $O_2$, $O_3$, $H_2O$, $H_2O_2$ at a temperature ranging from 400 to 900° C.

Figure 2:
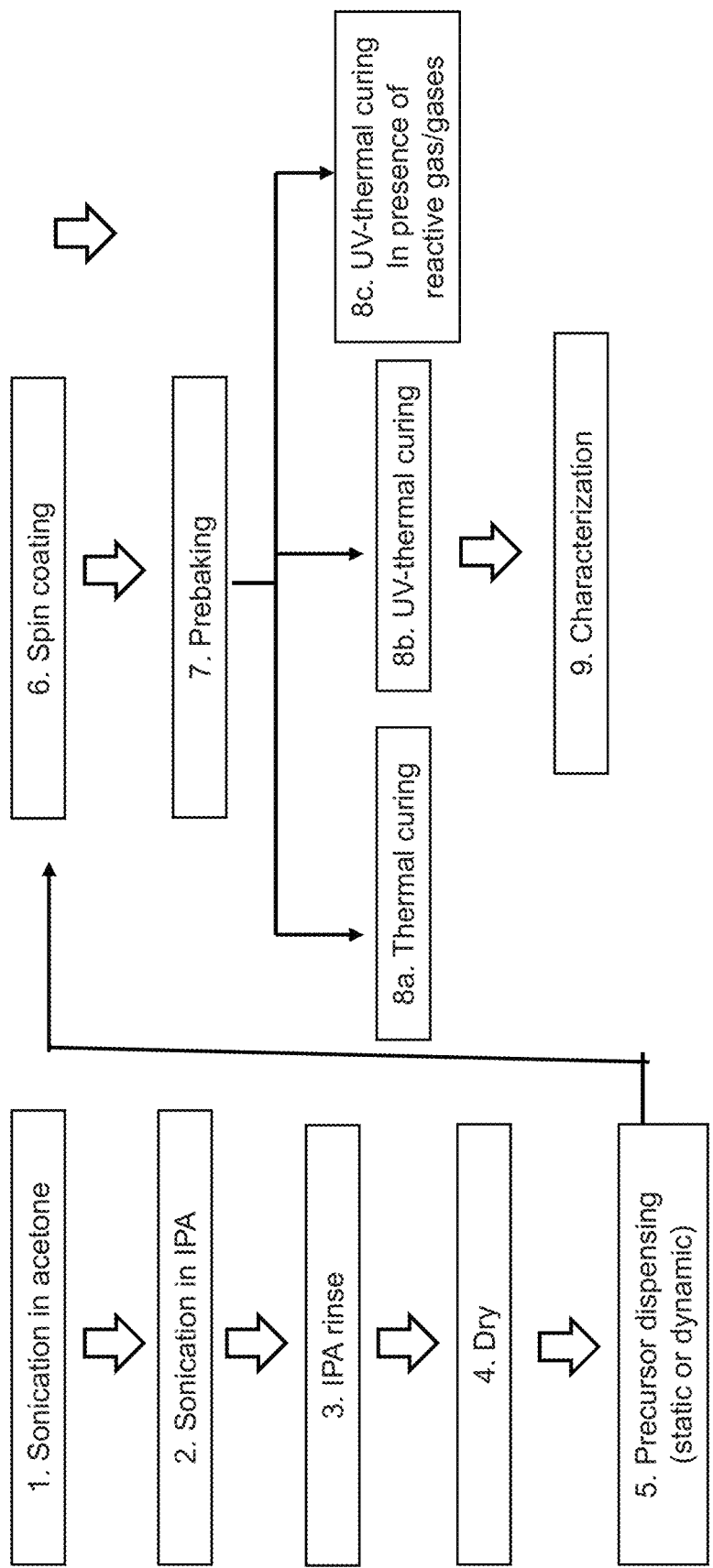
FIG. 2 is a flow chart for an exemplary deposition process.

FIG. 2 provides a flow chart of an exemplary spin-coating process. One of ordinary skill in the art will recognize that fewer or additional steps than those provided in FIG. 2 may be performed without departing from the teachings herein. For example, the characterization step utilized in a R&D setting may not be required in commercial operations. One of ordinary skill in the art will further recognize that the process is preferably performed under an inert atmosphere to prevent undesired oxidation of the film and/or in a clean room to help prevent contamination to prevent particle contamination of the film.

The planar or patterned substrate on which the Si-containing film is to be deposited may be prepared for the deposition process in Steps 1-4. High purity gases and solvents are used in the preparation process. Gases are typically of semiconductor grade and free of particle contamination. For semiconductor usage, solvents should be particle free, typically less than 100 particle/mL (0.5 μm particle, more preferably less than 10 particles/mL) and free of non-volatile residues that would lead to surface contamination. Semiconductor grade solvents having less than 50 ppb metal contamination (for each element, and preferably less than 5 ppb) are advised.

In Step 1, the substrate is sonicated in acetone at room temperature (between approximately 20° C. and approximately 25° C.) for approximately 60 second to approximately 120 seconds, and preferably for approximately 90 seconds. In Step 2, the planar or patterned substrate is sonicated at room temperature in isopropyl alcohol (IPA) for approximately 60 second to approximately 120 seconds, and preferably for approximately 90 seconds. One of ordinary skill in the art will recognize that these steps may be performed in the same or different sonicators. Different sonicaters require more equipment, but provide an easier process. The sonicator must be thoroughly cleaned between Step 1 and 2 if used for both to prevent any contamination of the substrate. Exemplary sonicators suitable for the disclosed methods include Leela Electronics Leela Sonic Models 50, 60, 100, 150, 200, 250, or 500 or Branson's B Series. In Step 3, the substrate is removed from the IPA sonicator and rinsed with fresh IPA. In Step 4, the rinsed substrate is dried using an inert gas, such as $N_2$ or Ar. One of ordinary skill in the art will recognize that Steps 1 through 4 provide one exemplary wafer preparation process. Multiple wafer preparation processes exist and may be utilized without departing from the teachings herein. See, e.g., Handbook of Silicon Wafer Cleaning Technology, $3^{rd}$ Edition, 2017 (William Andrew). For example, an UV/ozonation process may be used if a more hydrophilic surface is desired. One of ordinary skill in the art may determine the appropriate wafer preparation process based at least upon the substrate material and degree of cleanliness required.

After this 4 step preparation, the substrate is transferred to the spin coater. Exemplary suitable spin coaters include Brewer Science's Cee® Precision spin coaters, Laurell's 650 series spin coaters, Specialty Coating System's G3 spin coaters, or Tokyo Electron's CLEAN TRACK ACT equipment family. Any of the PHPS compositions disclosed above are dispensed onto the substrate in Step 5 and the wafer is spun in Step 6. One of ordinary skill in the art will recognize that Step 5 and Step 6 may be performed sequentially (static mode) or concurrently (dynamic mode). Step 5 is performed using a manual or auto-dispensing device (such as a pipette, syringe, or liquid flow meter). When Steps 5 and 6 are performed concurrently, the initial spin rate is slow (i.e., between approximately 5 rpm to approximately 999 rpm, preferably between approximately 5 rpm to approximately 300 rpm). After all of the PHPS composition is dispensed (i.e., when Step 5 is complete in either static or dynamic mode), the spin rate ranges between approximately 1000 rpm to approximately 4000 rpm. The wafer is spun until a uniform coating is achieved across the substrate, which typically takes between approximately 10 seconds and approximately 3 minutes. Steps 5 and 6 produce a Si-containing film on the wafer. One of ordinary skill in the art will recognize that the required duration of the spin coating process, the acceleration rate, the solvent evaporation rate, etc., are adjustable parameters that require optimization for each new formulation in order to obtain the target film thickness and uniformity (see, e.g., University of Louisville, Micro/Nano Technology Center—Spin Coating Theory, October 2013).

After the Si-containing film is formed, the wafer is pre-baked or soft baked in Step 7 to remove any remaining volatile organic components of the PHPS composition and/or by-products from the spin-coating process. Step 7 may take place in a thermal chamber or on a hot plate at a temperature ranging from approximately 25° C. to approximately 200° C. for a time period ranging from approximately 1 minute to approximately 120 minutes. Exemplary hot plates include Brewer Science's Cee® Model 10 or 11 or Polos' precision bake plates.

In step 8, the substrate is cured to produce the desired dielectric material. 3 non-limiting options are shown in FIG. 2. Any of the 3 options may be performed using an inert or reactive gas. Exemplary inert gases include $N_2$, Ar, He, KR, Xe, etc. The reactive gas may be used to introduce oxygen, nitrogen, or carbon into the film. Exemplary reactive gases that introduce oxygen into the film include oxygen-containing gases, such as $O_2$, $O_3$, air, $H_2O$, $H_2O_2$, etc. Exemplary reactive gases that introduce nitrogen into the film include nitrogen-containing gases, such as $NH_3$; $NR_3$, wherein R is a C1-C4 hydrocarbon; etc. Exemplary reactive gases that introduce carbon into the film include carbon-containing gases, and specifically unsaturated carbon-containing gases, such as alcenes and alcynes (ethylene, acetylene, propylene, etc.).

In Step 8a, the substrate is subject to thermal curing at a temperature ranging from approximately 101° C. to approximately 1,000° C., preferably from approximately 200° C. to approximately 800° C. under an inert or reactive gas. A furnace or rapid thermal processor may be used to perform the thermal curing process. Exemplary furnaces include the ThermoFisher Lindberg/Blue M™ tube furnace, the Thermo Scientific Thermolyne™ benchtop tube furnace or muffle furnace, the Inseto tabletop quartz tube furnace, the NeyTech Vulcan benchtop furnace, the Tokyo Electron TELINDY™ thermal processing equipment, or the ASM International ADVANCE® vertical furnace. Exemplary rapid thermal processors include Solaris 100, ULVAC RTP-6, or Annealsys As-one 100.

Alternatively, in Step 8b, the substrate is subject to UV-curing at a wavelength ranging from approximately 190 nm to approximately 400 nm using a monochromatic or polychromatic source. Exemplary VUV- or UV-curing systems suitable to perform Step 8b include, but are not limited to, the Nordson Coolwaves® 2 UV curing system, the Heraeus Noblelight Light Hammer® 10 product platform, or the Radium Xeradex® lamp.

In another alternative, both the thermal and UV process may be performed at the same temperature and wavelength criteria specified for Steps 8a and 8b. One of ordinary skill in the art will recognize that the choice of curing methods and conditions will be determined by the target silicon-containing film desired.

In another alternative, the thermal curing process may proceed in a stepwise fashion. More particularly, the thermal curing may start at a temperature ranging from approximately 100° C. to approximately 500° C. under an inert or reactive gas for a tem period ranging from approximately 10 to approximately 30 minutes. The temperature may be increased by approximately 50° C. to approximately 150° C. and maintained for an additional 10 to 30 minutes. Additional incremental temperature increases may be used, if necessary. Alternatively, the temperature may be increased using a specified ramp and then maintained at specific temperatures for a short period of time. For example, the wafer may be placed in a room temperature chamber being heated at a ramping rate of approximately 5° C./minute to approximately 40° C./minute, preferably from approximately 10° C./minute to approximately 20° C./minute. Once the temperature reaches the desired heating temperature, for example 400° C., the ramping may be stopped for a specified period of time. The same or a different ramping temperature rate may then be used to increase the chamber temperature to the next desired heating temperature, for example 500° C. This may be repeated for again if a third heating temperature is desired, for example 800° C. In yet another alternative, the curing may use a slow, steady heating ramp without any specified time spent at any specific temperature (e.g., approximately 0.5/minute to approximately 3° C./minute). Applicants believe that any of these thermal curing steps may help to reduce formation of cracks and voids in the resulting film.

Additionally, as shown in Example 16, shrinkage may be further reduced by controlling the $O_2$:$H_2O$ ratio when an oxygen-containing atmosphere is required. Preferably, the $O_2$:$H_2O$ ratio ranges from approximately 6:1 to approximately 2.5:1.

In Step 9, the cured film is characterized using standard analytic tools. Exemplary tools include, but are not limited to, ellipsometers, x-ray photoelectron spectroscopy, atomic force microscopy, x-ray fluorescence, fourier-transform infrared spectroscopy, scanning electron microscopy, secondary ion mass spectrometry (SIMS), Rutherford backscattering spectrometry (RBS), profilometer for stress analysis, or combination thereof.

The silicon-containing films resulting from the processes discussed above may include $SiO_2$; SiC; SiN; SiON; SiOC; SiONC; SiBN; SiBCN; SiCN; SiMCO, in which M is selected from Zr, Hf, Ti, Nb, V, Ta, Al, Ge, depending of course on the oxidation state of M. One of ordinary skill in the art will recognize that by judicial selection of the appropriate PHPS composition and co-reactants, the desired film composition may be obtained.

As shown in the examples that follow, spin-on deposition using the disclosed PHPS compositions produces SiON films having a transmittance between approximately 80% and approximately 100% in the 350-800 nm wavelength range. These results indicate that the PHPS coated substrates are as transparent as an uncoated glass substrate (solid line) and are therefore excellent for optical applications.

Spin-on deposition using the disclosed PHPS compositions also was capable of producing silicon oxide films having a refractive index of approximately 1.45. The wet etch rate for films hardbaked at 800° C. was 90 A/min as compared to 60 A/min for thermal oxide hardbaked at 1100° C. The silicon oxide films also exhibited excellent gap-fill in a trench having an aspect ratio of 9:1.

Post Deposition Treatment

Whether formed in-situ, vapor deposited, or coated, the resulting Si-containing film may be subject to further processing, such as thermal annealing, furnace-annealing, rapid thermal annealing, UV or e-beam curing, and/or plasma gas exposure to further densify and dehydrogenate the resulting film. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere (e.g., Ar, He), a H-containing atmosphere (e.g., $NH_3$), a N-containing atmosphere (e.g., $N_2$), or combinations thereof, to form a SiN-containing layer or a O-containing atmosphere (e.g., $O_2$, $O_3$) to form a silica layer. Most preferably, the temperature is 600° C. for less than 3600 seconds. Even more preferably, the temperature is less than 400° C. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially UV-curing, has been found effective to enhance the connectivity and cross linking of the film, and to reduce the H content of the film when the film is a SiN containing film. Typically, a combination of thermal annealing to a temperature ranging between approximately 50° C. to approximately 900° C. (preferably about 100° C.–300° C.) and UV curing is used to obtain the film with the highest density.

Alternative Applications

The obtained PHPS may also be used in the following fashions:

The solid PHPS compositions may be used for sintering, or as fillers to other liquid formulations.

The SiN containing material obtained directly from the synthesis or by further processing of a PHPS formulation (coating, sintering, casting . . . ) may further be fired at a temperature up to 1850° C. for conversion to silicon nitride having a very high hardness, strength, fracture toughness, wear resistance, and creep resistance.

The liquid or solid PHPS may be used as a burning rate catalyst in rocket fuel. See, e.g., U.S. Pat. No. 3,137,599 to Alsgaard and U.S. Pat. No. 4,412,874 to Huskins et al. The PHPS compositions having low $SiH_2$:$SiH_3$ ratios have a high specific energy. Another advantage of the usage of such PHPS as rocket fuel is its intrinsic safety owing to low reactivity in air, compared to the perhydridopolysilanes, organosilanes or aminosilanes (including TSA itself) compositions that have been proposed.

The PHPS (MW>450) liquid formulations may be used to form a solid by locally heating or exposing to radiations in order to locally harden and densify the PHPS into a hard and inert solid. Such a formulation may for instance be used for 3D printing of silicon nitride. In this case, the PHPS may contain a catalyst that is only activated at the heating T or upon the exposure to radiation.

pre-ceramic material to yield silicon nitride upon subjecting the PHPS to high temperature, either for fiber spinning, infiltration, coatings. For example, the PHPS composition may be used to form barrier coatings on steel or as lightweight thermostructural materials for use in the aerospace and passenger, military and cargo vehicle industries.

protection coatings on glass by conversion of the PHPS to a silica film

EXAMPLES

The following examples illustrate experiments performed in conjunction with the disclosure herein. The examples are not intended to be all inclusive and are not intended to limit the scope of disclosure described herein.

Example 1: Synthesis of Perhydropolysilazane (Solvent Free)

Trisilylamine [$N(SiH_3)_3$ or TSA] (1.2 g, 11.2 mmol) was mixed with tris(pentafluorophenyl)borane (10 mg, 0.02 mmol) in a glass vial under nitrogen atmosphere. Vigorous gas evolution was observed and the clear colorless liquid turned into colorless crystalline solid (0.5 g) within a few minutes. Applicants believe that the TSA polymerizes linearly and/or dendritically and releases silane gas:

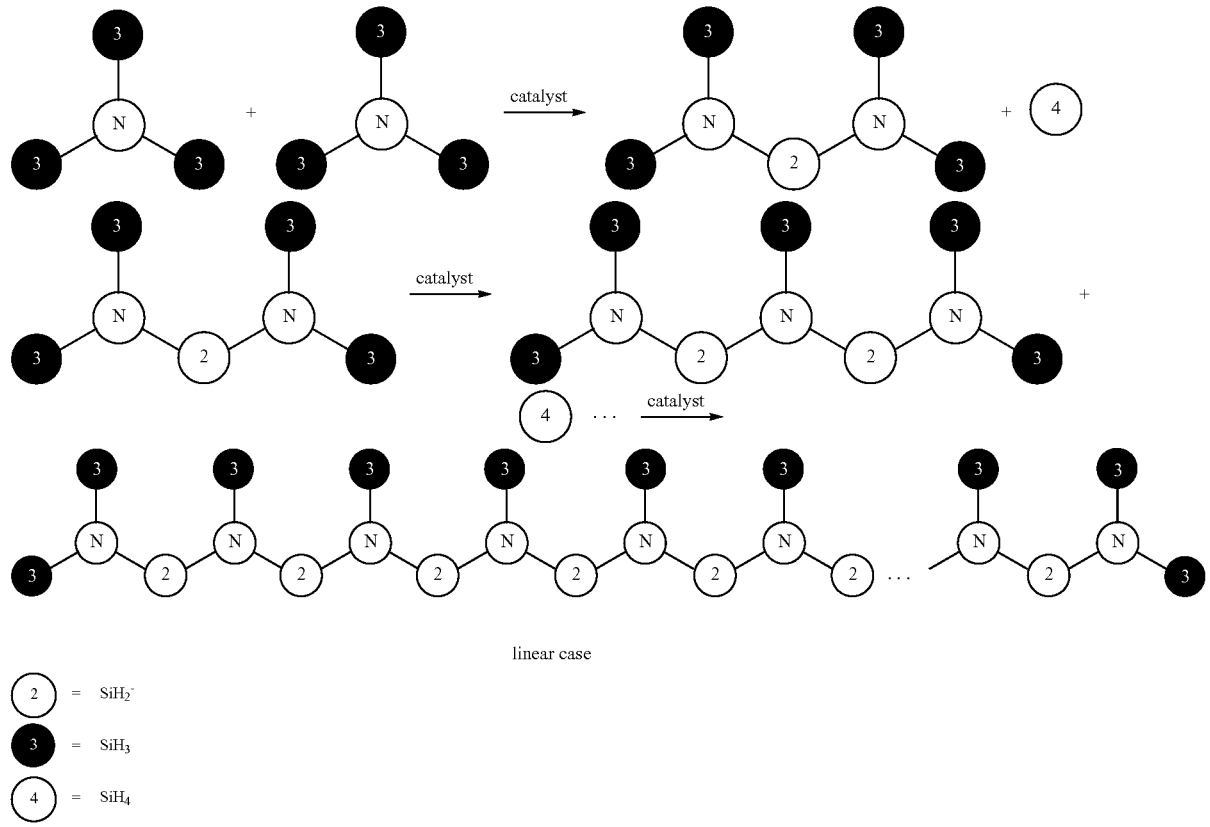

linear case $\bigcirc_2$ = $SiH_2^-$

●$_3$ = $SiH_3$ $\bigcirc_4$ = $SiH_4$

Figure 3:
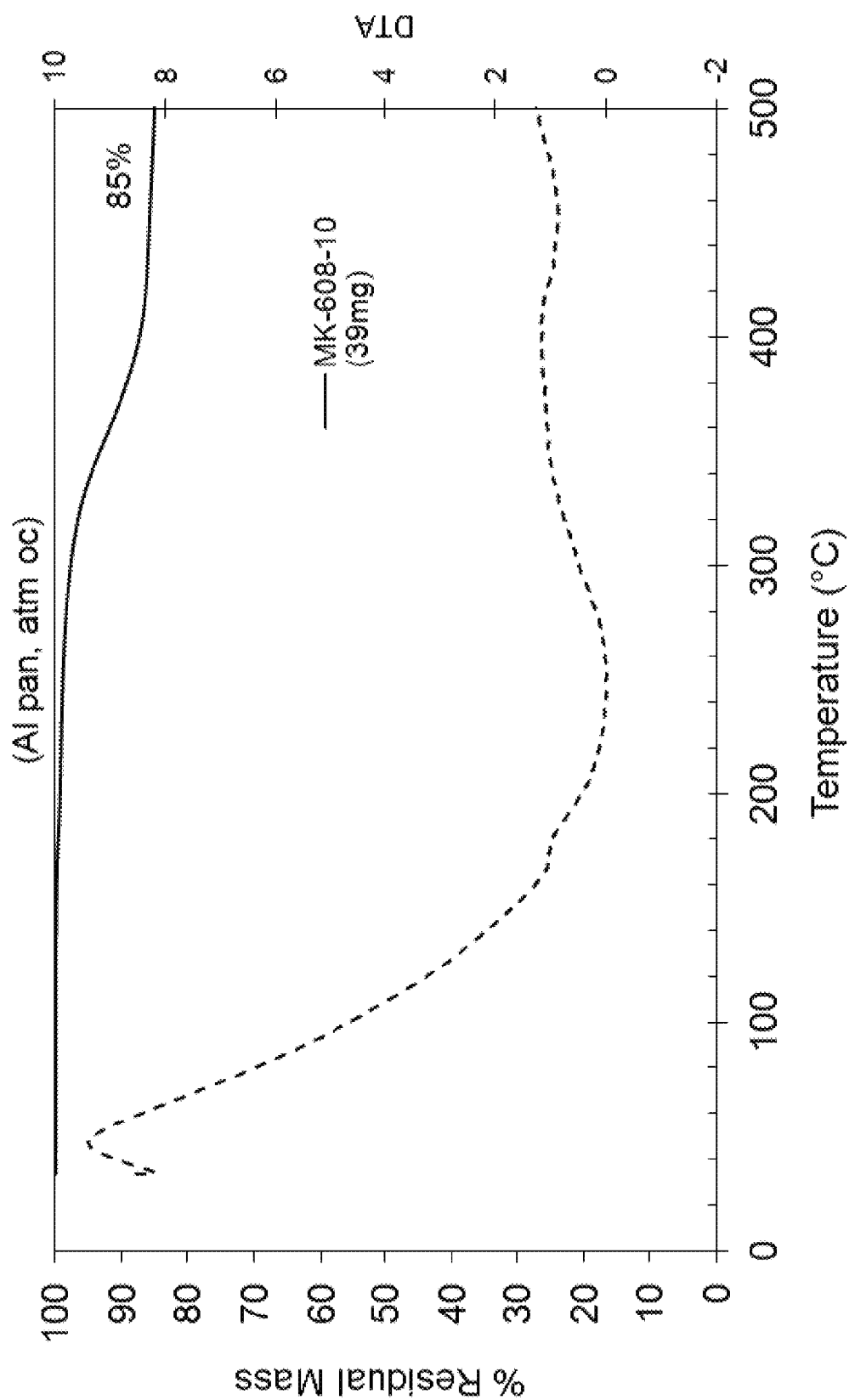
FIG. 3 is a ThermoGravimetric Analysis (TGA)/Differential Thermal Analysis (DTA) graph illustrating the percentage of weight loss upon temperature increase (TGA—solid line) and differential temperature with increasing temperature (DTA—dotted line) of the perhydropolysilazane of Example 1.

The resulting solid was washed with tetrahydrofuran (THF) and dried under vacuum. The solid is not soluble in THF, toluene or in a hydrocarbon solvent, like pentane. The solid was analyzed by Fourier Transform InfraRed (FTIR) spectroscopy and ThermoGravimetric (TGA)/Differential Thermal Analysis (DTA). The TGA/DTA results are shown in FIG. 3. As can be seen, the solid exhibited very little weight loss with increasing temperature (approximately 15% by weight up to 500° C.). Applicants believe that the low amount of TGA weight loss confirms the proposed reaction mechanism by demonstrating that the resulting product contains few to no N—H bonds. As a result, this product will have a longer shelf life and less silicon nitride stress.

Example 2: Synthesis of Bis(Disilylamino)Silane (BDSASi) (Solvent Free)

In an argon atmosphere glovebox, TSA (2.03 g, 18.9 mmol) was added to a glass scintillation vial equipped with a magnetic stir bar. Solid palladium chloride powder (0.43 g, 1.84 mmol) was slowly added to the stirred TSA. The red palladium material was observed to turn black upon nearing the vial of TSA. The colorless liquid TSA changed to a black suspension with vigorous bubbling, indicating the formation of a gaseous product.

The reaction was stirred at room temperature (~23° C.) for 3 hours at which time the bubbling had slowed. An aliquot of the reaction mixture was analyzed by GCMS and revealed that ~70% TSA remains with the formation of ~21% bis (disilylamino)silane (BDSASi) along with some trace of other oligomers. The reaction was stirred for an additional 13 hours at room temperature at which time no more bubbling were observed. A new aliquot was analyzed by GCMS, the results of which are summarized in Table 1:

TABLE 1

| RT (min.) | ID | Peak Area (%) |
|---|---|---|
| 1.3 | TSA | 35.7 |
| 2.7 | BDSASi | 49.7 |
| 5.1 | Cl-BDSAS | 1.6 |
| 5.5 | No ID | 0.7 |
| 8.7 | No ID | 1.8 |
| 9.7 | No ID | 0.8 |
| 10.7 | 3DSAS | 6.0 |
| 13.3 | No ID | 0.9 |
| 14.1 | 4DSAS-A | 1.2 |
| 15.5 | 4DSAS-B | 1.6 |

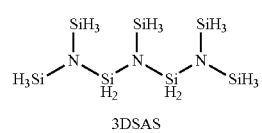

3DSAS

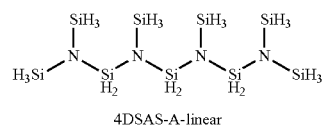

4DSAS-A-linear

TABLE 1-continued

| RT (min.) | ID | Peak Area (%) |
|---|---|---|
|  | 4DSAS-B-branched |  |

Applicants believe that 4DSAS-A is the linear isomer and 4DSAS-B is the branched isomer based on prior art references that describes branched isomers being retained longer in a GC column.

As demonstrated, chloride containing catalysts may result in some chloride containing PHPS reaction products.

Example 3: Synthesis of Perhydropolysilazane in Pentane

Figure 4:
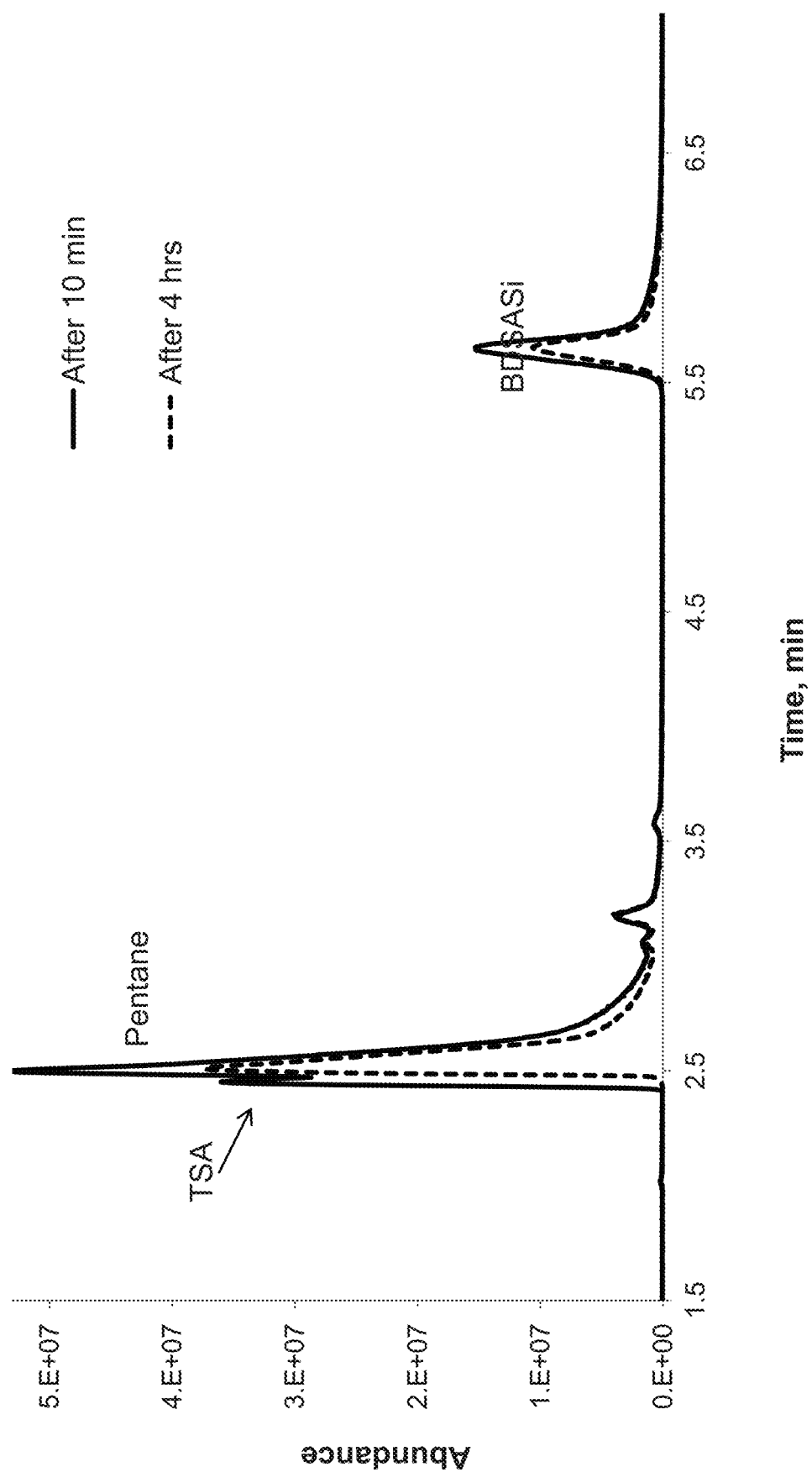
FIG. 4 is a comparative Gas Chromatograph (GC) spectrum showing the TSA reactant, pentane solvent, and bis (disilylamino)silane reaction intermediate [$(SiH_3)_2$—N—$SiH_2$—N—$(SiH_3)_2$ or BDSASI] peaks after 10 minutes and 4 hours of reaction time in Example 3.

TSA (5 g, 46.6 mmol) was mixed in pentane (6.3 g, 10 mL) and tris(pentafluorophenyl)borane (25 mg, 0.05 mmol) was added in a glass vial under nitrogen atmosphere. Mild gas evolution was observed and the clear colorless liquid turned cloudy within a few minutes. The progress of the reaction was monitored by Gas Chromatography (GC) analysis. FIG. 4 is a comparative GC graph showing the TSA reactant, pentane solvent, and bis(disilylamino)silane reaction intermediate (($SiH_3$)$_2$—N—$SiH_2$—N—($SiH_3$)$_2$ or BDSASI) peaks after 10 minutes and 4 hours of reaction time. As shown in FIG. 4, the TSA reactant was consumed in 4 hours and the amount of BDSASI reaction intermediate also decreases with time.

Figure 5:
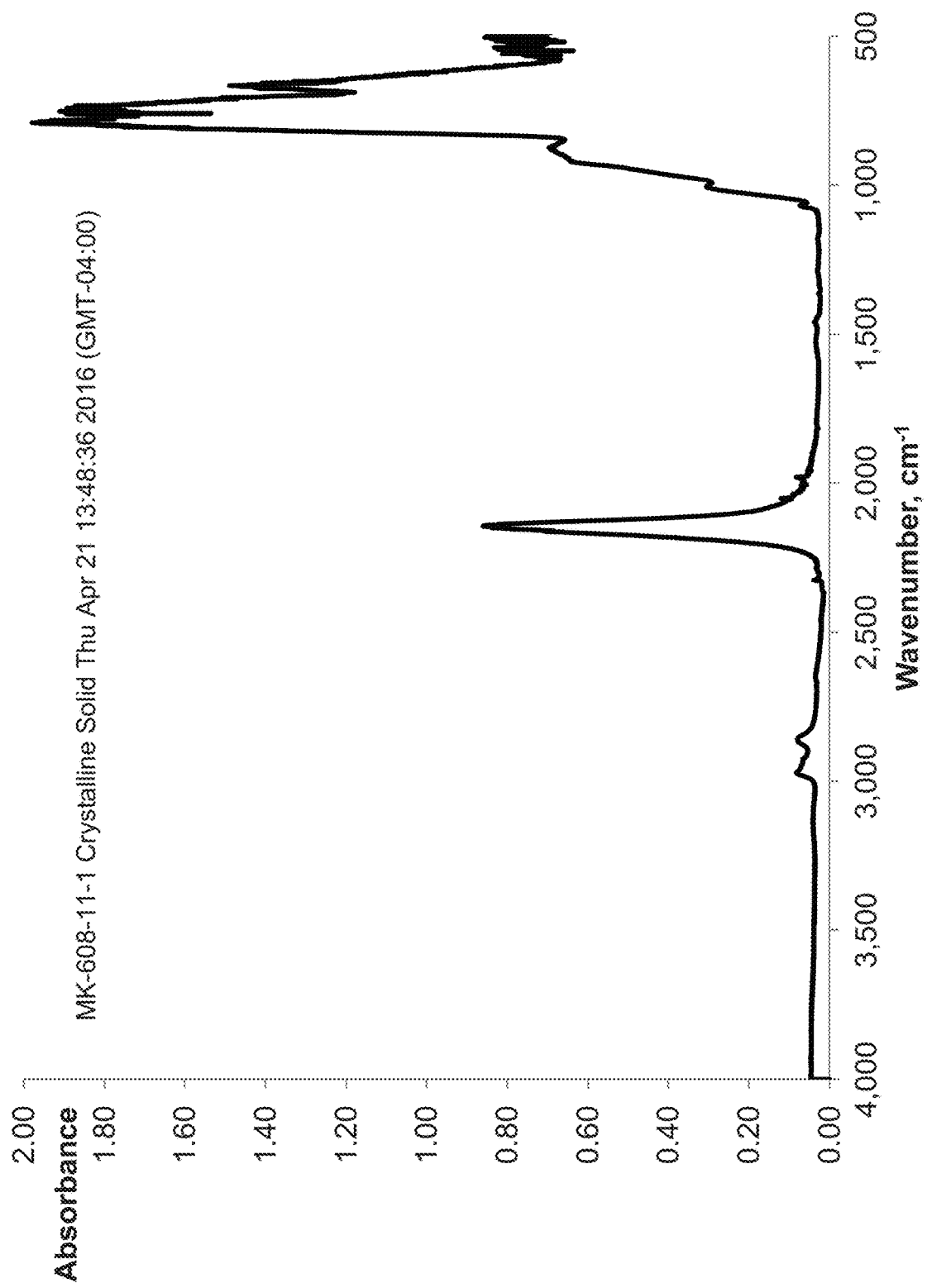
FIG. 5 is a Fourier Transform InfraRed (FTIR) spectrum of the colorless crystalline solid produced in Example 3.
Figure 6:
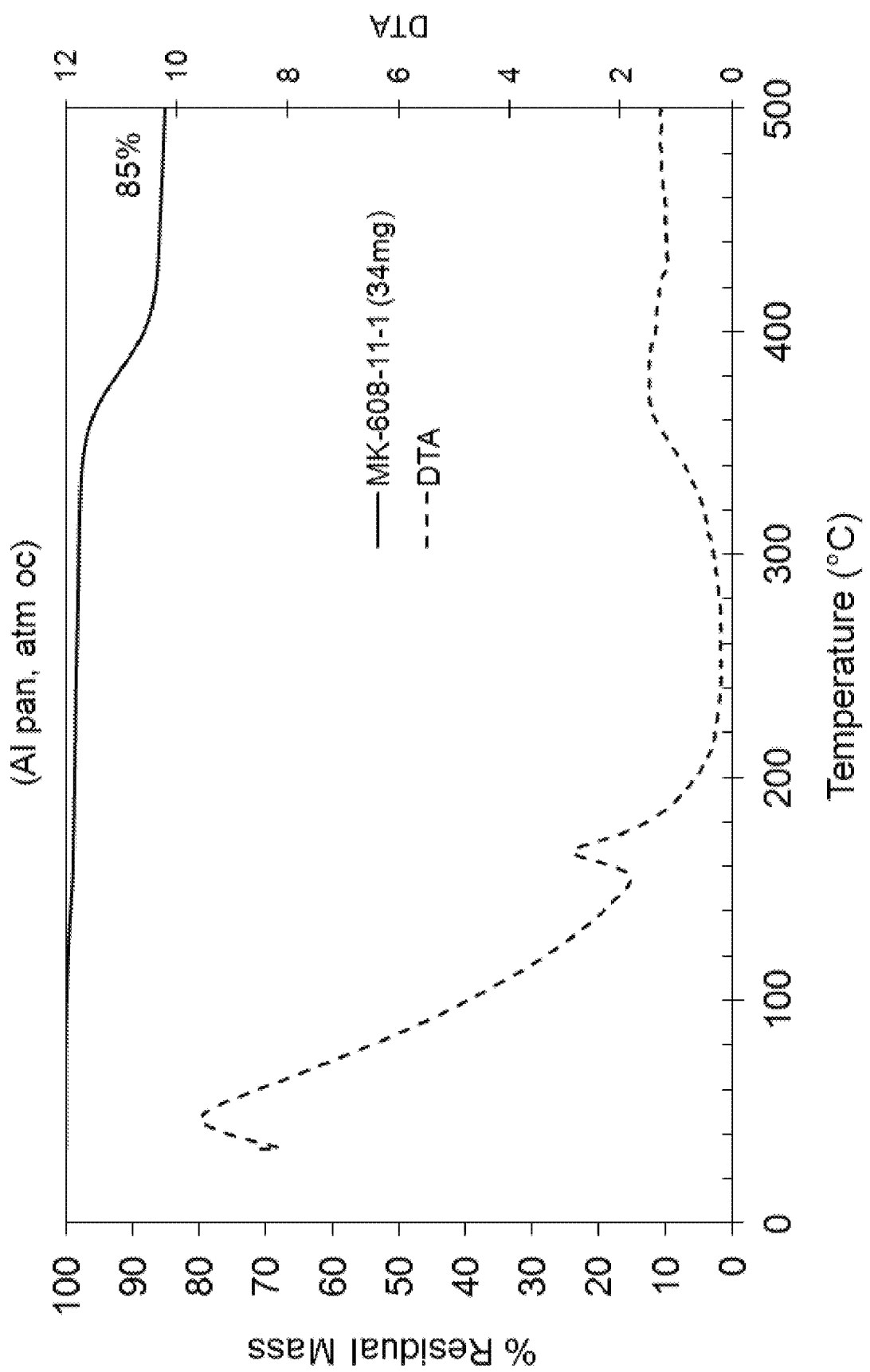
FIG. 6 is a TGA/DTA graph illustrating the percentage of weight loss upon temperature increase (TGA—solid line) and differential temperature with increasing temperature (DTA—dotted line) of the perhydropolysilazane crystalline solid of Example 3.

The cloudy solution was allowed to stand overnight at room temperature. At this point, a gel-like solid was formed. The solvent was removed under vacuum resulting in a colorless crystalline solid (2.6 g). The solid was analyzed by FTIR and TGA/DTA. The FTIR results are shown in FIG. 5. One of ordinary skill in the art will recognize that the resulting solid exhibits no NH spectra (typically visible in the 3300-3500 range). The TGA/DTA results are shown in FIG. 6. As can be seen once again, the solid exhibited very little weight loss with increasing temperature (approximately 15% by weight up to 500° C.). As a result, optimization of this reaction may provide a process for in situ formation of silicon nitride films having minimal shrinkage upon further processing.

Example 4: Synthesis of Perhydropolysilazane in Pentane by Using BDSASI

BDSASI (5 g, 27.4 mmol) was mixed in pentane (6.3 g, 10 mL) and tris(pentafluorophenyl)borane (25 mg, 0.05 mmol) was added in a glass vial under nitrogen atmosphere. No visible gas evolution was observed and the clear colorless liquid turned cloudy within a few minutes. The progress of the reaction was monitored by GC analysis. Most of the BDSASI reactant was consumed after 5 days at room temperature.

This example demonstrates that the reaction using the BDSASi reactant occurs much slower than with the TSA reactant and exhibits very slow gas evolution.

Figure 7:
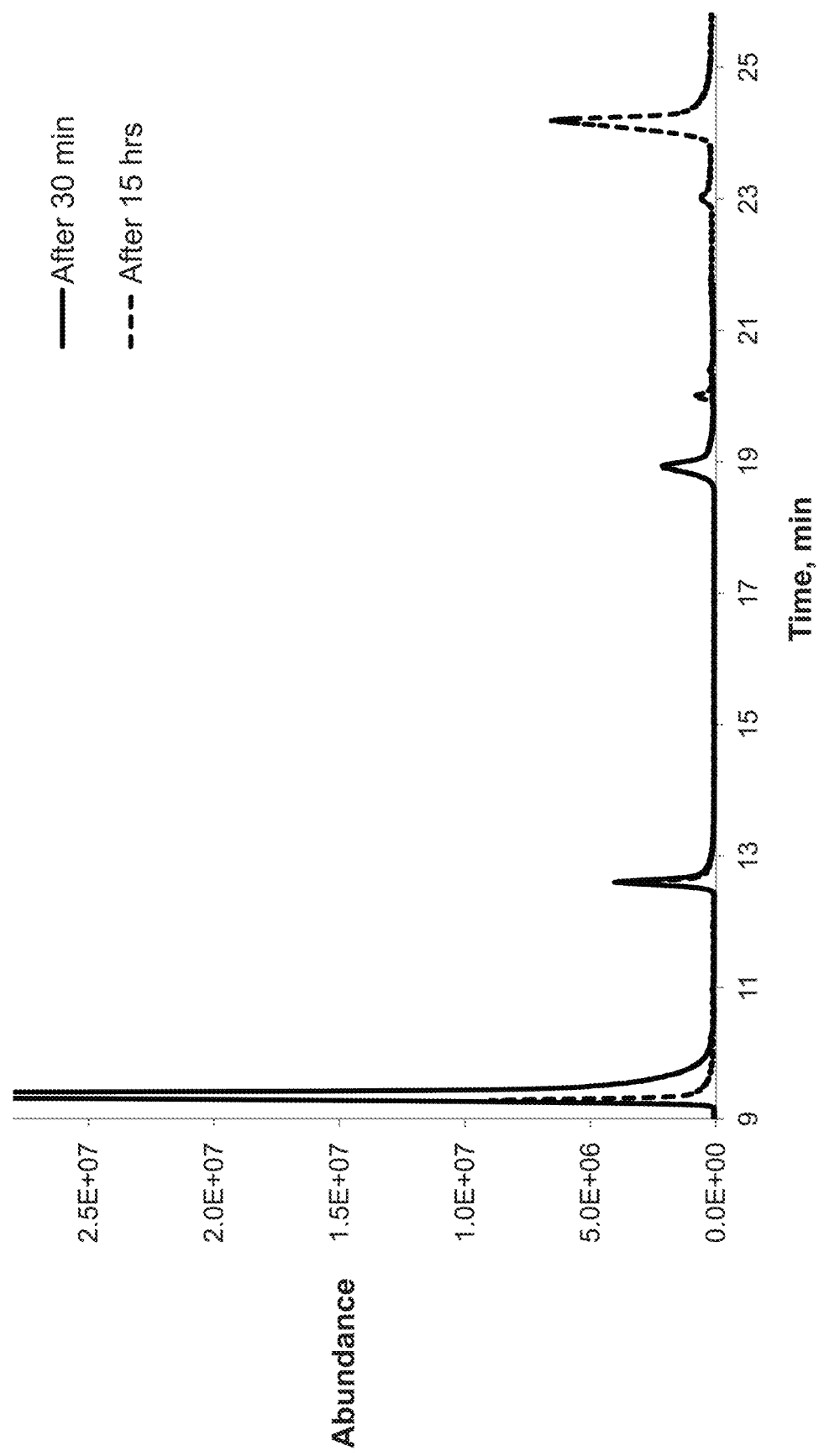
FIG. 7 is a comparative GC spectrum showing the $(H_3Si)_2N(SiH_2NiPr_2)$ reactant and heavy oligomer reaction product peaks after 30 minutes and 15 hours of reaction time in Example 5.

Example 5: Synthesis of Organopolysilazane ($H_3Si$)$_2$N($SiH_2NiPr_2$)(3.3 g, 16 mmol) was mixed with tris(pentafluorophenyl) borane (20 mg, 0.04 mmol) in a glass vial under nitrogen atmosphere. Slow gas evolution was observed and the clear colorless liquid turned into colorless viscous oil after standing at room temperature for 18 hours. GC analysis of the resulting oil showed some unreacted ($H_3Si$)$_2$N($SiH_2NiPr_2$) and several peaks corresponding to heavy oligomers. FIG. 7 is a comparative GC spectrum showing the ($H_3Si$)$_2$N($SiH_2NiPr_2$) reactant and heavy oligomer reaction product peaks after 30 minutes and 18 hours of reaction time. As shown in FIG. 7, the amount of ($H_3Si$)$_2$N($SiH_2NiPr_2$) reactant decreases from the 30 minute peak to the 18 hour peak.

Figure 8:
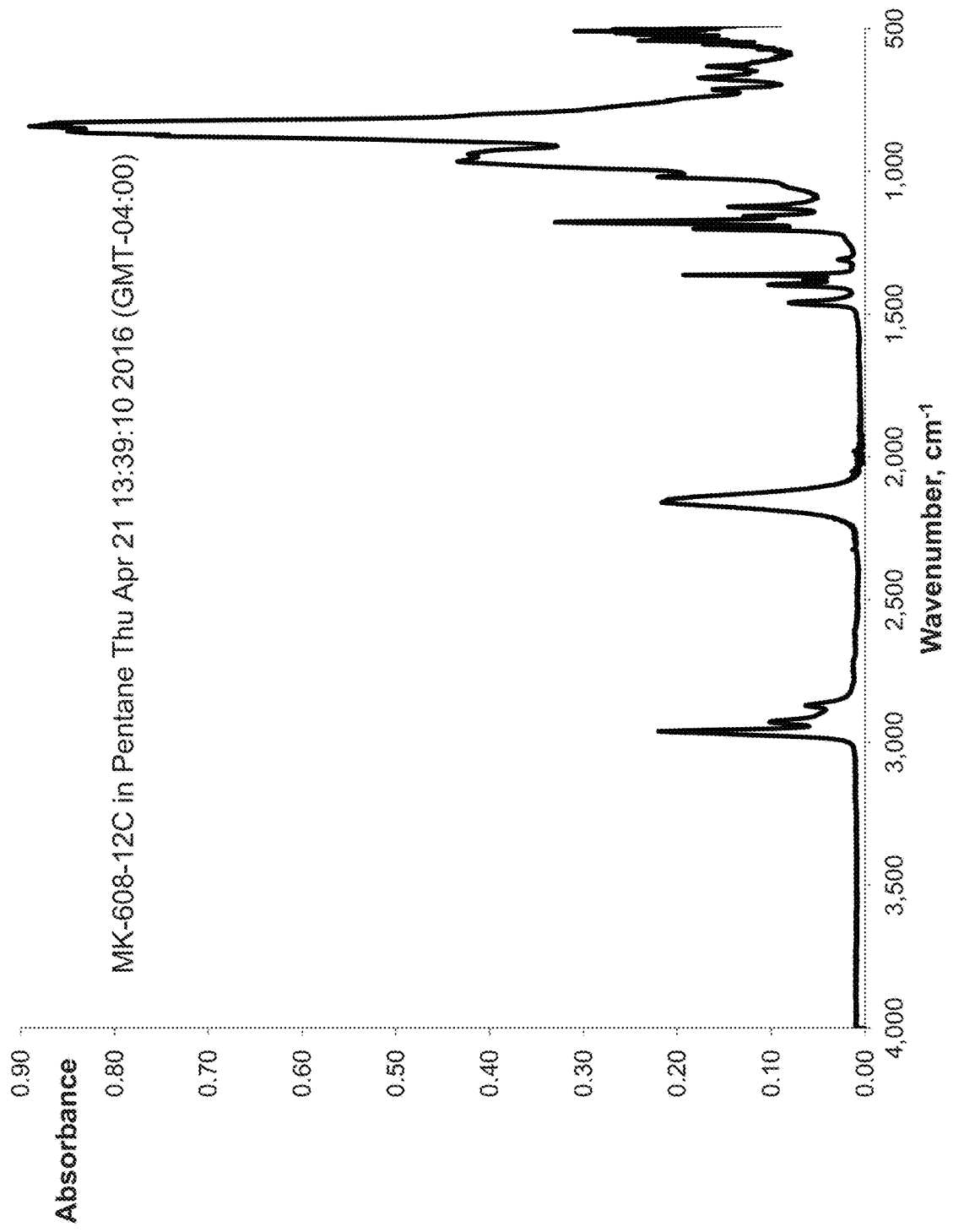
FIG. 8 is a FTIR spectrum of the viscous oil produced in Example 5.

The ($H_3Si$)$_2$N($SiH_2NiPr_2$) reactant was consumed after 3 days at room temperature. Applicants believe that the ($H_3Si$)$_2$ N($SiH_2NiPr_2$) reactant undergoes the same desilylative reaction mechanism as the TSA reactant of Examples 1-3. The resulting viscous oil was analyzed by FTIR, TGA/DTA and Gel Permeation Chromatography (GPC). The FTIR results are shown in FIG. 8. One of ordinary skill in the art will recognize that the resulting oil exhibits little to no NH spectra (typically visible in the 3300-3500 range). The resulting product does exhibit the alkyl C—H stretch, likely from the iPr ligands, at the 2950-2850 range.

Figure 9:
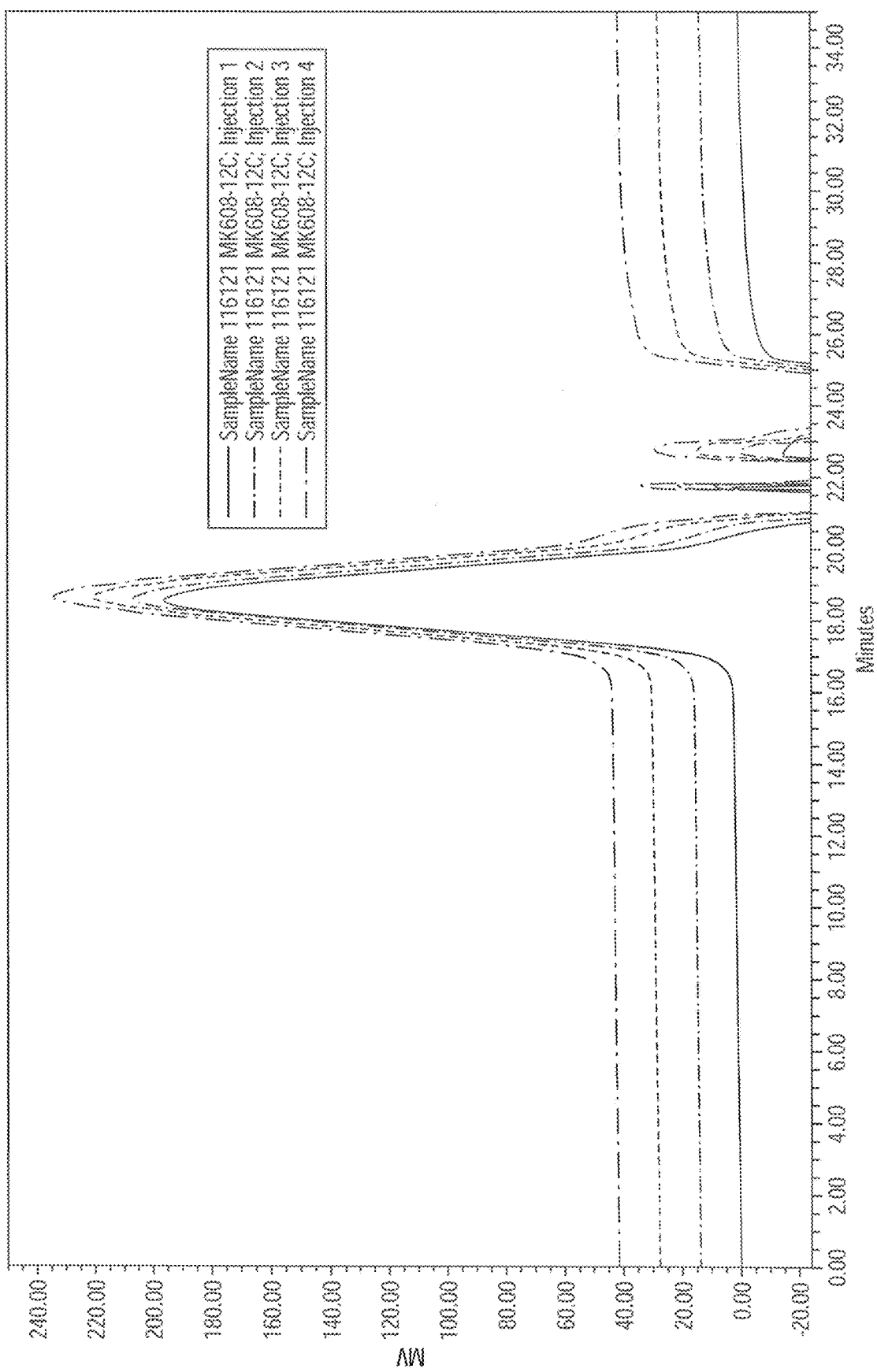
FIG. 9 is a Gel Permeation Chromatograph (GPC) spectrum of the viscous oil produced in Example 5.

The Gel Permeation Chromatography (GPC) was conducted based on a polystyrene standard using a refractive index detector. The GPC results are provided in FIG. 9. The reaction produced a PHPS product having a $M_n$ of 962 Daltons and $M_w$ of 1315 Dalton. The resulting 1.4 polydispersity index (PDI) demonstrates a narrow oligomer size distribution.

Figure 10:
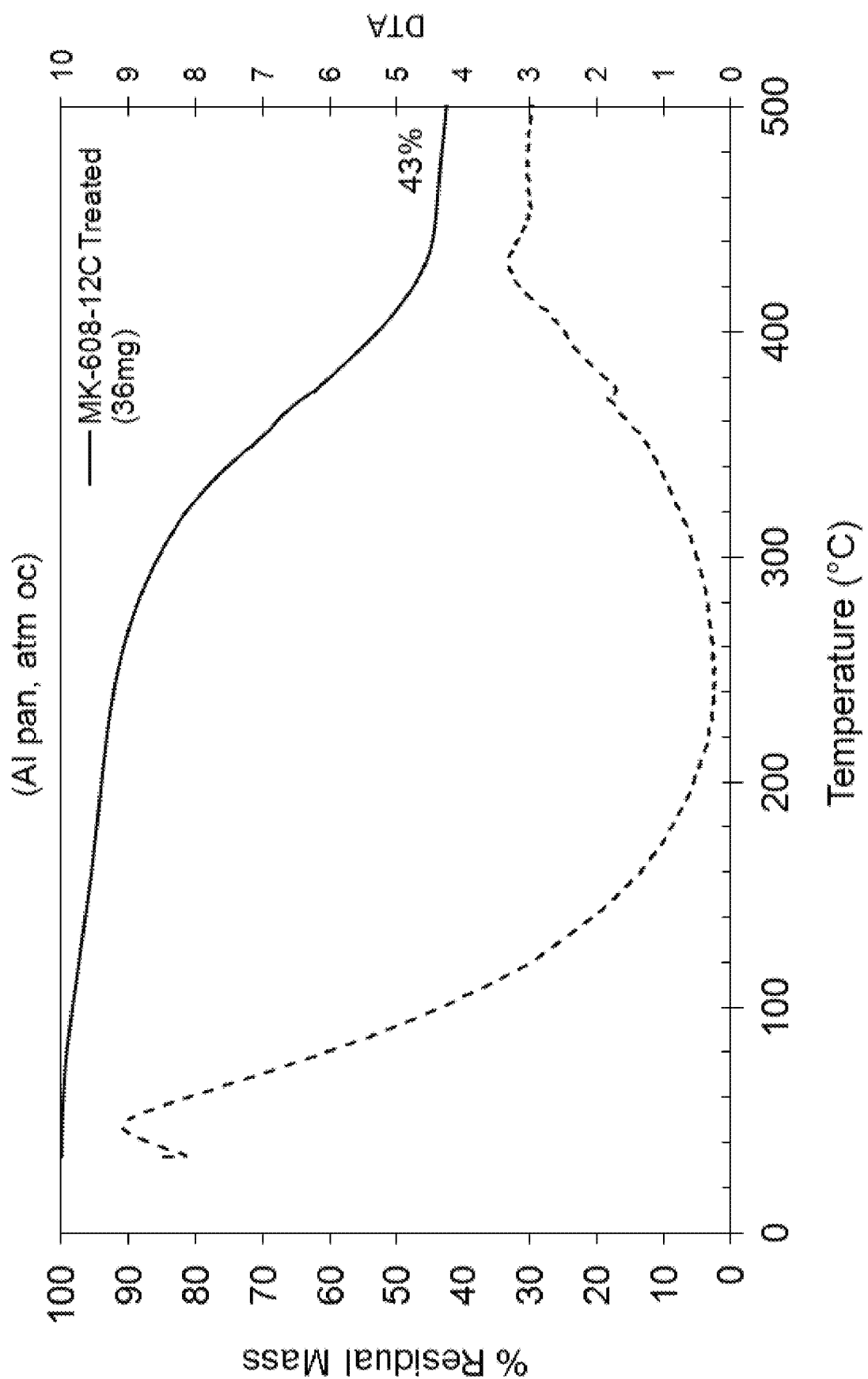
FIG. 10 is a TGA/DTA graph illustrating the percentage of weight loss upon temperature increase (TGA—solid line) and differential temperature with increasing temperature (DTA—dotted line) of the perhydropolysilazane viscous oil of Example 5.

The TGA/DTA results are shown in FIG. 10. As can be seen, the oil exhibited approximately 43% by weight loss with increasing temperature up to 500° C. The molecular weight of the PHPS reaction product is too small to exhibit the desired low mass loss TGA of Examples 1 and 3 and why the preferred $M_w$ ranges from 2,000 to 50,000 Dalton, preferably from 4,000 to 30,000 Dalton.

Example 6: Quenching Perhydropolysilazane Reaction

TSA (30 g, 0.28 mol) was added to a suspension of Pentane (266 mL) and catalyst (B(CeFs)$_3$) (1.4 mmol, 0.7 g). The reaction mixture was allowed to stir for 0.5 hour at room temperature. The reactor was then cooled to −78° C. by using a dry-ice/IPA bath and volatiles (mainly silane) were cryotrapped into a stainless steel lecture bottle (sslb) at −196° C. The reaction was then quenched by adding 1 mL Triethylamine as a solution in pentane (5 mL). The reactor was opened under an inert atmosphere and the cloudy mixture was subjected to distillation. After removing volatiles, a clear, colorless viscous oil was obtained (16.5 g). The viscous oil was subjected to GC, GPC, NMR, and FTIR analysis.

Figure 11:
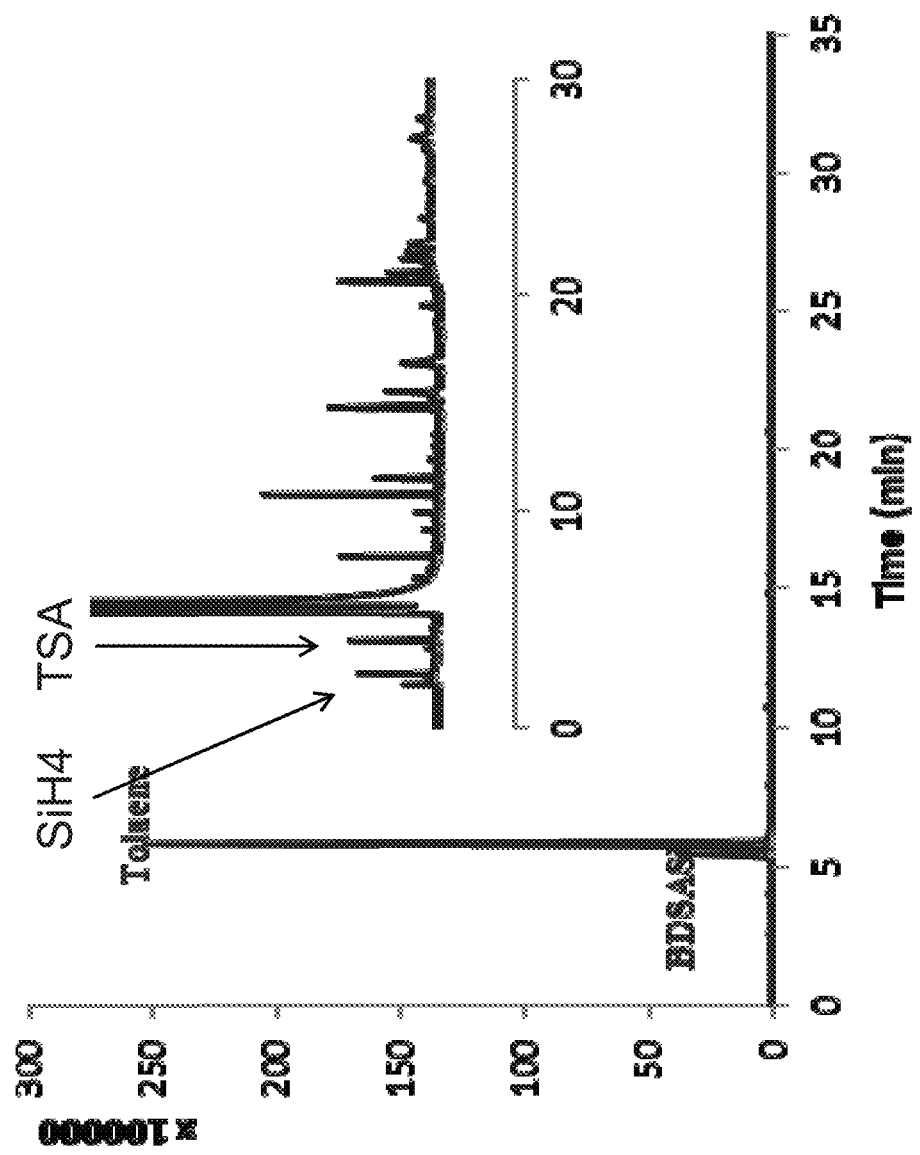
FIG. 11 is a GC spectrum of the perhydropolysilazane oil of Example 6.

FIG. 11 is a GC spectrum of the oil diluted in toluene after removal of pentane and volatiles (1 g oil was diluted with 1 mL toluene). Traces of silane were observed (inset).

Figure 12:
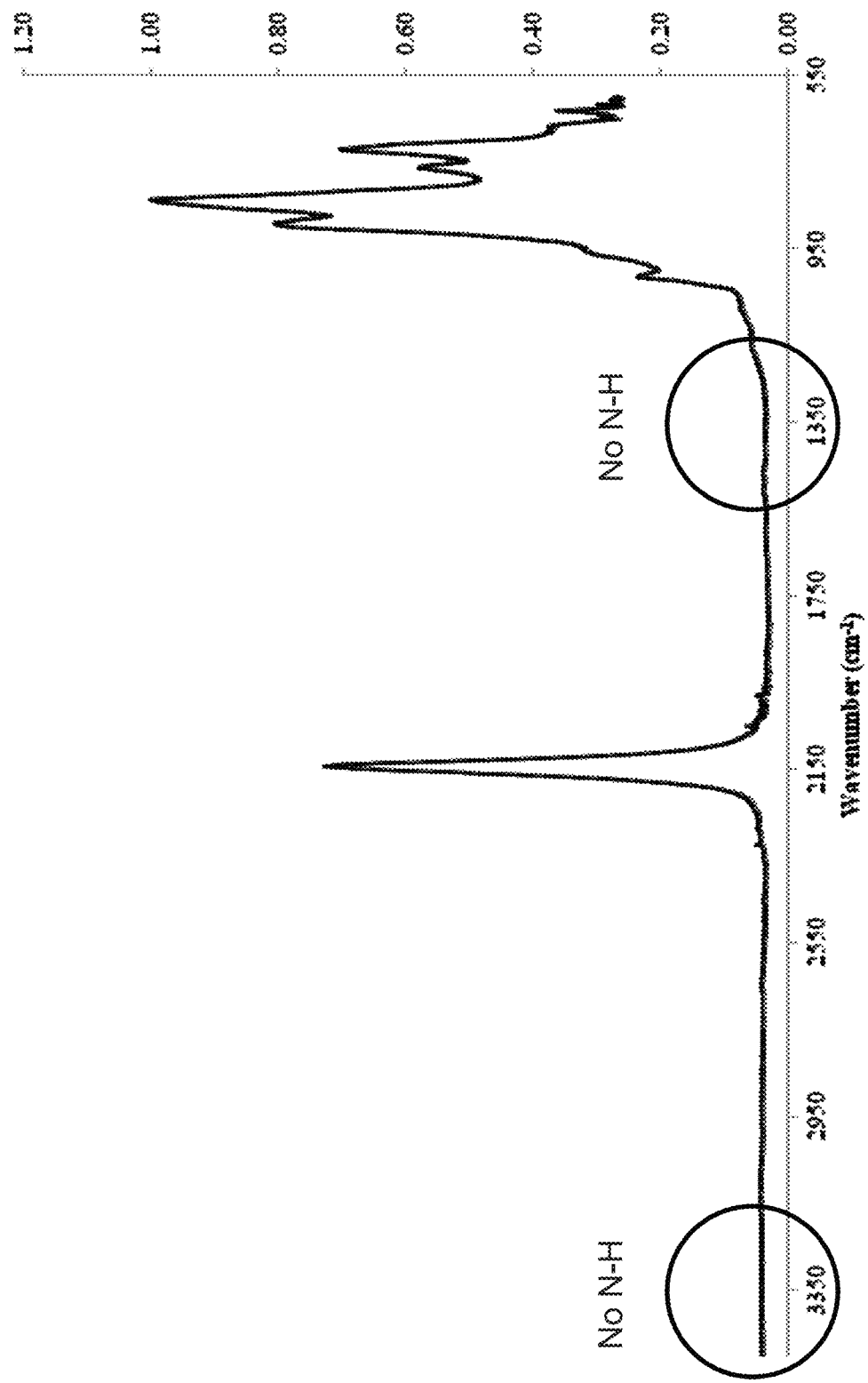
FIG. 12 is a FTIR spectrum of the oil produced in Example 6 after volatiles were removed.

FIG. 12 is FTIR spectrum of the oil after volatiles were removed.

The calculated $SiH_2$:$SiH_3$ ratio was 0.63, indicating more $SiH_3$ than $SiH_2$. This means that little intramolecular coupling occurred during the reaction.

The Si:N ratio is included in FIG. 1 and calculated to be 2.08 based on $M_n$.

The GPC results indicate a $M_n$ of 950 and a $M_w$ of 1310. The resulting 1.4 polydispersity index (PDI) demonstrates a narrow oligomer size distribution.

Example 7: Quenching Perhydropolysilazane Reaction

TSA (55 g, 0.51 mol) was added to a suspension of Pentane (266 mL) and catalyst (B(CBFs)$_3$)(1.2 mmol, 0.7 g). The reaction mixture was allowed to stir for 40 minutes at room temperature. The reactor was then cooled to −78° C. by using a dry-ice/IPA bath and volatiles (mainly silane) were cryotrapped into a stainless steel lecture bottle (sslb) at −196° C. The reactor was then opened under an inert atmosphere and 2 mL TEA added to the clear solution to quench the reaction. The resulting cloudy mixture was filtered. The colorless cloudy pentane solution was then subjected to distillation. After removing volatiles, a cloudy viscous oil was obtained (30.5 g). The oil was subjected to GPC, FTIR and TGA and NMR analysis.

Figure 13:
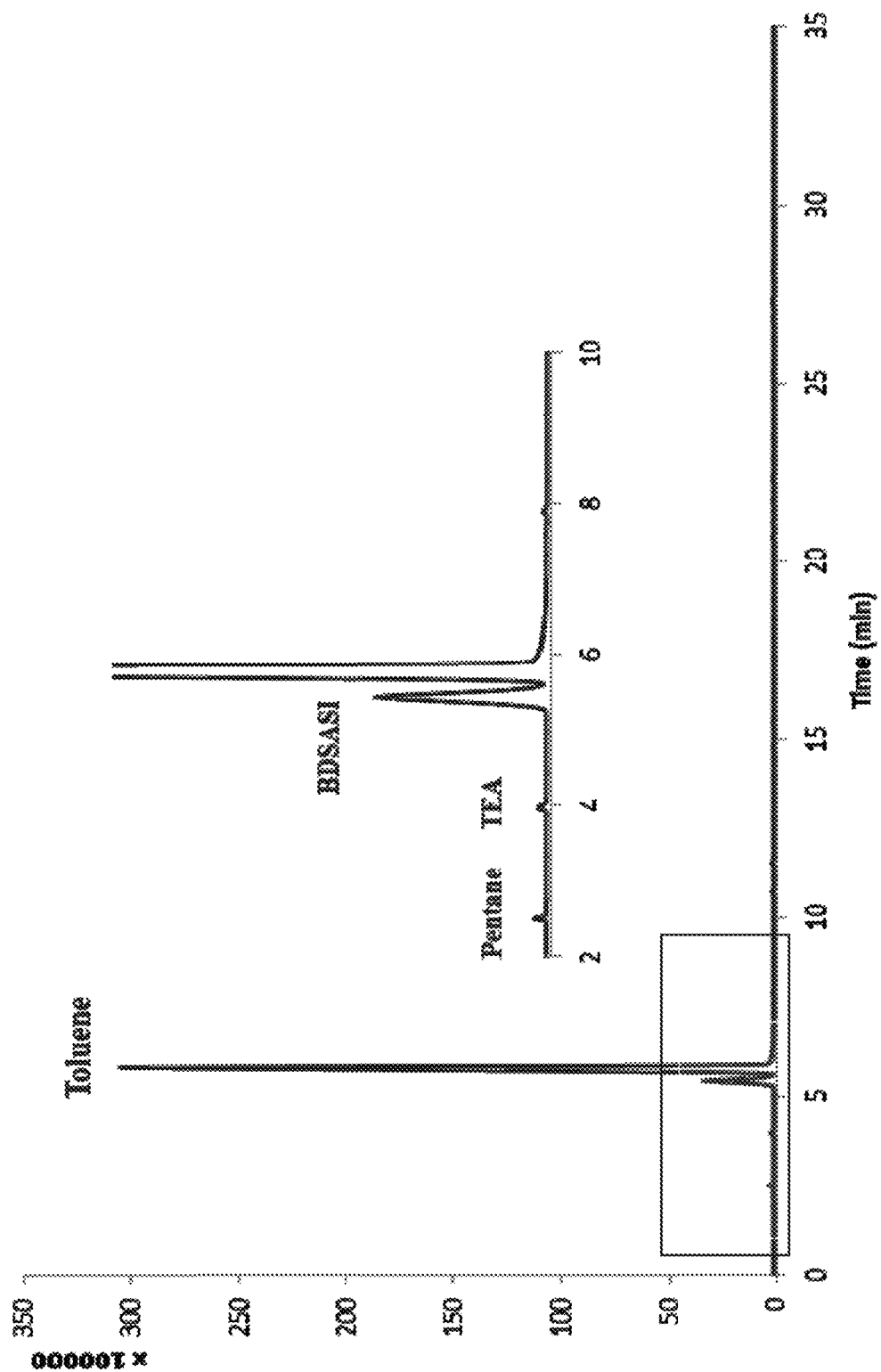
FIG. 13 is a GC spectrum of the perhydropolysilazane oil of Example 7.

FIG. 13 is a GC spectrum of the oil diluted in toluene. Traces of pentane, triethylamine (TEA), and BDSASI were observed (inset).

Figure 14:
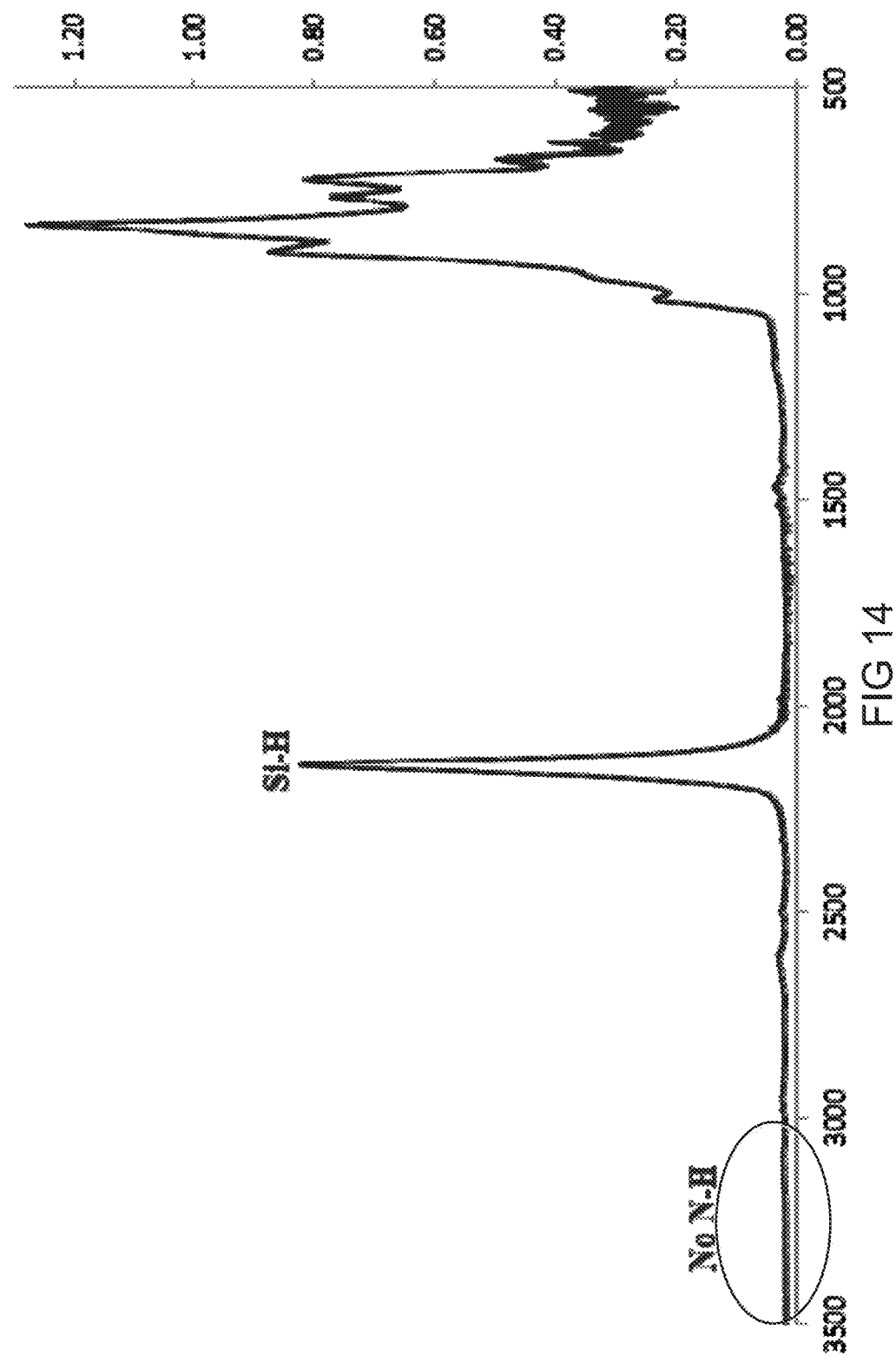
FIG. 14 is a FTIR spectrum of the oil produced in Example 7.

FIG. 14 is FTIR spectrum of the oil after volatiles were removed.

The NMR indicated a calculated $SiH_2:SiH_3$ ratio of 1.19, indicating more $SiH_2$ than $SiH_3$. This demonstrates that an extra 10 minute reaction time provides sufficient time for intramolecular coupling to begin.

The Si:N ratio is on FIG. 1 and calculated to be 1.99 based on $M_n$.

The GPC results indicate a $M_n$ of 1446 and a $M_w$ of 2532. The resulting 1.8 polydispersity index (PDI) demonstrates an oligomer size distribution larger than that of Example 6.

Viscosity <50 cps

Example 8: Quenching Perhydropolysilazane Reaction

TSA (30 g, 0.28 mol) was added to a suspension of Pentane (266 mL) and catalyst (B(C$_6$F$_5$)$_3$ (1.2 mmol, 0.7 g). The reaction mixture was allowed to stir for 1.5 hours at room temperature. The reactor was then cooled to −78° C. by using a dry-ice/IPA bath and volatiles (mainly silane) were cryotrapped into a stainless steel lecture bottle (sslb) at −196° C. The reactor was then opened under an inert atmosphere and 2 mL TEA added to the clear solution to quench the reaction. The resulting cloudy mixture was filtered over a filter paper to obtain a white solid (0.25 g). The colorless clear pentane solution was then subjected to distillation. After removing volatiles, a clear, colorless viscous oil was obtained (18.5 g). The solid was analyzed by FTIR to confirm that the solid is the adduct of the catalyst and inhibitor. The oil PHPS reaction product was subjected to GC, GPC, FTIR and TGA analysis.

Figure 15:
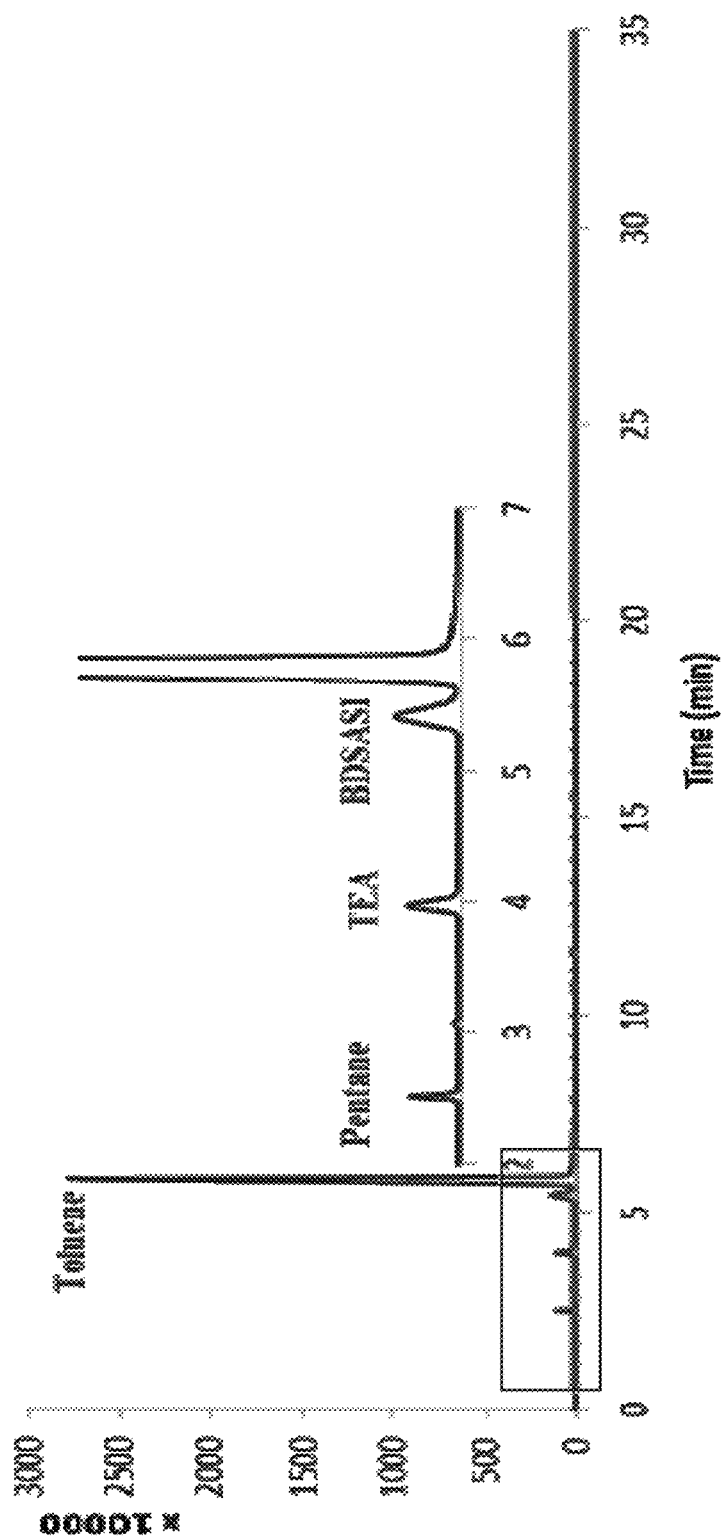
FIG. 15 is a GC spectrum of the perhydropolysilazane oil of Example 8.

FIG. 15 is a GC spectrum of the oil diluted in toluene. Traces of pentane, triethylamine (TEA), and BDSASI were observed (inset).

Figure 16:
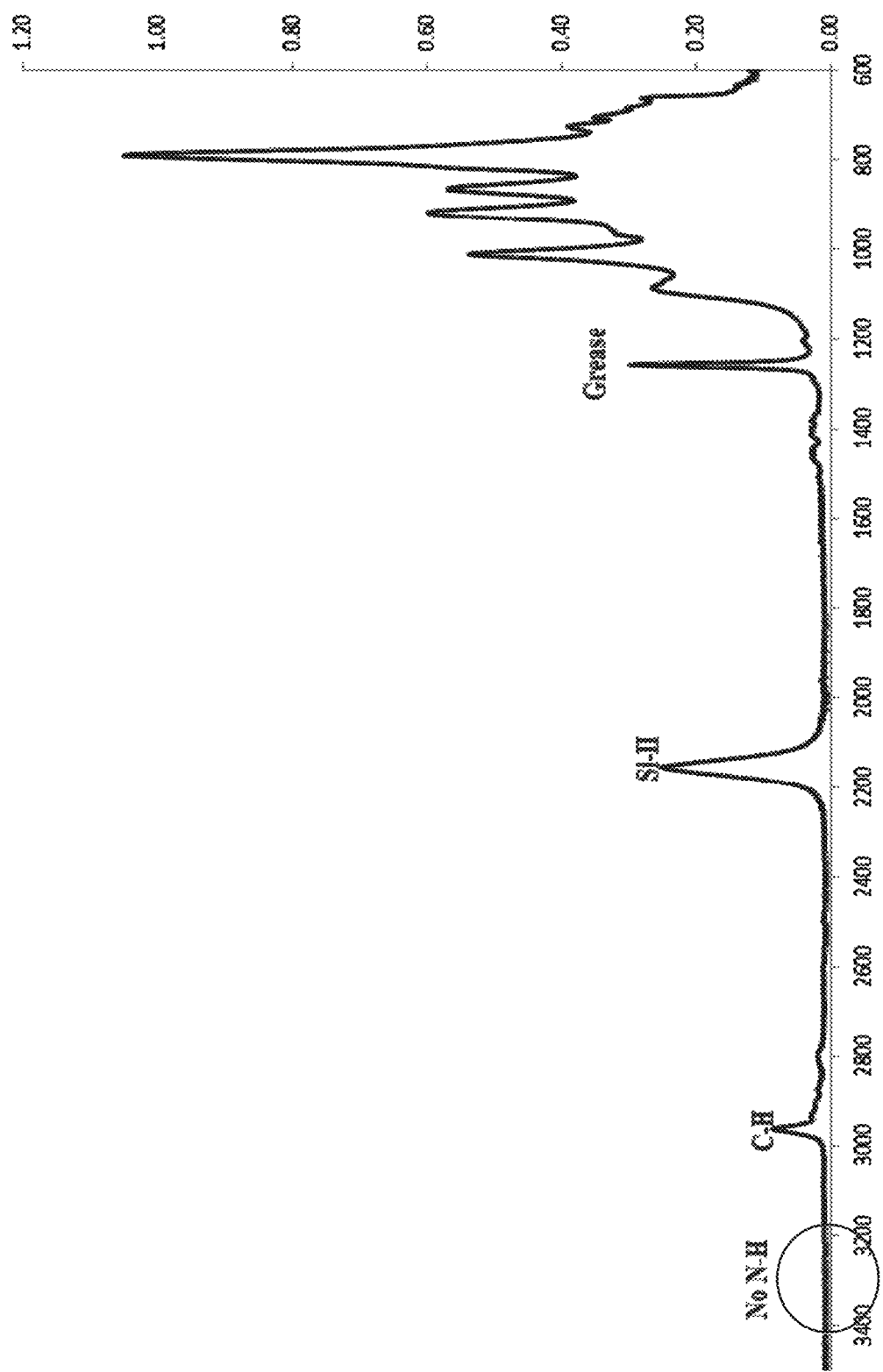
FIG. 16 is a FTIR spectrum of the oil produced in Example 8.

FIG. 16 is a FTIR spectrum of the oil after volatiles were removed. A sharp peak at 1350 cm$^{-1}$ was assigned to the silicon grease. Traces of pentane resulted in C—H stretch at ~2900 cm$^{-1}$ The calculated $SiH_2:SiH_3$ ratio was 1.8, indicating more $SiH_2$ than $SiH_3$. As expected, the additional reaction time of this example as compared to Examples 6 and 7 results in more cross-linking in the PHPS reaction product.

The Si:N ratio is included in FIG. 1 and calculated to be 1.97 based on $M_n$.

The GPC results indicate a $M_n$ of 2150 and a $M_w$ of 6390. The resulting 3.0 polydispersity index (PDI) demonstrates a broad oligomer size distribution.

Example 9: Quenching Perhydropolysilazane Reaction

TSA (30 g, 0.28 mol) was added to a suspension of Pentane (266 mL) and catalyst (B(C$_6$F$_5$)$_3$) (1.4 mmol, 0.7 g). The reaction mixture was allowed to stir for 18 hours at room temperature. The reactor was then cooled to −78° C. by using a dry-ice/IPA bath and volatiles (mainly silane) were cryotrapped into a stainless steel lecture bottle (sslb) at −196° C. The reactor was then opened under an inert atmosphere and 2 mL Triethylamine was added to quench the reaction. The solids (10.8 g) were filtered out and dried. The pentane solution was subject to distillation. After removing pentane and excess triethylamine, a viscous cloudy oil was obtained (4.5 g). The solid was analyzed by FTIR to confirm that the solid is the adduct of the catalyst and inhibitor. The oil PHPS reaction product was subjected to GC, FTIR and TGA analysis.

Figure 17:
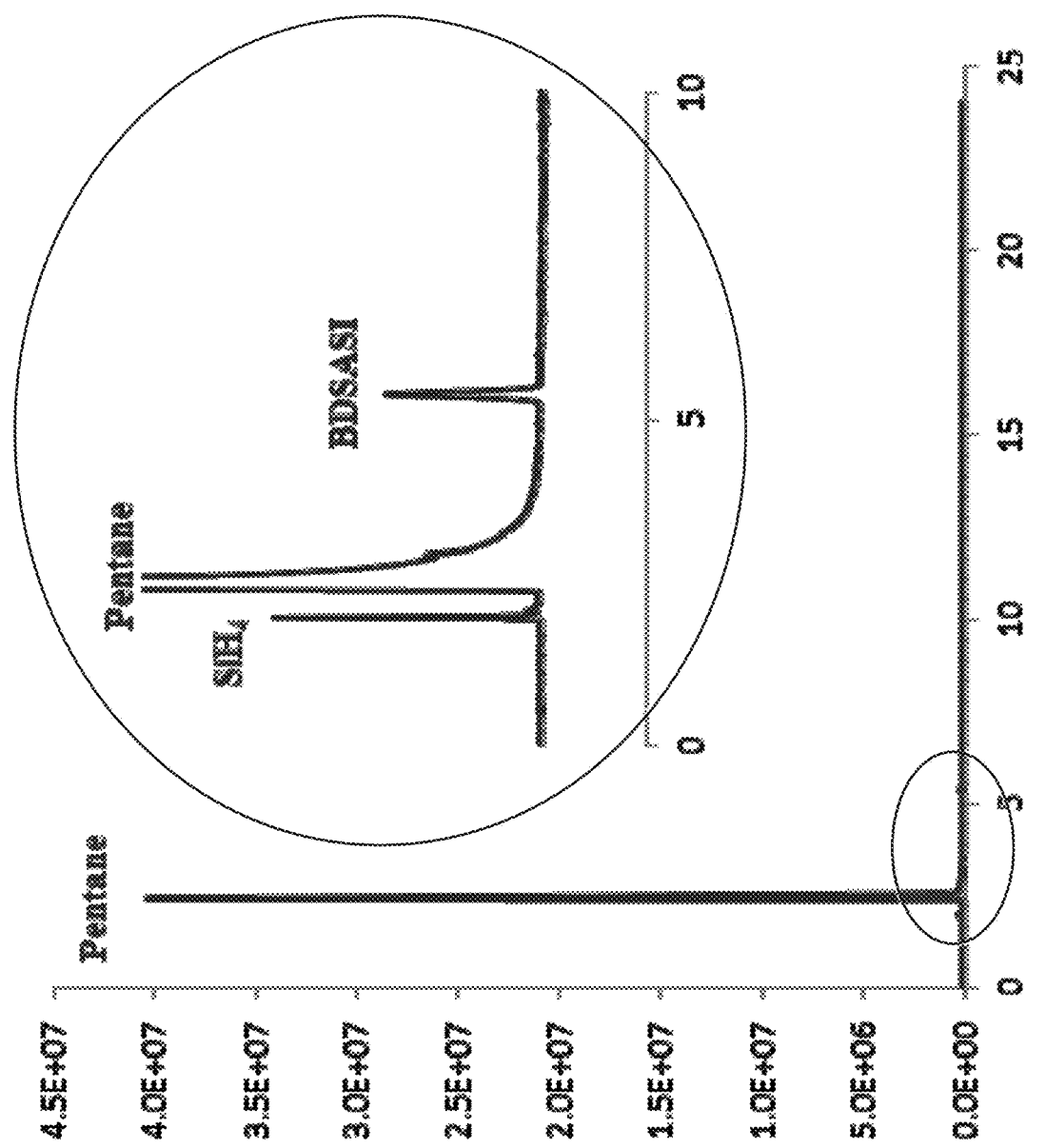
FIG. 17 is a GC spectrum of the perhydropolysilazane solid of Example 9.

FIG. 17 is a GC spectrum of the oil. Only traces of silane and BDSASI were observed (inset).

Figure 18:
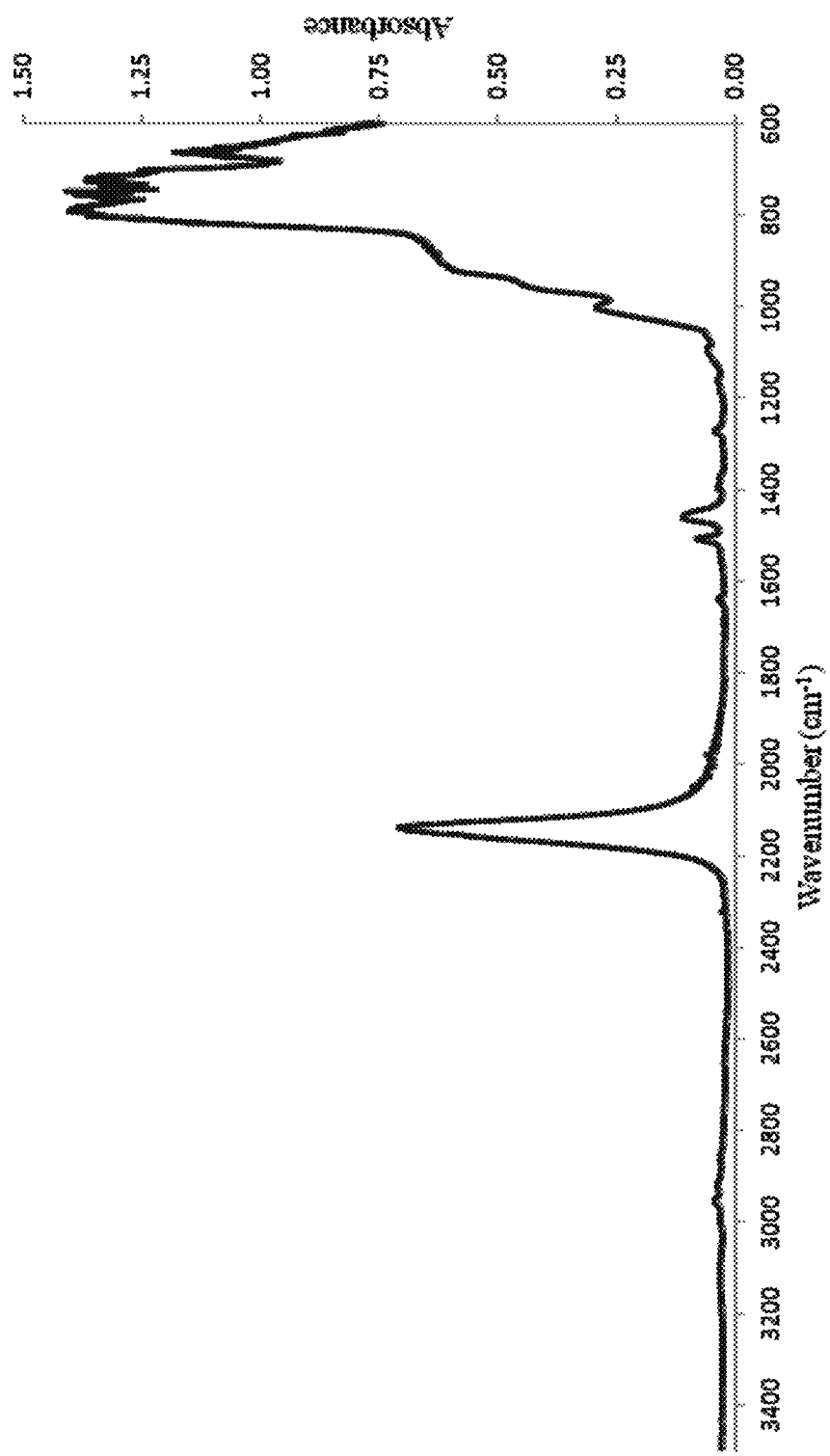
FIG. 18 is a FTIR spectrum of the solid produced in Example 9.

FIG. 18 is FTIR spectrum of the oil after volatiles were removed.

The results of Examples 6-9 demonstrate that the PHPS synthesis method may be stopped when the desired oligomer size is produced.

Example 10: Perhydropolysilazane Reaction Using Toluene Solvent

Additional reactions were tested using a TSA reactant, a B(C$_6$F$_5$)$_3$ catalyst, and a toluene solvent at room temperature. The results are provided in Table 2:

TABLE 2

| Cat. Loading (mol %) | Time (h) | Yield (%) | Inhibitor | NH? | $M_n$ | $M_w$ | PDI | $SiH_2:SiH_3$ | Si:N | Vis (cP) |
|---|---|---|---|---|---|---|---|---|---|---|
| 0.25 | 0.5 | 47 | TEA | No | 1920 | 4010 | 2.1 | 2.75 | a** | 683 |
| 0.2 | 0.1 | 53 | TEA | No | 1240 | 2490 | 2.0 | 2.3 | b** | 233 |
| 0.02 | 1.2 | 45 | TEA | No | TBD | TBD | TBD | TBD | N/A | <50 |
| 0.25* | 1 | 50 | TEA? | TBD | TBD | TBD | TBD | TBD | N/A | |
| 0.25* | 0.3 | 55 | TEA? | TBD | TBD | TBD | TBD | TBD | N/A | |
| 0.25* | 0.1 | 52 | TEA? | TBD | TBD | TBD | TBD | TBD | N/A | |
| 0.25 | 2.8 | 51 | TEA | TBD | TBD | TBD | TBD | TBD | N/A | |

*Inverse Addition (TSA was added dropwise to a solution of catalyst).
**See FIG. 1 - points a = 1.93 or b = 1.91, calculated from $M_n$ for Si:N ratio
TBD = to be determined
Viscosity was measured in centipoise As can be seen from Table 1 and Examples 3 and 6-9, the reaction proceeds more quickly in a toluene solvent than in a pentane solvent due at least partially to the solubility of the catalyst in the toluene solvent providing improved catalytic activity. In general, the PHPS compositions synthesized in a toluene solvent have a higher $M_n$ and higher degree of cross-linking than the PHPS compositions made in a pentane solvent. As a result, the solubility of the catalyst in the solvent may be chosen to provide the desired PHPS reaction product. These initial reactions were performed in a R&D facility at small scale. Therefore, yields will improve with further process optimization and scale up.

Example 11: Alternative Catalysts and Catalyst Mixtures

Additional reactions were tested using a TSA reactant and alternative catalysts or catalyst mixtures with no solvent (i.e., neat). The results are provided in Table 3:

TABLE 3

| Catalyst | Cat. Loading (mol %) | Cocatalyst | Temp (° C.) | Time (h) | Product | Yield (%) |
|---|---|---|---|---|---|---|
| 5% Pt/C | 5 | NEt$_3$ (31 mol %) | 100 | 18 | BDSASI | 48 |
| 5% Pt/ C | 5 | NMe$_2$Et (25%) | 100 | 4 | BDSASI | 36 |
| 5% Pt/C | 5 | NMe$_2$Et (25%) | 100 | 22 | BDSASI | 46 |
| 5% Pt/C | 0.4 | NMe$_2$Et (25%) | 100 | 4 | BDSASI | 31 |
| 5% Pt/C | 0.4 | NMe$_2$Et (25%) | 105 | 25 | BDSASI | 39 |
| 5% Pt/C | 0.5 | MeI (100%) | 80 | 0.75 | Oil/Solid | 100 |
| Co$_2$(CO)$_8$ | 2 | MeI (100 mol %) | 25 | 17 | Oil | 95 |
| [RuCl$_2$((AMPY)(DPPB)] | 0.4 | None | 100 | 18 | BDSASI | 10 |
| [RuCl$_2$((AMPY)(DPPB)] | 0.4 | NEt$_3$ (30 mol %) | 100 | 18 | BDSASI | 83 |
| [RuCl$_2$((AMPY)(DPPB)] | 0.4 | NEt$_3$ (30 mol %) | 100 | 2.5 | BDSASI | 42 |
| [RhCl(PPh$_3$)$_3$] | 0.4 | NMe$_2$Et (25 mol %) | 100 | 1 | BDSASI | 86 |
| [RhCl(PPh$_3$)$_3$] | 0.3 | NMe$_2$Et (25 mol %) | 85 | 1.5 | BDSASI | 56 |
| [(R,R)-teth-TsDpenRuCl] | 0.6 | NMe$_2$Et (25 mol %) | 100 | 1.5 | BDSASI | 83 |
| Ru$_3$(CO)$_{12}$ | 1.1 | NMe$_2$Et (25 mol %) | 80 | 1 | BDSASI | 80 |

These reactions demonstrate that alternative catalysts may also be used in the disclosed processes, albeit mostly at elevated temperatures. These processes may be useful when the desired PHPS reaction product has a low molecular weight distribution.

Once again, these initial reactions were performed in a R&D facility at small scale. Therefore, yields will improve with further process optimization and scale up.

Example 12: Zeolite Catalysts

Additional reactions were tested using a TSA reactant and zeolite catalysts at room temperature. The results are provided in Table 4:

TABLE 4

| Catalyst | Cat. Loading | Solvent | Time (h) | Yield (%) | Product |
|---|---|---|---|---|---|
| Zeolite Y (H) 80:1 Si/Al | 1 wt. % | Pentane | 22 | 10 | BDSASI |
| Zeolite Y (H) 30:1 Si/Al | 1 wt. % | Pentane | 22 | 9 | BDSASI |
| Zeolite Y (H) 80:1 Si/Al | 5 wt. % | None | 70 | 32 | BDSASI |
|  |  |  |  | 27 | TDSASI |
|  |  |  |  | 17 | Tetra-TSA |
|  |  |  |  | 5 | Penta-TSA |

Like $B(C_6F_5)_3$, $PdCl_2$, and $Co_2(CO)_8$, these zeolite catalysts may be used in the disclosed processes at room temperature.

Once again, these initial reactions were performed in a R&D facility at small scale. Therefore, yields will improve with further process optimization and scale up.

Example 13: Catalyst Loading

Additional reactions were performed to assess the effect of $B(C_6F_5)_3$ catalyst loading upon $M_n$ and $SiH_2$:$SiH_3$ ratio using a TSA starting material in toluene at room temperature. The results are displayed in Table 5:

TABLE 5

| Catalyst Loading (mol %) | Reaction Time (min) | $M_n$ | $SiH_2$:$SiH_3$ |
|---|---|---|---|
| 0.025 | 25 | 410 | 1.0 |
| 0.25 | 25 | 3000 | 2.6 |

TABLE 5-continued

| Catalyst Loading (mol %) | Reaction Time (min) | $M_n$ | $SiH_2:SiH_3$ |
|---|---|---|---|
| 0.025 | 75 | 810 | 1.4 |
| 0.25 | 75 | 10,800 | 3.7 |

As is evident from these results, increased catalyst loading for a given time results in an increase in the number average molecular weight (Mn) and the $SiH_2:SiH_3$ ratio.

Example 14: Correlation Between $SiH_2:SiH_3$ Ratio and MW

Figure 19:
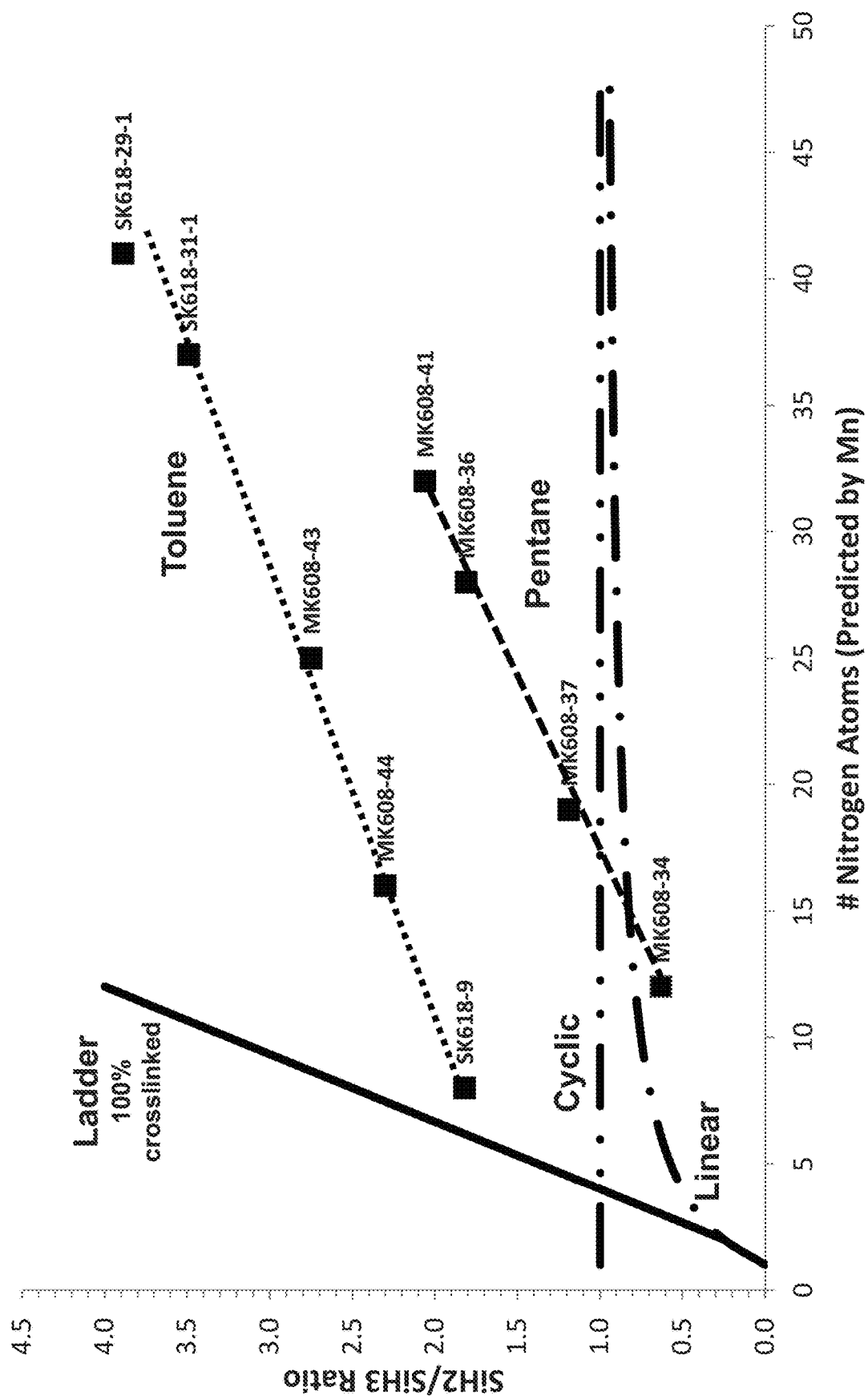
FIG. 19 is a graph of the number of N atoms in the PHPS reaction product versus the $SiH_2:SiH_3$ ratio.

FIG. 19 is a graph of the number of N atoms in the PHPS reaction product versus the $SiH_2:SiH_3$ ratio. The solid black line shows the trend for 100% crosslinked PHPS reaction products. The dashed-dotted line shows the trend for 100% linear PHPS reaction products. The dashed-twice dotted line shows the trend for the cyclic PHPS reaction products. The dotted line shows the results for 5 different batches of PHPS reaction products synthesized by reacting $B(C_6F_5)_3$ and TSA in toluene using different quantities of the catalyst, different reaction times, and different addition methods. The dashed line shows the results for 4 different batches of PHPS reaction products synthesized by reacting $B(C_6F_5)_3$ and TSA in pentane using different quantities of the catalyst and different reaction times.

This graph demonstrates the effect that choice of solvent has on the reaction process and $SiH_2:SiH_3$ ratio. The toluene processes produce products that have higher $SiH_2:SiH_3$ ratios and therefore more cross-linking than those produced by pentane.

Example 15: Deposition of SiON Films

Figure 20:
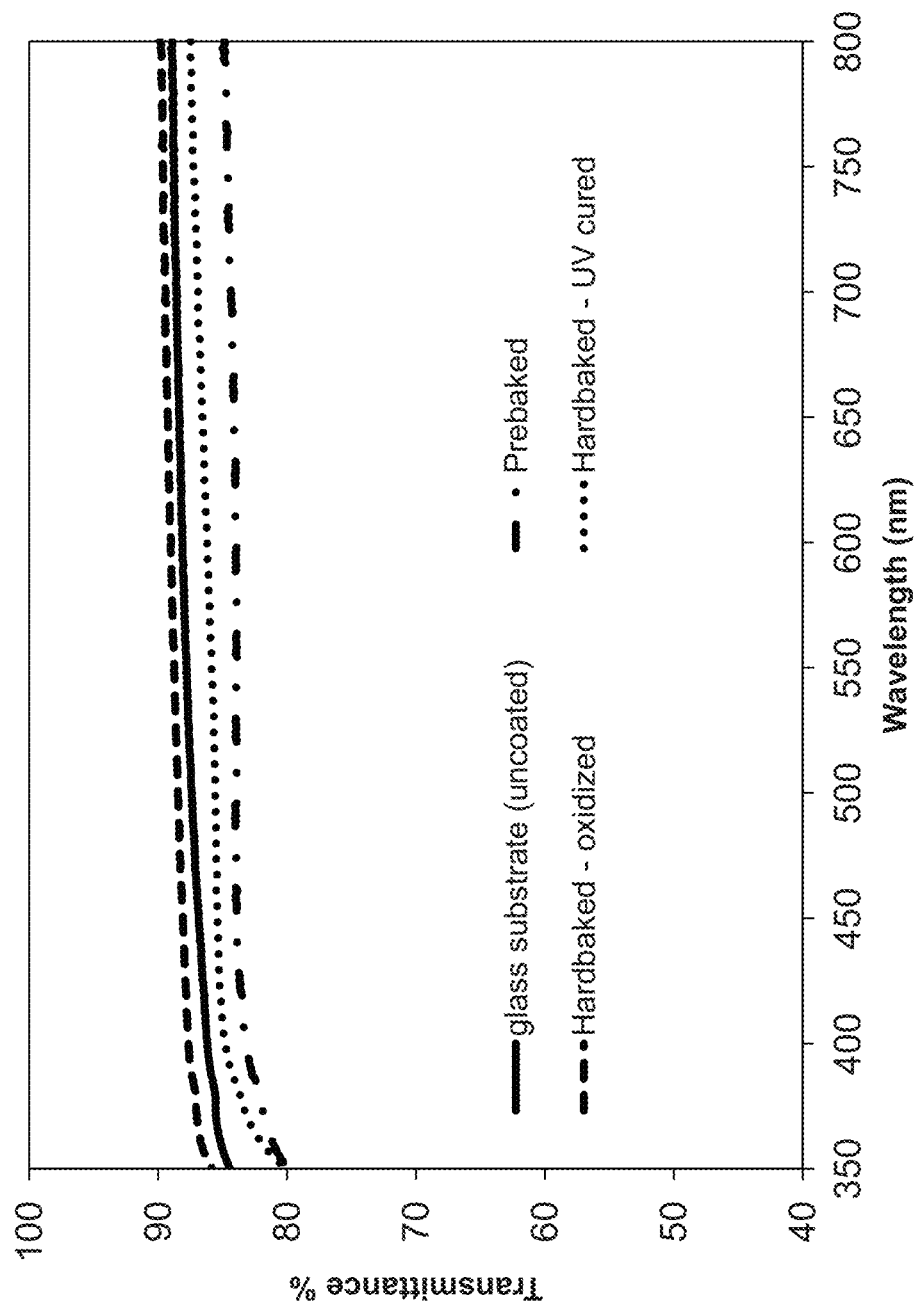
FIG. 20 is a graph of the wavelength in nm versus percent transmittance of the spin-on SiON films deposited in Example 15.

A 10 wt % PHPS formulation in toluene was spin-coated onto a glass substrate at a spin rate of 1500 rpm. The 10 wt % PHPS formulation used a PHPS product that was synthesized using inverse addition of 30 g of TSA and 0.25 mol. % of the $B(C_6F_5)$ catalyst in toluene for a total reaction time of 1 hour and 5 minutes. The PHPS product had a Mw of 50,000, a Mn of 7200, and a GPC of 6.9. The coated substrates were then prebaked at 100° C. for 5 min in nitrogen. Next, the prebaked substrates were hardbaked in two separate steps. First, they were oxidized at 350° C. for 0.5 hour in air. Second, the oxidized substrates were further cured by ultra-violet irradiation at 350° C. for 0.5 hour in nitrogen. As shown in FIG. 20, transmittance of PHPS films was recorded after each processing step by UV-VIS spectrometer and their transmittance remained above 80% in the wavelength range of 350-800 nm. These results indicate that the PHPS coated substrates are as transparent as an uncoated glass substrate (solid line) and are therefore excellent for optical applications.

Figure 21:
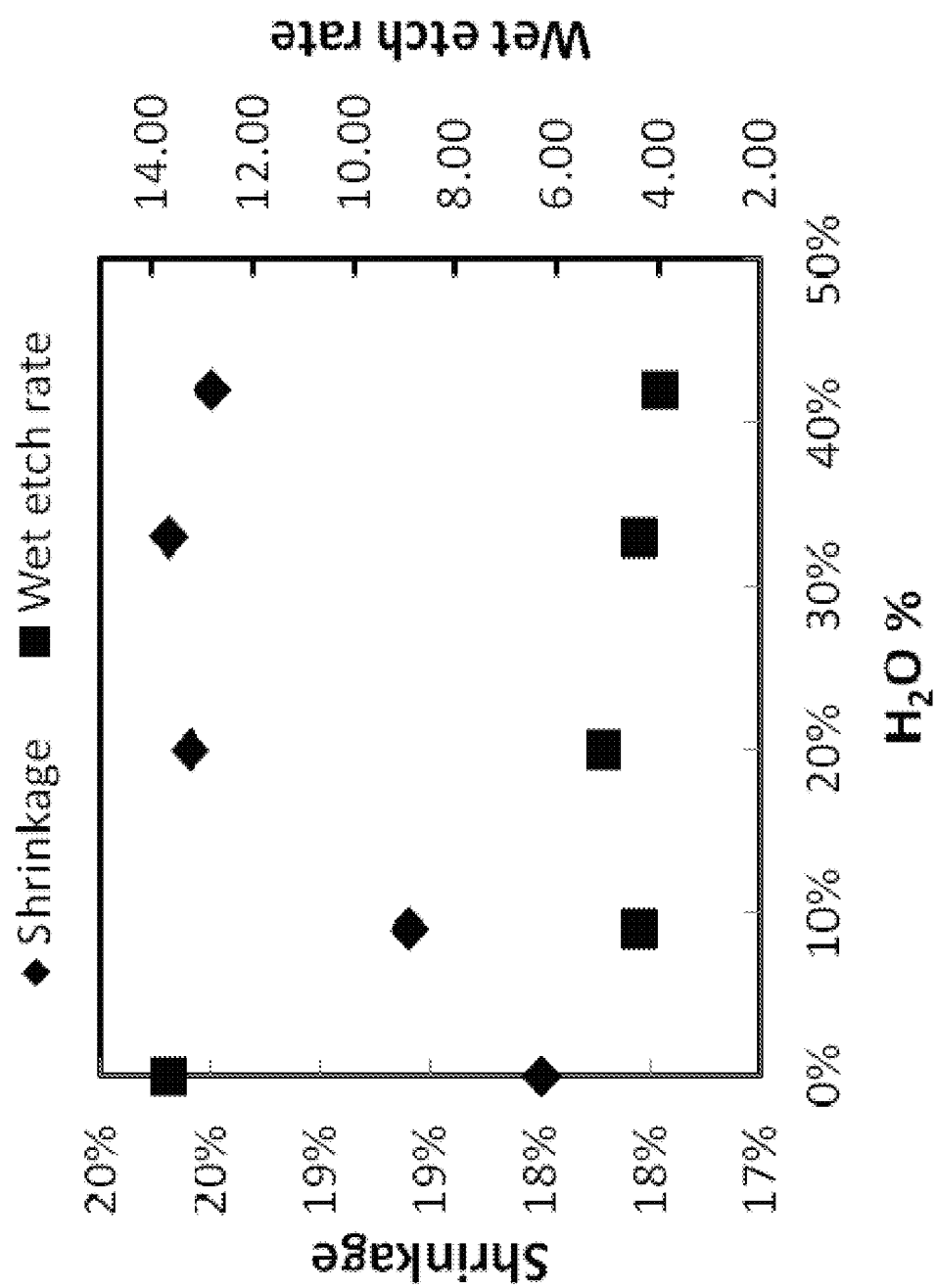
FIG. 21 is a graph of the % H2O versus % shrinkage (diamonds) and wet etch rate (squares) of the spin-on silicon oxide films deposited in Example 16.

Example 16: $O_2/H_2O$ Ratio Control to Optimize Shrinking in Silicon Oxide Films A 10 wt % PHPS formulation in toluene was spin-coated onto Si substrates at a spin rate of 1500 rpm. The same 10 wt % PHPS formulation used in Example 15 was used in this process. The coated substrates were then prebaked at 150° C. for 3 min in nitrogen. Next, the prebaked substrates were hardbaked at 400° C. for 20 min, 500° C. for 20 min, and finally at 600° C. for 20 min in a controlled atmosphere containing oxygen and steam in nitrogen. Table 6 provides the results using different steam partial pressure. The film thickness and refractive index (RI) was measured by an ellipsometer. The shrinkage was calculated as: 1−(hardbaked film thickness/prebaked film thickness). The wet etch rate was performed in a 1% HF-water solution. The wet etch rate was normalized to that of a commercial thermal oxide film wet etched under the same conditions. The correlation between shrinkage (or wet etch rate) and steam partial pressure is provided in FIG. 21. Compared to Film 1 which was hardbaked with 0% $H_2O$, the data shows that the higher steam partial pressure and lower $O_2$ partial pressure leads to higher film shrinkage and lower wet etch rate.

TABLE 6

| Film | $H_2O$ Flow (cc/hr) | Partial Pressure | Shrinkage | RI | Wet Etch Rate |
|---|---|---|---|---|---|
| 1 | 0 | 80% $N_2$, 20% $O_2$, 0% $H_2O$ | 18.1 ± 0.4% | 1.51 | 13.7 |
| 2 | 2 | 73% $N_2$, 18% $O_2$, 9% $H_2O$ | 18.6 ± 0.2% | 1.43 | 4.4 |
| 3 | 5 | 64% $N_2$, 16% $O_2$, 20% $H_2O$ | 19.6 ± 0.6% | 1.44 | 5.1 |
| 4 | 10 | 54% $N_2$, 13% $O_2$, 33% $H_2O$ | 19.7 ± 0.6% | 1.44 | 4.4 |
| 5 | 15 | 46% $N_2$, 12% $O_2$, 42% $H_2O$ | 19.5 ± 0.7% | 1.44 | 4.0 |

Comparative Example 1—KR20140087903

The usage of trisilylamine or trisilylamine derivatives as a starting material for the manufacture of PHPS by ammonolysis has been described in KR20140087903 to Song et al. In this case, advantage is taken of the halide free nature of trisilylamine (no $NH_4Cl$ formation). However, the amine catalysed reaction still proceeds by ammonolysis, i.e. the substitution of a H on Si by an amine group and further condensation of the amino silane. As such, the resulting inorganic PHPS (i.e. using ammonia as an amine) will contain NH bonds.

Comparative Example 2—U.S. Pat. No. 4,200,666

U.S. Pat. No. 4,200,666 to Reinberg discloses a method of preparing a silicon nitride film by glow discharge from the decomposition of liquid trisilylamine, which is a volatile monomer. Applicants believe that such plasma enhanced vapor deposition processes yield high H containing SiN solid films, the H content being typically 5 to 30 at %, and the H is randomly distributed between Si-bonds and N-bonds. Applicants further believe that the plasma completely destroys the precursor structure and does not maintain its backbone structure.

Comparative Example 3—US2014/0341794

US2014/0341794 to Hoppe et al. (Evonik) noticed that the synthesis of trisilylamine from the reaction of monochlorosilane ($SiClH_3$ or MCS) and $NH_3$ in the liquid phase leads to the formation of some polysilazane, such as $(H_3Si)_2$—N—$SiH_2$—NH($SiH_3$), $(H_3Si)_2$—N—$SiH_2$—N($SiH_3$)$_2$, $(H_3Si)_2$—N—$SiH_2$—NH—$SiH_2$—NH($SiH_3$), and more, in the heavies residues. While the origin of these polysilazanes is not described, the fact that they still contain Si—Cl at the end of the reaction, and involve bi-functional silicon bonding (i.e. "—$SiH_2$—"), indicate that dichlorosilane is involved in the formation of such polysilazane. The source of the dichlorosilane is likely from the well known disproportionation of the MCS starting material, according to 2 MCS->$SiH_4$+$SiH_2Cl_2$ (see, e.g., para 0058 of US2012/0103857 to Behm et al.). Finally, the final treatment of the polysilazane mixture with ammonia (ammonolysis of the remaining Si—Cl bonds) implies the formation of N—H bonds in the polysilazane mixture.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

We claim:

1. A method of synthesizing a N—H free, C-free, and Si-rich perhydropolysilazane composition, the method comprising mixing trisilylamine and a catalyst to produce the N—H free, C-free, and Si-rich perhydropolysilazane composition having a molecular weight ranging from approximately 332 dalton to approximately 100,000 dalton, wherein the catalyst is selected from the group consisting of $B(C_6F_5)_3$, $BPh_3$, $PdCl_2$, $Co_2(CO)_8$, $Ru_3(CO)_{12}$, and Zeolite Y (H) Si:Al.

2. A method of synthesizing a N—H free, C-free, and Si-rich perhydropolysilazane composition, the method comprising mixing trisilylamine and a catalyst to produce the N—H free, C-free, and Si-rich perhydropolysilazane composition having a molecular weight ranging from approximately 332 dalton to approximately 100,000 dalton, further comprising mixing trisilylamine and the catalyst at room temperature and atmospheric pressure.

3. A method of synthesizing a N—H free, C-free, and Si-rich perhydropolysilazane composition, the method comprising mixing trisilylamine and a catalyst to produce the N—H free, C-free, and Si-rich perhydropolysilazane composition having a molecular weight ranging from approximately 332 dalton to approximately 100,000 dalton, wherein the catalyst is $B(C_6F_5)_3$, further comprising adding a quenching agent when a N—H free, C-free, and Si-rich perhydropolysilazane composition obtains the desired molecular weight.

* * * * *